US010819425B2

(12) United States Patent
Tanaka

(10) Patent No.: US 10,819,425 B2
(45) Date of Patent: Oct. 27, 2020

(54) TRANSIMPEDANCE AMPLIFIER FOR RECEIVING BURST OPTICAL SIGNAL

(71) Applicant: Sumitomo Electric Industries, LTD., Osaka (JP)

(72) Inventor: Keiji Tanaka, Osaka (JP)

(73) Assignee: SUMITOMO ELECTRIC INDUSTRIES, LTD., Osaka (JP)

(*) Notice: Subject to any disclaimer, the term of this patent is extended or adjusted under 35 U.S.C. 154(b) by 0 days.

(21) Appl. No.: 16/504,694

(22) Filed: Jul. 8, 2019

(65) Prior Publication Data

US 2020/0014463 A1 Jan. 9, 2020

(30) Foreign Application Priority Data

Jul. 9, 2018 (JP) ................................ 2018-130188
Jul. 9, 2018 (JP) ................................ 2018-130191

(51) Int. Cl.
*H04B 10/079* (2013.01)
*H03F 1/02* (2006.01)
(Continued)

(52) U.S. Cl.
CPC ....... *H04B 10/0797* (2013.01); *H03F 1/0277* (2013.01); *H03F 1/083* (2013.01);
(Continued)

(58) Field of Classification Search
None
See application file for complete search history.

(56) References Cited

U.S. PATENT DOCUMENTS 5,025,456 A * 6/1991 Ota .................... H04B 10/6933
375/318
5,430,766 A * 7/1995 Ota .................... H04B 10/6933
327/52
(Continued)

FOREIGN PATENT DOCUMENTS

JP 2010-213128 9/2010
JP 2012-10107 1/2012
(Continued)

OTHER PUBLICATIONS

Yoon, "1.25 Gb/s CMOS Differential Transimpedance Amplifier for Gigabit Networks", 1997, IEEE, Proceedings of the 23rd European Solid-State Circuits Conference, Southampton, UK, UK (Year: 1997).*

(Continued)

*Primary Examiner* — Darren E Wolf
(74) *Attorney, Agent, or Firm* — Smith, Gambrell & Russell, LLP.

(57) ABSTRACT

A transimpedance amplifier converts an input current to a differential signal and outputs the differential signal. The transimpedance amplifier includes a single-ended amplifier configured to convert a current signal to a voltage signal, a first feedback circuit configured to generate a bypass current, a differential amplifier circuit configured to generate the differential signal in accordance with the difference between the voltage signal and a reference voltage signal, and a detector circuit configured to detect a start and an end of a burst optical signal. The detector circuit detects the end of the burst optical signal based on a peak value of the positive-phase component and a peak value of the negative-phase component and switches the time constant of the first feedback circuit from a first time constant to a second time (Continued)

constant smaller than the first time constant in response to detecting the end of the burst optical signal.

14 Claims, 31 Drawing Sheets

(51) Int. Cl.
 *H03F 1/08* (2006.01)
 *H03F 1/32* (2006.01)
 *H03F 3/45* (2006.01)
 *H03F 1/34* (2006.01)
 *H04B 10/66* (2013.01)

(52) U.S. Cl.
 CPC ............. *H03F 1/3211* (2013.01); *H03F 1/34* (2013.01); *H03F 3/45071* (2013.01); *H04B 10/66* (2013.01); *H03F 2200/129* (2013.01); *H03F 2200/462* (2013.01); *H03F 2203/45288* (2013.01)

(56) References Cited

U.S. PATENT DOCUMENTS

| 2007/0071455 A1* | 3/2007 | Margalit | H03G 3/3084 |
| | | | 398/202 |
| 2009/0142074 A1* | 6/2009 | Ide | H04B 10/69 |
| | | | 398/202 |
| 2015/0270808 A1* | 9/2015 | Sugimoto | H03F 1/0205 |
| | | | 330/294 |

FOREIGN PATENT DOCUMENTS

| JP | 2012-60436 | 3/2012 |
| WO | 2016/035374 | 3/2016 |

OTHER PUBLICATIONS

Knochenhauer, "Fully Integrated Auto-Zero Feedback with Lower Cutoff Frequency below 50 kHz in a 40 GBit/s Transimpedance Amplifier", Sep. 2011, IEEE, 2011 Semiconductor Conference Dresden, (Year: 2011).*

* cited by examiner

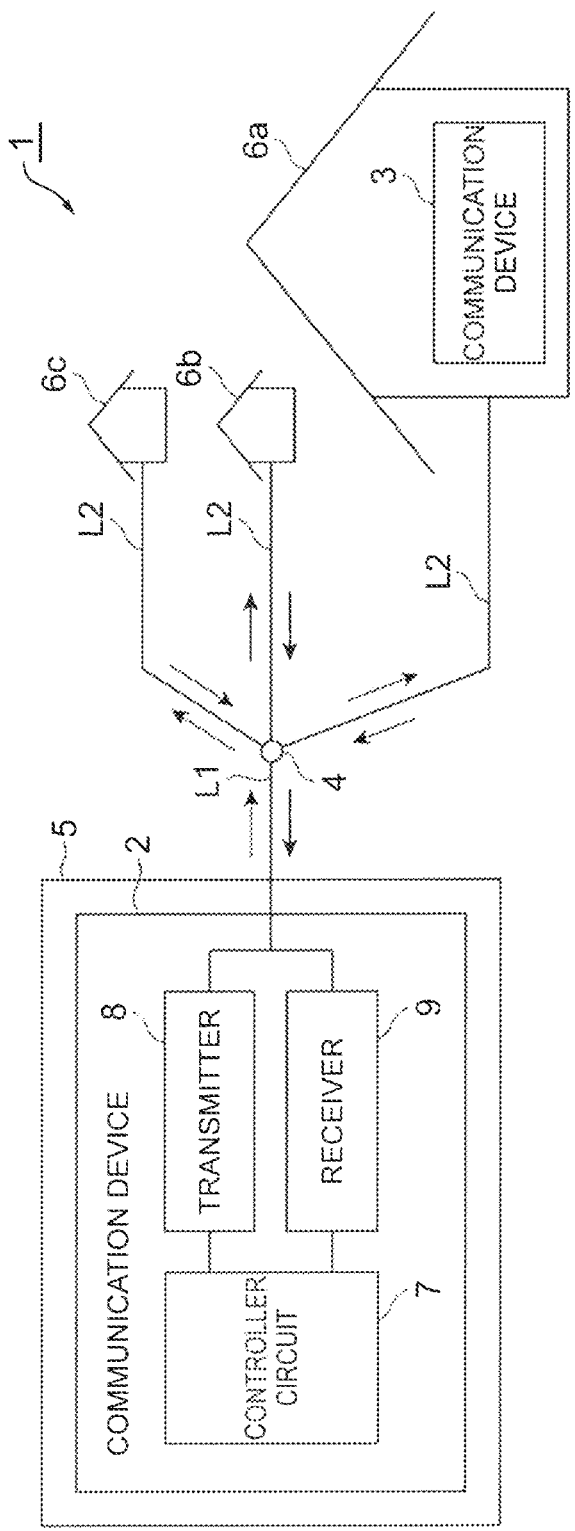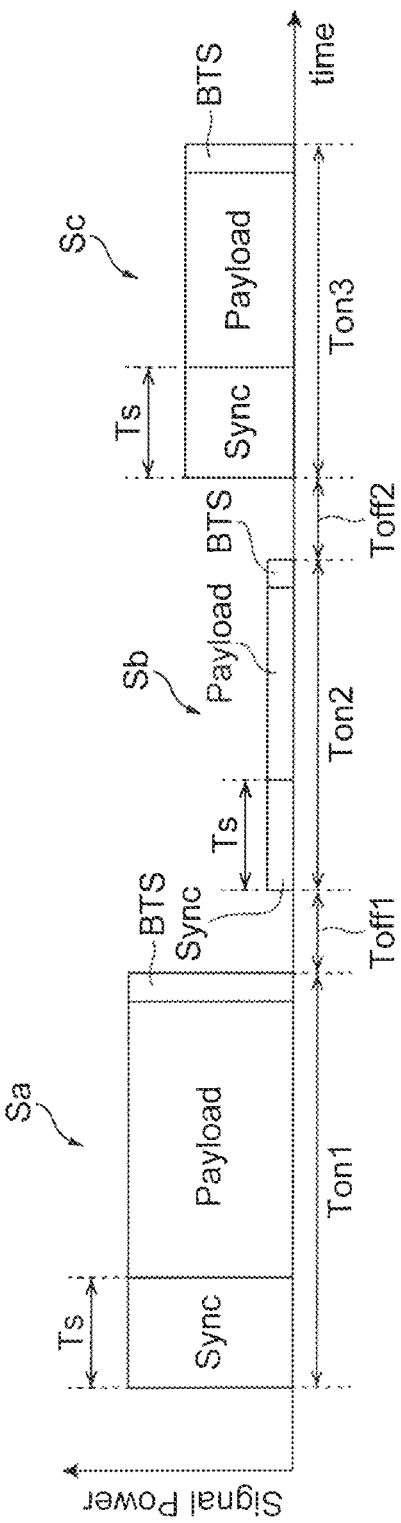
Fig.1A
Fig.1B

TRANSIMPEDANCE AMPLIFIER FOR RECEIVING BURST OPTICAL SIGNAL

CROSS REFERENCE TO RELATED APPLICATIONS

The present application is based on and claims benefit of priority of Japanese Patent Application No. 2018-130188 and Japanese Patent Application No. 2018-130191, which are filed on Jul. 9, 2018. The entire content of both the applications is incorporated herein by reference.

TECHNICAL FIELD

The present disclosure relates to a transimpedance amplifier.

BACKGROUND

In Ethernet (registered trademark) Passive Optical Network (EPON) which is an optical access system, a transimpedance amplifier is used in an optical receiver of an Optical Line Terminal (OLT). The optical receiver of the OLT receives burst optical signals from a plurality of Optical Network Units (ONUs) by Time Division Multiplexing (TDM). The ONUs are installed at positions away from the OLT by various distances. Thus, a transmission line loss from each ONU to the OLT varies in accordance with the distance. Thus, for example, a signal strength from an ONU located at a relatively near distance from the OLT is high and a signal strength from an ONU located at a farther distance from the OLT than the relatively near ONU is low. In this manner, burst optical signals having various signal strengths are input to the optical receiver of the OLT. Thus, the transimpedance amplifier included in the optical receiver of the OLT is provided with a feedback circuit which draws (subtracts) a bypass current from a current signal in accordance with a burst optical signal so as to receive burst optical signals having various signal strengths.

In the transimpedance amplifier included in the optical receiver of the OLT, it is desired to respond to intermittent burst optical signals at a high speed. Further, it is desired that the feedback circuit which controls an amplification operation stably operate even when signals of the identical digit (same code) are continuously input, that is, the feedback circuit have a consecutive identical digits (CID) tolerance. Thus, for example, in a feedback circuit described in Japanese Unexamined Patent Publication No. 2010-213128, at an initial stage when input of a burst optical signal is started, a time constant corresponding to a response speed of a feedback circuit is set to a small value so that an output voltage of an amplifier is stabilized (leveled) quickly. On the other hand, after the initial stage, the time constant is switched to a value larger than the time constant at the initial stage in order to maintain the consecutive identical digits tolerance. Further, after the end of one burst optical signal, the time constant is switched again to the small value at the initial stage.

These switches of the time constant are performed by comparing a voltage value of a control signal obtained by differential-amplifying the mean value of the output voltage of the amplifier and a first reference voltage with a second reference voltage. A change amount per unit time in the control signal is determined in accordance with the value of the time constant of the feedback circuit. For example, at the point when a burst optical signal from a certain ONU ends, the time constant of the feedback circuit is set to a large value. Thus, a change per unit time in the control signal is smaller than a change per unit time in the output voltage of the amplifier. Thus, it takes much time for the control signal (voltage value) to become larger than a value of the second reference voltage. Accordingly, it takes much time for the time constant of the feedback circuit to be switched again to the small value at the initial stage. As a result, it takes much time for the mean value of the output voltage of the amplifier to return to an initial state. Thus, an interval period from the end of one burst optical signal input for a predetermined period to the start of the next burst optical signal becomes longer. The present disclosure provides a transimpedance amplifier capable of shortening an interval period from the end of one burst optical signal to the start of the next burst optical signal.

SUMMARY

A transimpedance amplifier according to one aspect of the present disclosure converts an input current generated by a photodetector in accordance with a burst optical signal to a differential signal including a positive-phase component and a negative-phase component and outputs the differential signal. The transimpedance amplifier includes: a single-ended amplifier configured to convert a current signal to a voltage signal; a first feedback circuit having a time constant, the first feedback circuit being configured to generate a bypass current at a response speed adjusted by the time constant; a differential amplifier circuit configured to generate the differential signal in accordance with a difference between the voltage signal and a reference voltage signal; and a detector circuit configured to detect a start and an end of the burst optical signal based on the differential signal. The first feedback circuit generates the bypass current in accordance with the difference between the voltage signal and the reference voltage signal and generates the current signal by subtracting the bypass current from the input current. The detector circuit detects the end of the burst optical signal based on a first peak value of the positive-phase component and a second peak value of the negative-phase component and switches the time constant of the first feedback circuit from a first time constant to a second time constant smaller than the first time constant for a predetermined period in response to detecting the end of the burst optical signal.

A transimpedance amplifier according to another aspect of the present disclosure converts an input current generated by a photodetector in accordance with a burst optical signal to a differential signal including a positive-phase component and a negative-phase component and outputs the differential signal. The transimpedance amplifier includes: a single-ended amplifier configured to convert a current signal to a voltage signal; a first feedback circuit including a capacitor, the first feedback circuit being configured to generate a bypass current in accordance with a charging voltage of the capacitor based on a difference between the voltage signal and a reference voltage signal; a differential amplifier circuit configured to generate the differential signal in accordance with the difference between the voltage signal and the reference voltage signal; and a detector circuit configured to detect a start and an end of the burst optical signal based on the differential signal. The first feedback circuit generates the current signal by subtracting the bypass current from the input current. The detector circuit detects the end of the burst optical signal based on a first peak value of the positive-phase component and a second peak value of the negative-phase component and releases electric charge stored in the capacitor to reset the charging voltage in response to detecting the end of the burst optical signal.

BRIEF DESCRIPTION OF THE DRAWINGS

FIG. 1A is a block diagram illustrating a PON communication system.

FIG. 1B is a schematic diagram illustrating a timing chart of an optical signal input to a communication device in a station.

DETAILED DESCRIPTION

Figure 2:
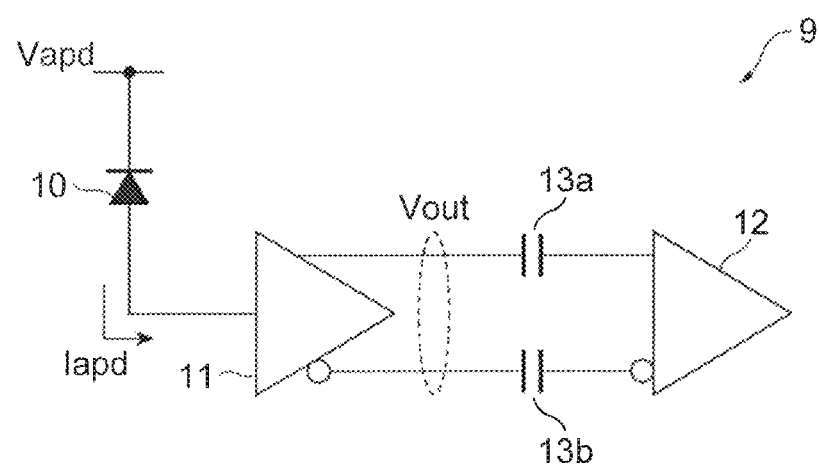
FIG. 2 is a diagram illustrating a configuration example of a receiver illustrated in FIG. 1A.

Hereinbelow, concrete examples of a transimpedance amplifier according to embodiments of the present disclosure will be described with reference to the drawings. Note that the present invention is not limited to the following examples, and it is intended that the present invention is defined by the claims and includes all changes within the meaning and range equivalent to the claims.

First, a PON communication system will be described as an example of an optical access system provided with a transimpedance amplifier according to an embodiment of the present disclosure. FIG. 1A is a block diagram illustrating a PON communication system. A communication system 1 illustrated in FIG. 1A is provided with a communication device 2, a plurality of communication devices 3, an optical splitter 4, a communication path L1, and a plurality of communication paths L2.

The communication device 2 is installed inside a station 5. The plurality of (three in the present embodiment) communication devices 3 are installed inside homes 6a to 6c respectively. The communication device 2 is connected to the communication devices 3 through the communication paths L1 and L2 which are optical fibers. In FIG. 1A, the communication devices 3 installed inside the home 6b and the home 6c are not illustrated. The communication device 2 is, for example, an OLT. The communication device 3 is, for example, an ONU. The communication device 2 and the optical splitter 4 are connected through one communication path L1. The optical splitter 4 and each of the communication devices 3 are connected through the communication path L2. The optical splitter 4 splits an optical signal output to the communication path L1 from the communication device 2 and outputs the split optical signals to the respective communication paths L2. The optical signal output to each of the communication paths L2 from the optical splitter 4 is input to the communication device 3. The optical splitter 4 couples optical signals output to the communication paths L2 from the communication devices 3 and outputs the coupled optical signal to the communication path L1. The optical signal output to the communication path L1 from the optical splitter 4 is input to the communication device 2.

The communication device 2 includes a controller circuit 7, a transmitter 8, and a receiver 9. The transmitter 8 is a transmitter circuit that transmits an optical signal to each of the communication devices 3. The receiver 9 is a receiver circuit that receives an optical signal from each of the communication devices 3. The controller circuit 7 is a circuit that controls the transmitter 8 and the receiver 9. The optical signal transmitted from the transmitter 8 and the optical signal received by the receiver 9 have different wavelengths.

FIG. 1B is a schematic diagram illustrating a timing chart of an optical signal input to the communication device in the station. As illustrated in FIG. 1B, the optical signal input to the receiver 9 of the communication device 2 includes intermittent burst optical signals Sa to Sc. In other words, the burst optical signals Sa to Sc are intermittently input to the receiver 9. In the present embodiment, the burst optical signal Sa, the burst optical signal Sb, and the burst optical signal Sc are input to the receiver 9 in this order. The burst optical signals Sa to Sc are input to the receiver 9 during periods Ton1 to Ton3, respectively. Specifically, the burst optical signal Sa output from the communication device 3 installed in the home 6a is input to the receiver 9 during the period Ton1. That is, a period from a starting time of the input of the burst optical signal Sa to an ending time of the input of the burst optical signal Sa corresponds to the period Ton1. The burst optical signal Sb output from the communication device 3 installed in the home 6b is input to the receiver 9 during the period Ton2. That is, a period from a starting time of the input of the burst optical signal Sb to an ending time of the input of the burst optical signal Sb corresponds to the period Ton2. The burst optical signal Sc output from the communication device 3 installed in the home 6c is input to the receiver 9 during the period Ton3. That is, a period from a starting time of the input of the burst optical signal Sc to an ending time of the input of the burst optical signal Sc corresponds to the period Ton3.

Each of the burst optical signals Sa to Sc includes a preamble signal (a signal Sync in FIG. 1B) and a payload signal following the preamble signal. The preamble signal is a signal for stabilizing an output signal from an amplifier circuit included in the receiver 9 while the preamble signal is input to the receiver 9. A period Ts during which the preamble signal included in each of the burst optical signals Sa to Sc is input to the receiver 9 is substantially equal between the burst optical signals Sa to Sc. The period Ts is set to, for example, a certain time. The period Ts of the preamble signal is a settling time required for the receiver 9 to normally receive each of the burst optical signals Sa to Sc. In other words, it is necessary for the receiver 9 to complete a preparation for normally receiving the payload signal within the period Ts (within the settling time).

In a signal processor which is connected to a stage subsequent to the amplifier circuit in the receiver 9, the payload signal is used in order to correctly regenerate the optical signal output from each of the communication devices 3 while correcting shifts in frequency and phase of the optical signal. Thus, it is desired to achieve control (stabilization) of the burst optical signal in the amplifier circuit of the receiver 9 at the highest possible speed. That is, it is desired that a transimpedance amplifier 11 (described below) which constitutes the amplifier circuit of the receiver 9 appropriately detect the start (rising) and the end (falling) of the burst optical signal and eliminate an influence caused by the strength of the burst optical signal during the period Ts.

The payload signal is a signal including data transmitted from each of the communication devices 3. A period of the payload signal included in each of the burst optical signals Sa to Sc varies in accordance with a data amount of each payload signal. Each of the burst optical signals Sa to Sc may include a burst termination signal (BTS) which indicates the end of the burst optical signal following the payload signal.

Each of the burst optical signals Sa to Sc includes high-level and low-level signals. In other words, the high-level and low-level signals are mixed in each of the burst optical signals Sa to Sc. For example, the high-level signal is an optical signal having a predetermined amplitude, and the low-level signal is an optical signal having an amplitude substantially equal to zero. For example, in the preamble signal, the high level signal and the low level signal are regularly and alternately repeated. The payload signal includes high-level and low level signals corresponding to data.

During a period Toff1, no optical signal is input to the receiver 9. A period from the ending time of the input of the burst optical signal Sa to the starting time of the input of the burst optical signal Sb corresponds to the period Toff1. During a period Toff2, no optical signal is input to the receiver 9. A period from the ending time of the input of the burst optical signal Sb to the starting time of the input of the burst optical signal Sc corresponds to the period Toff2. The periods Toff1 and Toff2 are periods (interval periods) for switching the communication path L2.

Since distances between the communication device 2 and the respective communication devices 3 differ from each other, losses of optical signals generated in the respective communication paths L2 differ from each other. Thus, the burst optical signals Sa to Sc input to the receiver 9 have different amplitudes. In this manner, optical signals (burst optical signals) which are output from different homes and have different amplitudes are input to the receiver 9 at irregular intervals. In the amplifier circuit of the receiver 9, a feedback circuit is used due to differences in amplitude between the burst optical signals.

Next, the configuration of the receiver 9 of the communication device 2 will be described. FIG. 2 is a diagram illustrating a configuration example of the receiver illustrated in FIG. 1A. The receiver 9 is, for example, a 10G-EPON optical receiver. The receiver 9 is provided with a photodetector 10, a transimpedance amplifier (TIA) 11, and a limiting amplifier (LIA) 12.

The photodetector 10 is an element that converts a burst optical signal input to the receiver 9 to an electric signal (current signal). For example, the photodetector 10 is an avalanche-photodiode (APD). Specifically, the photodetector 10 generates an input current Iapd including a direct current (DC) component as a current signal in accordance with the amplitude of the burst optical signals Sa to Sc. The photodetector 10 generates the input current Iapd in accordance with the amplitude of each of the burst optical signals Sa to Sc. For example, as the amplitude of the burst optical signal increases, the input current Iapd increases. When the low-level signal in the burst optical signals Sa to Sc is input to the receiver 9, the photodetector 10 generates the input current Iapd substantially equal to zero. The photodetector 10 outputs the generated input current Iapd to the transimpedance amplifier 11. In the present embodiment, a cathode of the photodetector 10 is connected to an applied voltage Vapd, and an anode of the photodetector 10 is connected to an input terminal 11a of the transimpedance amplifier 11 (refer to FIG. 3).

The transimpedance amplifier 11 is a circuit that impedance-converts and amplifies the input current Iapd to generate a differential signal Vout which is a voltage signal. The transimpedance amplifier 11 outputs the differential signal Vout. The transimpedance amplifier 11 is configured as, for example, an IC (integrated circuit). Specifically, the transimpedance amplifier 11 converts the input current Iapd to the differential signal Vout which includes a positive-phase component Voutp and a negative-phase component Voutn, and outputs the differential signal Vout to the limiting amplifier 12. The transimpedance amplifier 11 performs the impedance conversion and the amplification with a high gain when the input current Iapd is relatively small and performs the impedance conversion and the amplification with a low gain when the input current Iapd is relatively large. In this manner, the transimpedance amplifier 11 controls a gain in accordance with the magnitude of the input current Iapd. Details of the transimpedance amplifier 11 will be described below.

The differential signal Vout is input to the limiting amplifier 12 through capacitors 13a and 13b. The transimpedance amplifier 11 and the limiting amplifier 12 are alternating current (AC)-coupled by the capacitors 13a and 13b. The capacitance of each of the capacitors 13a and 13b used in the AC coupling is smaller than the capacitance of a capacitor used in a receiver for trunk line system in order to respond to a burst optical signal at a high speed. The receiver for trunk line system mainly receives continuous signals. For example, the capacitance of the capacitor 13a and the capacitance of the capacitor 13b are equal to each other. A DC component included in the differential signal Vout is removed by the AC coupling. The positive-phase component Voutp of the differential signal Vout from which the DC component has been removed is input as a positive-phase component Vliap to the limiting amplifier 12. The negative-phase component Voutn of the differential signal Vout from which the DC component has been removed is input as a negative-phase component Vlian to the limiting amplifier 12.

The limiting amplifier 12 is a circuit that converts differential signals having various strengths to voltage signals having a constant amplitude and outputs the voltage signals. The limiting amplifier 12 is configured as, for example, an IC. The limiting amplifier 12 equalizes voltage values of the positive-phase component Vliap and the negative-phase component Vlian which are input through the capacitors 13a and 13b and output the voltage signals. In other words, the limiting amplifier 12 saturation-amplifies the voltage difference between the positive-phase component Vliap and the negative-phase component Vlian. The voltage signal having a constant amplitude output from the limiting amplifier 12 is input to a Clock and Data Recovery (CDR, not illustrated). A clock signal is extracted from the voltage signal by the CDR, and a data waveform is shaped by performing a regenerating process with the clock signal with low jitter.

Figure 3:
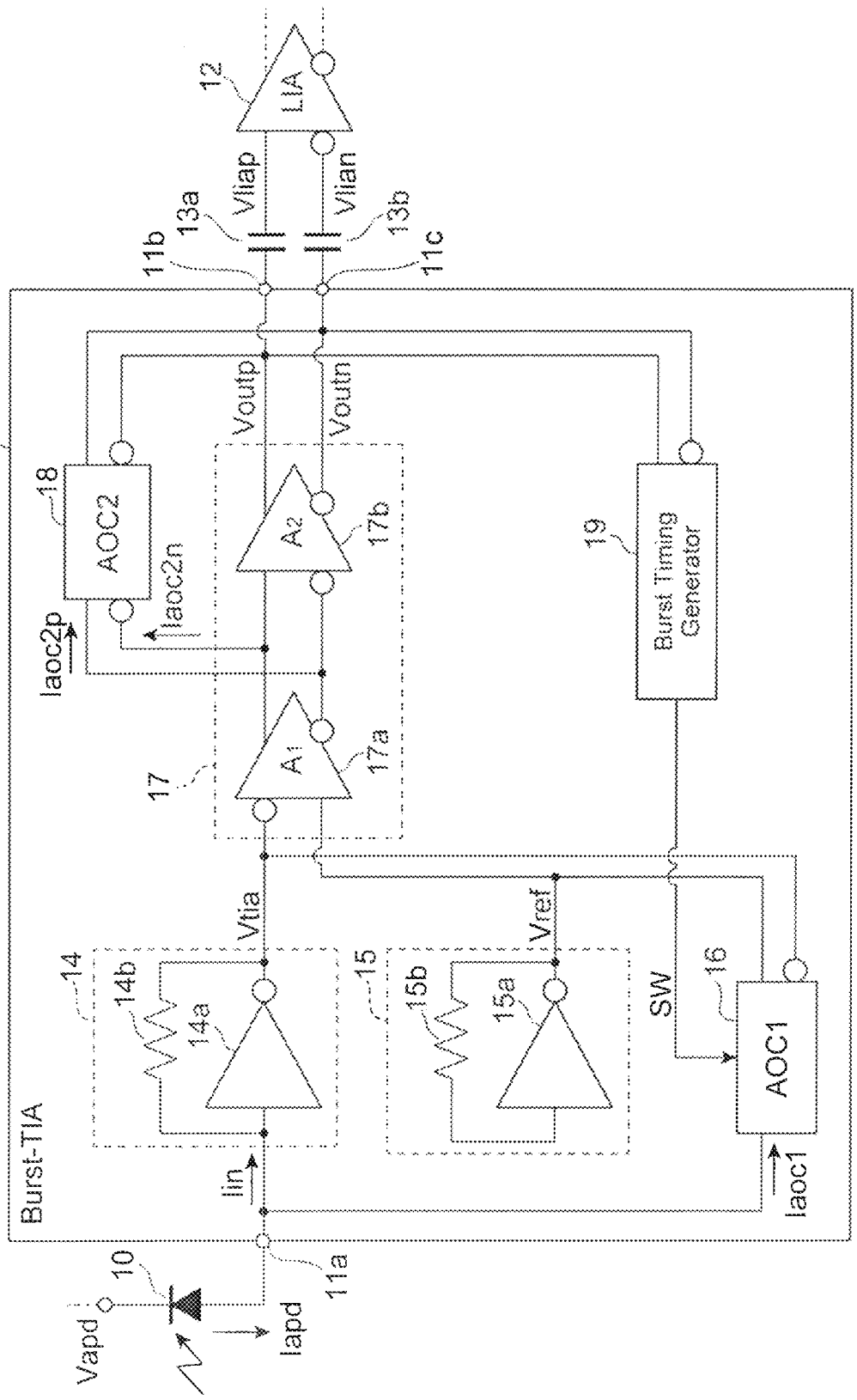
FIG. 3 is a circuit diagram illustrating a transimpedance amplifier according to an embodiment.

Next, details of the transimpedance amplifier 11 will be described. FIG. 3 is a circuit diagram illustrating the transimpedance amplifier according to the embodiment. The transimpedance amplifier 11 illustrated in FIG. 3 is provided with a TIA core 14 (single-ended amplifier), a dummy TIA 15, a feedback circuit 16 (first feedback circuit), a differential amplifier circuit 17, a feedback circuit 18 (second feedback circuit), and a detector circuit 19.

The TIA core 14 is a single-ended amplifier that converts the input current Iapd to a voltage signal Vtia. Specifically, the TIA core 14 is provided with an amplifier 14a and a feedback resistor element 14b. A current signal Iin which is obtained by subtracting a bypass current Iaoc1 from the input current Iapd is input to the TIA core 14. The TIA core 14 generates the voltage signal Vtia in accordance with the current signal Iin. The TIA core 14 outputs the voltage signal Vtia to the feedback circuit 16 and the differential amplifier circuit 17 (differential amplifier 17a). The gain of the TIA core 14 is the ratio of the magnitude of the voltage signal Vtia to the magnitude of the current signal Iin. The gain of the TIA core 14 is determined by a resistance value (transimpedance) of the feedback resistor element 14b.

The dummy TIA 15 is a circuit that generates a reference voltage signal Vref which is a voltage signal. The dummy TIA 15 outputs the reference voltage signal Vref to the feedback circuit 16 and the differential amplifier circuit 17 (differential amplifier 17a). The reference voltage signal Vref is used for converting a single voltage signal Vtia to a differential signal Vout in the differential amplifier circuit 17. The reference voltage signal Vref has a predetermined voltage value. For example, the voltage value of the reference voltage signal Vref is set to a value of the voltage signal Vtia with the input current Iapd being zero. The dummy TIA 15 is provided with an amplifier 15a and a feedback resistor element 15b. For example, the TIA core 14 and the dummy TIA 15 have configurations similar to each other.

The feedback circuit 16 generates the bypass current Iaoc1 in accordance with the difference between the voltage signal Vtia and the reference voltage signal Vref. The voltage signal Vtia and the reference voltage signal Vref are input to the feedback circuit 16. The feedback circuit 16 amplifies a low-frequency component including a DC component included in the voltage signal Vtia to generate the bypass current Iaoc1. An output terminal of the feedback circuit 16 is connected to an input terminal of the TIA core 14. The bypass current Iaoc1 generated by the feedback circuit 16 flows toward the feedback circuit 16. Thus, the bypass current Iaoc1 is subtracted from the input current Iapd. In other words, the feedback circuit 16 subtracts the bypass current Iaoc1 from the input current Iapd to generate the current signal Iin. Accordingly, a DC component included in the input current Iapd is removed by the bypass current Iaoc1, and an AC component included in the input current Iapd is input as the current signal Iin to the TIA core 14. The mean value of the voltage signal Vtia and the reference voltage signal Vref are made equal to each other by subtracting the bypass current Iaoc1 from the input current Iapd. Accordingly, a DC offset caused by the input current Iapd in the TIA core 14 is removed. As a result, even when the strength of the burst optical signal is high and a voltage signal in accordance with the input current Iapd has an amplitude limitation by saturation of a differential amplifier 17b (described below), a change in the duty ratio of the voltage signal is reduced.

Figure 4:
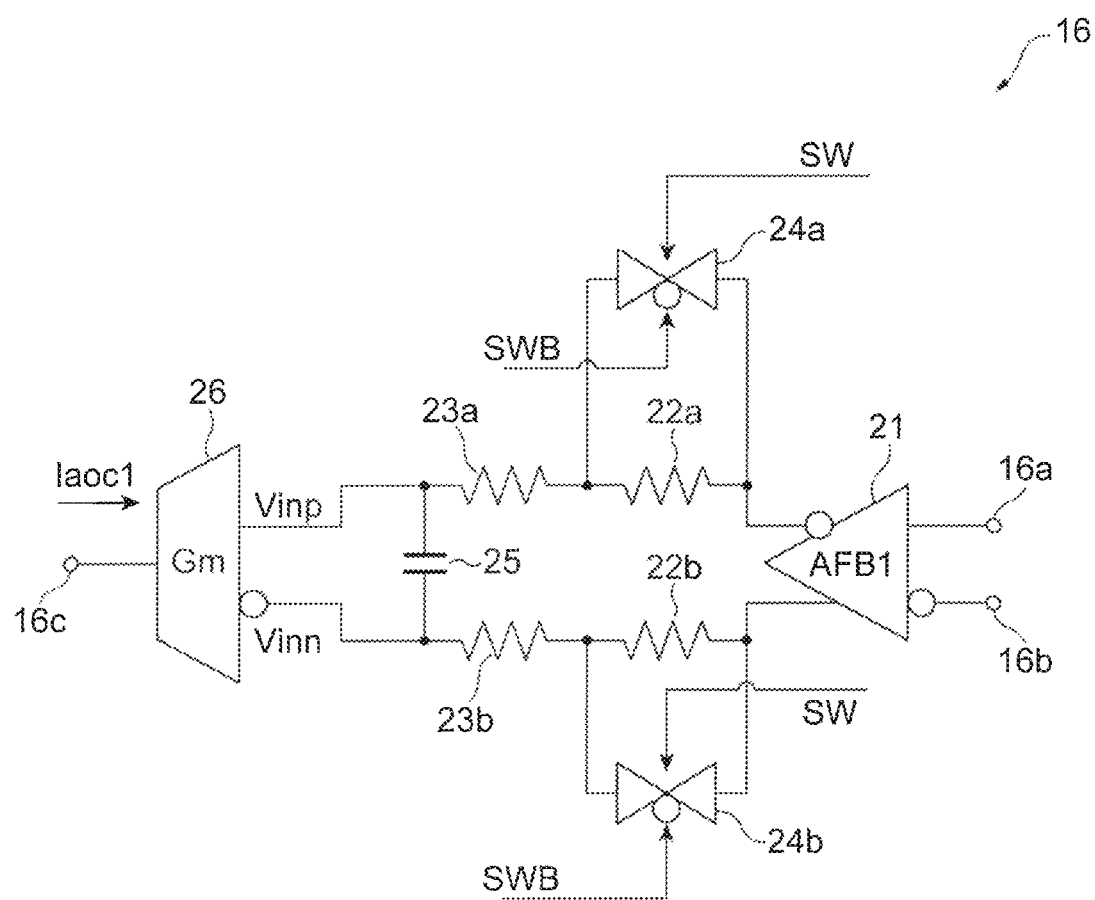
FIG. 4 is a diagram illustrating an example of a feedback circuit illustrated in FIG. 3.

Next, Details of the feedback circuit 16 will be described with reference to FIG. 4. FIG. 4 is a diagram illustrating an example of the feedback circuit illustrated in FIG. 3. An input terminal 16a of the feedback circuit 16 is connected to an output terminal of the dummy TIA 15, and the reference voltage signal Vref is input to the input terminal 16a. An input terminal 16b of the feedback circuit 16 is connected to an output terminal of the TIA core 14, and the voltage signal Vtia is input to the input terminal 16b. The bypass current Iaoc1 in accordance with the difference between the voltage signal Vtia and the reference voltage signal Vref is generated at an output terminal 16c of the feedback circuit 16. The feedback circuit 16 is provided with a differential amplifier 21, resistor elements 22a, 22b, 23a, and 23b, switches 24a and 24b, a capacitor 25, and an OTA 26. In the present embodiment, the resistor element 22a and the resistor element 22b have the same resistance value R1, and the resistor element 23a and the resistor element 23b have the same resistance value R2.

The reference voltage signal Vref and the voltage signal Vtia are input to the differential amplifier 21 through the input terminals 16a, 16b. One output terminal (negative-phase output terminal) of the differential amplifier 21 is connected to one end of the resistor element 22a and one end of the switch 24a. The other output terminal (positive-phase output terminal) of the differential amplifier 21 is connected to one end of the resistor element 22b and one end of the switch 24b. The other end of the resistor element 22a and the other end of the switch 24a are connected to one end of the resistor element 23a. The other end of the resistor element 22b and the other end of the switch 24b are connected to one end of the resistor element 23b. That is, the resistor element 22a and the switch 24a are connected in parallel to each other. The resistor element 22b and the switch 24b are connected in parallel to each other. The other end of the resistor element 23a is connected to a positive-phase input terminal of the OTA 26. The other end of the resistor element 23b is connected to a negative-phase input terminal of the OTA 26. The other end of the resistor element 23a and the other end of the resistor element 23b are connected to each other through the capacitor 25. In other words, the capacitor 25 is inserted between differential inputs of the OTA 26. An output terminal of the OTA 26 constitutes the output terminal 16c of the feedback circuit 16.

The differential amplifier 21 amplifies a voltage difference between the reference voltage signal Vref and the voltage signal Vtia to generate a differential signal. The differential amplifier 21 outputs the generated differential signal. The differential signal output from the differential amplifier 21 includes a negative-phase component output from the negative-phase output terminal and a positive-phase component output from the positive-phase output terminal. The switches 24a and 24b are, for example, transfer gate switches. Both switch signals SW and SWB are input to the switches 24a and 24b from the detector circuit 19. The switch signals SW and SWB are signals including a high-level state and a low-level state. A logical value of the switch signal SW and a logical value of the switch signal SWB are opposite to each other. For example, the switch signal SWB is generated by inputting the switch signal SW to an inverter circuit (NOT circuit). The switches 24a and 24b are controlled by the switch signals SW and SWB. The switches 24a and 24b are switched to an open state (off state) or a closed state (on state) in accordance with the switch signals SW and SWB. In the present embodiment, when the switch signal SW is at a high level and the switch signal SWB is at a low level, the switches 24a and 24b are maintained in a closed state. When the switch signal SW is at a low level and the switch signal SWB is at a high level, the switches 24a and 24b are maintained in an open state. Details of the switch signals SW and SWB will be described below.

The OTA 26 is an operational transconductance amplifier. The OTA 26 is a circuit that converts a voltage signal to a current signal. The OTA 26 is a circuit having a known configuration, for example, a configuration in which a current mirror circuit is added to a differential amplifier circuit. The OTA 26 has a transconductance Gm. An input/output impedance of the OTA 26 is, for example, infinite. As represented by Formula 1, the bypass current Iaoc1 flowing to the single output terminal (output terminal 16c) of the OTA 26 is obtained by multiplying an input differential voltage which is the difference between the voltage Vinp and the voltage Vinn which are input to the OTA 26 by the transconductance Gm. The difference between the voltage Vinp and the Vinn varies in accordance with the integral of the difference between the voltage signal Vtia and the reference voltage signal Vref. Thus, the bypass current Iaoc1 is generated in accordance with the integral of the difference between the voltage signal Vtia and the reference voltage signal Vref. When the input differential voltage (a current value of the bypass current Iaoc1) is a positive value, the bypass current Iaoc1 flows toward the outside from the OTA 26 (feedback circuit 16). When the input differential voltage (the current value of the bypass current Iaoc1) is a negative value, the bypass current Iaoc1 flows toward the OTA 26 (feedback circuit 16) from the outside of the feedback circuit 16. In this case, the bypass current Iaoc1 is subtracted from the input current Iapd.

[Formula 1]

$$Iaoc1 = Gm \times (Vinp - Vinm) \quad (1)$$

The feedback circuit 16 has a time constant and controls the bypass current Iaoc1 at a response speed which is adjusted in accordance with a value of the time constant. The value of the time constant of the feedback circuit 16 is determined by an open/closed state of the switches 24a and 24b and a constant of a circuit element. The value of the time constant of the feedback circuit 16 is a time constant $\tau 1$ (first time constant) when the switches 24a and 24b are in an open state and a time constant $\tau 2$ (second time constant) when the switches 24a and 24b are in a closed state. When the switch signal SW is at a low level, the switches 24a and 24b are in an open state. Thus, as represented by Formula (2), the time constant $\tau 1$ is determined by the resistance value R1 of the resistor elements 22a and 22b, the resistance value R2 of the resistor elements 23a and 23b, and a capacitance C1 of the capacitor 25. On the other hand, when the switch signal SW is at a high level, the switches 24a and 24b are in a closed state. Thus, a resistance value of a parallel circuit including the switch 24a and the resistor element 22a and that of a parallel circuit including the switch 24b and the resistor element 22b are substantially equal to zero. Thus, as represented by Formula (3), the time constant $\tau 2$ is determined by the resistance value R2 and the capacitance C1.

[Formula 2]

$$\tau 1 = 2 \times (R1 + R2) \times C1 \quad (2)$$

[Formula 3]

$$\tau 2 = 2 \times R2 \times C1 \quad (3)$$

As represented by Formulae (2), (3), the time constant $\tau 2$ is smaller than the time constant $\tau 1$. That is, when the time constant of the feedback circuit 16 is set to the time constant $\tau 2$, a response speed of control of the bypass current Iaoc1 by the feedback circuit 16 is faster than a response speed when the time constant of the feedback circuit 16 is set to the time constant $\tau 1$. In other words, when the high-level switch signal SW is input to the feedback circuit 16, a slew rate of the bypass current Iaoc1 adjusted by the feedback circuit 16 is larger than that when the low-level switch signal SW is input to the feedback circuit 16. The high-level switch signal SW is the switch signal SW maintained in a high-level state. The low-level switch signal SW is the switch signal SW maintained in a low-level state. The change in the time constant of the feedback circuit 16 causes no change in a DC gain of an open loop transfer function in a control loop of the feedback circuit 16, and a value of the bypass current Iaoc1 does not become discontinuous by a switch of the time constant. Although the differential amplifier 21 of the feedback circuit 16 outputs the differential signal, the feedback circuit 16 may include a single-ended differential amplifier which outputs a single output signal instead of the differential amplifier 21. In this case, the feedback circuit 16 may generate the bypass current Iaoc1 in a manner similar to the above.

The differential amplifier circuit 17 is a circuit that generates the differential signal Vout including the positive-phase component Voutp and the negative-phase component Voutn in accordance with the difference between the voltage signal Vtia and the reference voltage signal Vref. The differential amplifier circuit 17 is provided with the differential amplifier 17a and the differential amplifier 17b. The differential amplifier 17a amplifies the difference between the voltage signal Vtia and the reference voltage signal Vref to generate a differential signal. The differential amplifier 17a outputs the generated differential signal to the differential amplifier 17b. The differential amplifier 17b amplifies the differential signal output from the differential amplifier 17a to generate the differential signal Vout including the positive-phase component Voutp and the negative-phase component Voutn. The differential amplifier circuit 17 (differential amplifier 17b) outputs the differential signal Vout to the limiting amplifier 12 through output terminals 11b and 11c of the transimpedance amplifier 11. The differential amplifier circuit 17 outputs the differential signal Vout to the feedback circuit 18 and the detector circuit 19.

The feedback circuit 18 is a circuit that feedback-controls the differential amplifier circuit 17 to remove a DC offset (direct-current offset) included in the differential signal Vout. The difference between the mean value of the voltage signal Vtia and the reference voltage signal Vref is caused by noise generated in the differential amplifier circuit 17, and the difference is amplified by the differential amplifier circuit 17. Thus, a DC offset may occur in the differential signal Vout. The DC offset included in the differential signal Vout is the difference between the potential of a DC component included in the positive-phase component Voutp and the potential of a DC component included in the negative-phase component Voutn. A positive-phase output terminal and a negative-phase output terminal of the feedback circuit 18 are connected to output resistor elements (not illustrated) of the differential amplifier 17a. The feedback circuit 18 operates so that the potential of the DC component included in the positive-phase component Voutp and the potential of the DC component included in the negative-phase component Voutn become equal to each other. Specifically, the feedback circuit 18 amplifies the difference between low-frequency components including the DC components included in the positive-phase component Voutp and the negative-phase component Voutn to generate bypass currents Iaoc2p and Iaoc2n in accordance with the difference. The feedback circuit 18 has a configuration similar to the configuration of a known feedback circuit. Thus, detailed description of the configuration of the feedback circuit 18 will be omitted. The potential of the DC component included in the differential signal output from the differential amplifier 17a is adjusted by the feedback control performed by the feedback circuit 18, and the mean value of the voltage of the differential signal Vout becomes substantially equal to zero.

The detector circuit 19 is a circuit that detects the start and the end of the burst optical signal. The detector circuit 19 monitors the strength of the burst optical signal based on the differential signal Vout and adjusts a control threshold. The detector circuit 19 is also referred to as a Burst Timing Generator (BTG). The detector circuit 19 detects the start and the end of the burst optical signal to output a switch signal SW for switching the time constant to the feedback circuit 16. In the present embodiment, the detector circuit 19 detects the start of the burst optical signal based on a peak value Vp1 (third peak value) of the differential signal Vout and a mean value Vave of the differential signal Vout. Specifically, the detector circuit 19 detects the start of the burst optical signal upon detecting that the peak value Vp1 is larger than a threshold Vth1 (second threshold). In other words, the detector circuit 19 detects the start of the burst optical signal when the peak value Vp1 is detected as having exceeded the threshold Vth1. The threshold Vth1 is generated in accordance with the mean value Vave. The detector circuit 19 detects the end of the burst optical signal based on a peak value Vp2 (second peak value) of the negative-phase component Voutn and a peak value Vp3 (first peak value) of the positive-phase component Voutp. Specifically, the detector circuit 19 detects the end of the burst optical signal upon detecting that the peak value Vp2 is larger than a threshold Vth2 (first threshold). In other words, the detector circuit 19 detects the end of the burst optical signal when the peak value Vp2 is detected as having exceeded the threshold Vth2. The threshold Vth2 is generated in accordance with the peak value Vp3.

The detector circuit 19 outputs the switch signal SW to the feedback circuit 16. The switch signal SW is set to a low level in an initial state. That is, in the initial state, the time constant of the feedback circuit 16 is set to the time constant $\tau 1$. In response to detecting the start or the end of the burst optical signal, the detector circuit 19 switches the switch signal SW from a low level to a high level. In the present embodiment, the detector circuit 19 maintains the switch signal SW at a high level for a predetermined period. When the switch signal SW maintained at a high level is input to the feedback circuit 16, the time constant of the feedback circuit 16 is switched from the time constant $\tau 1$ to the time constant $\tau 2$. After an elapse of the predetermined period, the detector circuit 19 switches the switch signal SW from a high level to a low level. Accordingly, the time constant of the feedback circuit 16 is switched from the time constant $\tau 2$ to the time constant $\tau 1$. In the present embodiment, the predetermined period during which the detector circuit 19 continuously outputs the high-level as the switch signal SW is shorter than the period Ts of the preamble signal. Every time the detector circuit 19 detects the start or the end of the burst optical signal, the detector circuit 19 performs the above operation of switching the switch signal SW. In this manner, in response to detecting the start or the end of the burst optical signal, the detector circuit 19 switches the time constant of the feedback circuit 16 from the time constant $\tau 1$ to the time constant $\tau 2$ by the operation of switching the switch signal SW.

Figure 5:
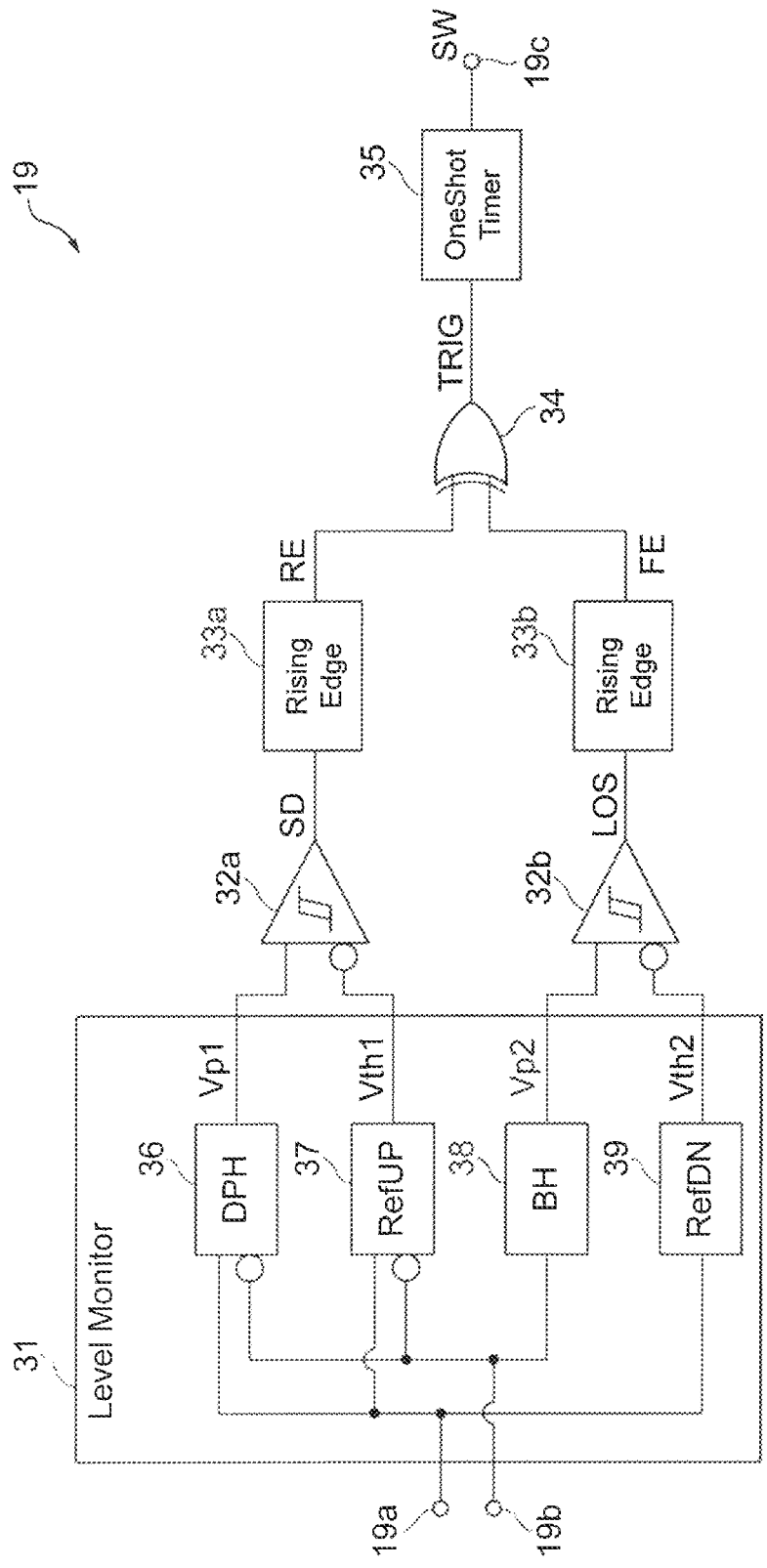
FIG. 5 is a circuit diagram illustrating a detector circuit illustrated in FIG. 3.
Figure 6A:
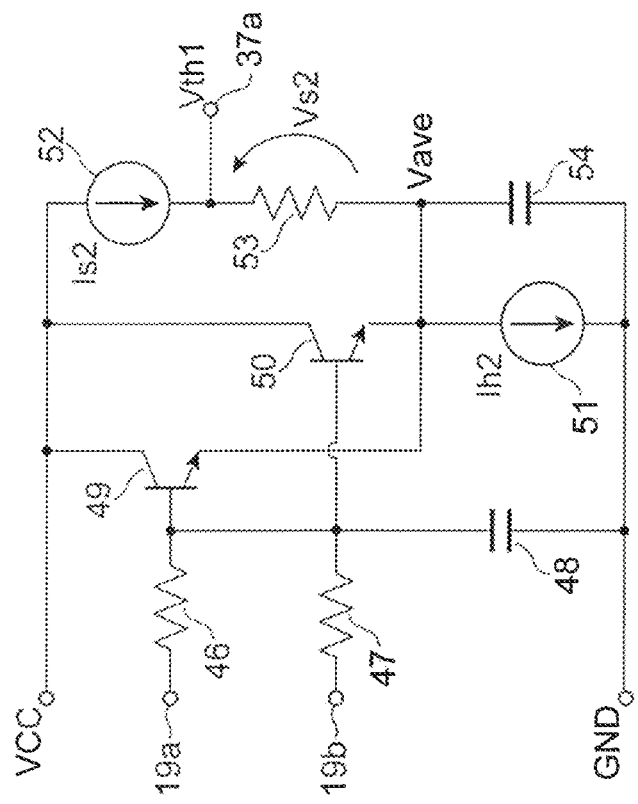
FIG. 6A is a circuit diagram illustrating a differential peak-hold circuit illustrated in FIG. 5.
Figure 6B:
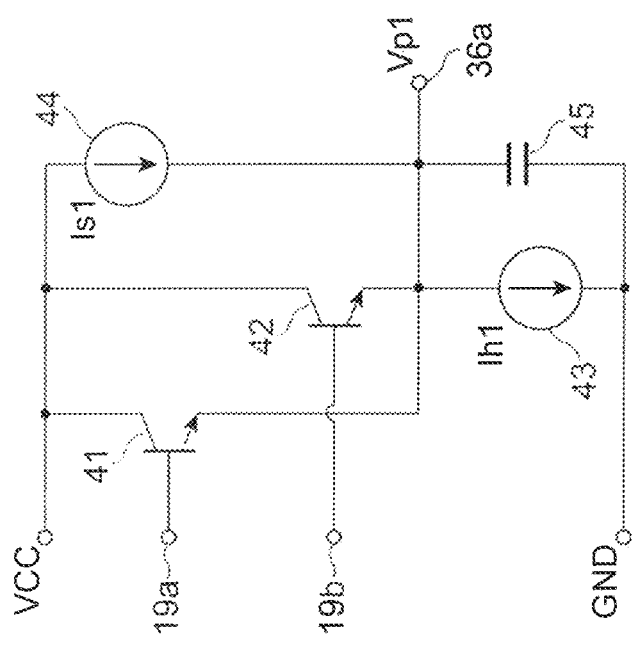
FIG. 6B is a circuit diagram illustrating a threshold generator circuit illustrated in FIG. 5.
Figure 7A:
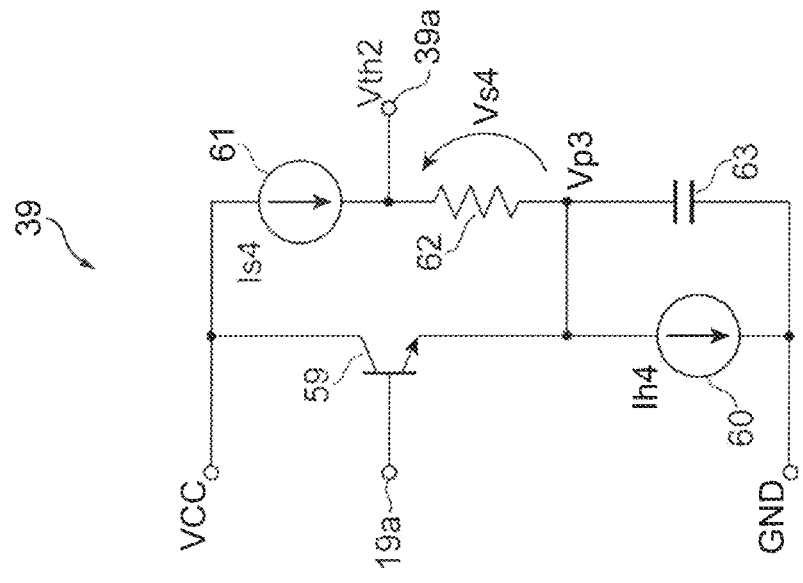
FIG. 7A is a circuit diagram illustrating a single-phase peak-hold circuit illustrated in FIG. 5.
Figure 7B:
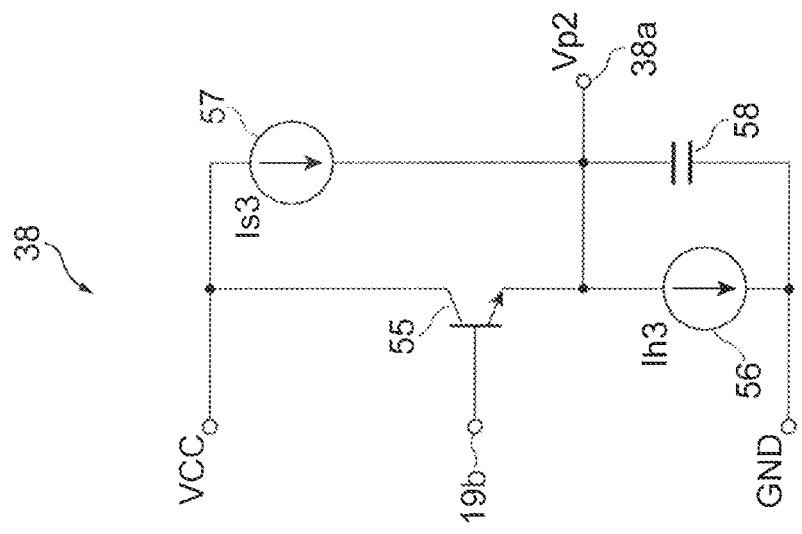
FIG. 7B is a circuit diagram illustrating a threshold generator circuit illustrated in FIG. 5.
Figure 8A:
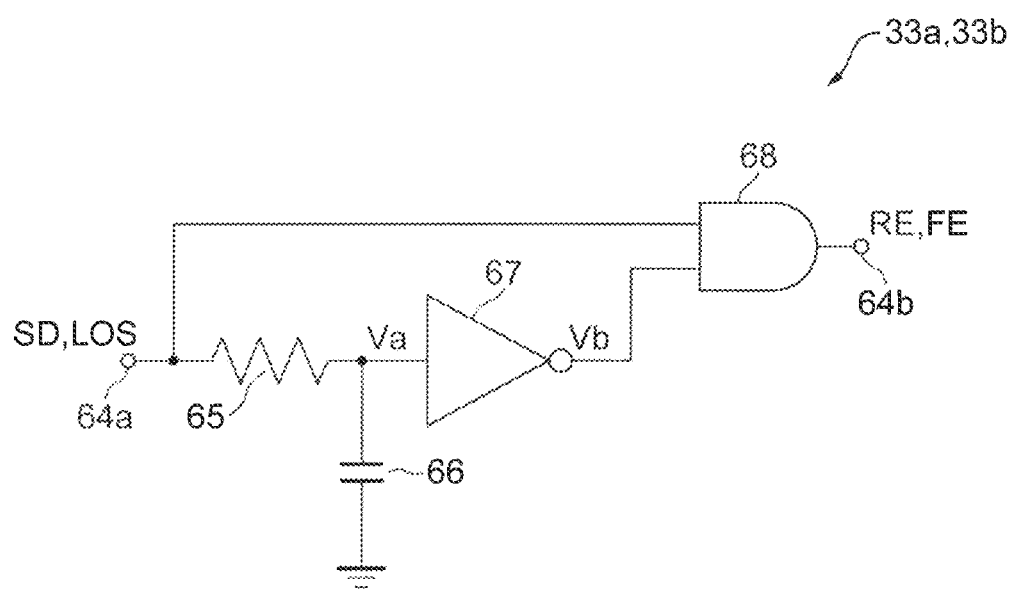
FIG. 8A is a circuit diagram illustrating an edge detector circuit illustrated in FIG. 5.
Figure 8B:
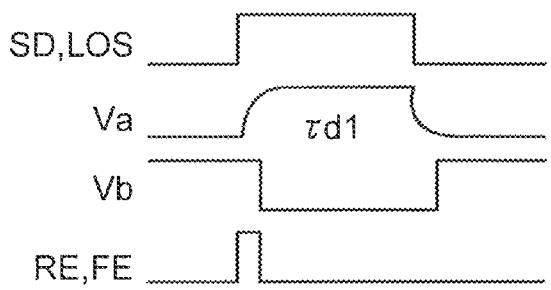
FIG. 8B is a timing chart illustrating the operation of the edge detector circuit illustrated in FIG. 5.
Figure 9A:
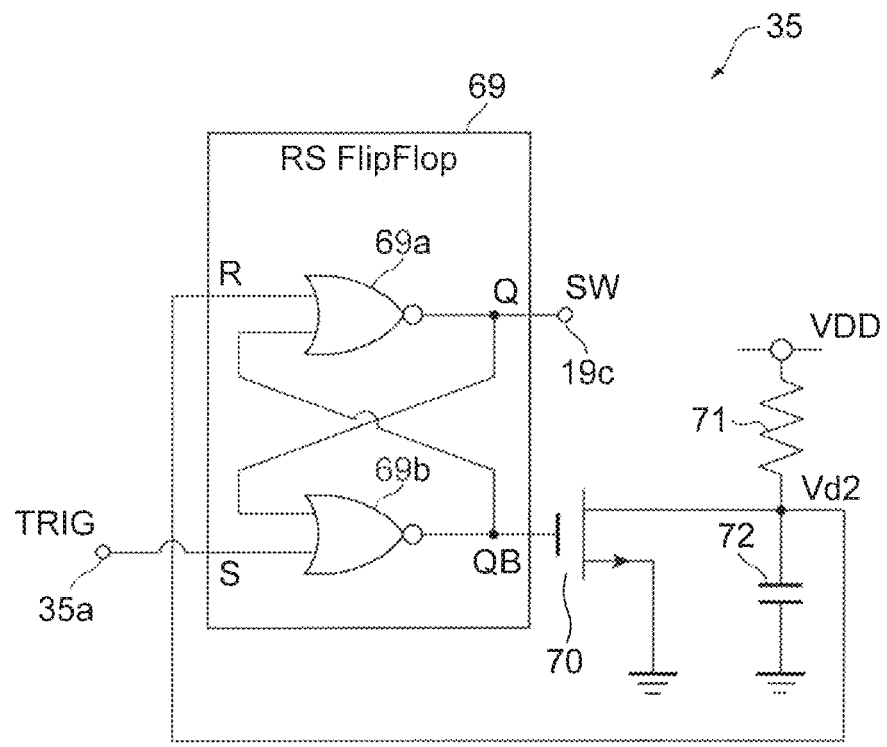
FIG. 9A is a circuit diagram illustrating a switch signal generator circuit illustrated in FIG. 5.
Figure 9B:
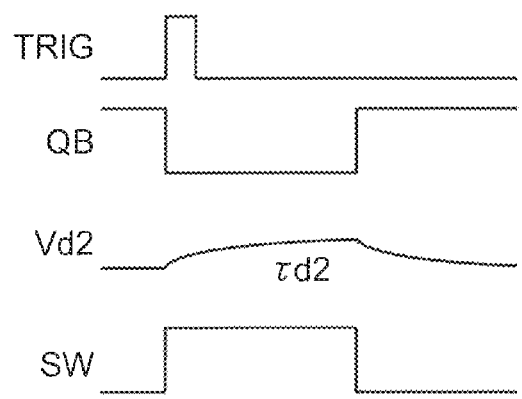
FIG. 9B is a timing chart illustrating the operation of the switch signal generator circuit illustrated in FIG. 5.

Next, details of the detector circuit 19 will be described with reference to FIGS. 5 to 9B. FIG. 5 is a circuit diagram illustrating the detector circuit illustrated in FIG. 3. FIG. 6A is a circuit diagram illustrating a differential peak-hold circuit illustrated in FIG. 5. FIG. 6B is a circuit diagram illustrating a threshold generator circuit illustrated in FIG. 5. FIG. 7A is a circuit diagram illustrating a single-phase peak-hold circuit illustrated in FIG. 5. FIG. 7B is a circuit diagram illustrating a threshold generator circuit illustrated in FIG. 5. FIG. 8A is a circuit diagram illustrating an edge detector circuit illustrated in FIG. 5. FIG. 8B is a timing chart illustrating the operation of the edge detector circuit illustrated in FIG. 5. FIG. 9A is a circuit diagram illustrating a switch signal generator circuit illustrated in FIG. 5. FIG. 9B is a timing chart illustrating the operation of the switch signal generator circuit illustrated in FIG. 5.

The detector circuit 19 illustrated in FIG. 5 is provided with a level monitor circuit 31, comparator circuits 32a and 32b, edge detector circuits 33a and 33b, an XOR circuit 34, and a switch signal generator circuit 35. The positive-phase component Voutp is input to an input terminal 19a of the detector circuit 19, and the negative-phase component Voutn is input to an input terminal 19b of the detector circuit 19.

The level monitor circuit 31 is a circuit that monitors the differential signal Vout. Specifically, the level monitor circuit 31 detects the peak value Vp1, the mean voltage peak value Vave, the peak value Vp2, and the peak value Vp3. The level monitor circuit 31 generates the threshold Vth1 and the threshold Vth2. The level monitor circuit 31 outputs the peak value Vp1 and the threshold Vth1 to the comparator circuit 32a and outputs the peak value Vp2 and the threshold Vth2 to the comparator circuit 32b. The level monitor circuit 31 is provided with a differential peak-hold circuit 36, a threshold generator circuit 37 (second threshold generator circuit), a single-phase peak-hold circuit 38, and a threshold generator circuit 39 (first threshold generator circuit). The positive-phase component Voutp is input to the differential peak-hold circuit 36, the threshold generator circuit 37, and the threshold generator circuit 39 through the input terminal 19a. The negative-phase component Voutn is input to the differential peak-hold circuit 36, the threshold generator circuit 37, and the single-phase peak-hold circuit 38 through the input terminal 19b. That is, the differential signal Vout is input to the differential peak-hold circuit 36 and the threshold generator circuit 37.

The differential peak-hold circuit 36 is a circuit that detects the peak value Vp1 of the differential signal Vout. The differential peak-hold circuit 36 outputs the peak value Vp1 to the comparator circuit 32a. As illustrated in FIG. 6A, the differential peak-hold circuit 36 is provided with transistors 41 and 42, current sources 43 and 44, and a capacitor 45. A base of the transistor 41 is connected to the input terminal 19a. A base of the transistor 42 is connected to the input terminal 19b. Collectors of the transistors 41 and 42 are connected to a supply voltage VCC. Emitters of the transistors 41 and 42 are connected to an output terminal 36a. One end of the current source 43 is connected to the output terminal 36a (the emitters of the transistors 41 and 42), and the other end of the current source 43 is connected to the ground potential GND. One end of the current source 44 is connected to the supply voltage VCC, and the other end of the current source 44 is connected to the output terminal 36a (the emitters of the transistors 41 and 42). The capacitor 45 is connected in parallel to the current source 43. That is, one end of the capacitor 45 is connected to the output terminal 36a, and the other end of the capacitor 45 is connected to the ground potential GND. The capacitor 45 has a capacitance Ch1. The current source 43 generates a current Ih1. The current source 44 generates a current Is1. The current sources 43 and 44 respectively force the currents Ih1, Is1 toward the ground potential GND. A charging voltage generated across the capacitor 45 is output as the peak value Vp1 from the differential peak-hold circuit 36.

In the differential peak-hold circuit 36, the capacitor 45 is charged in accordance with an input signal input to the bases of the transistors 41 and 42. When either the transistor 41 or the transistor 42 is in an on state, a charging current flows through the capacitor 45, and electric charge is stored in the capacitor 45. At this time, the charging voltage generated across the capacitor 45 corresponds to the peak value Vp1. The current source 43 releases (discharges) the electric charge stored in the capacitor 45. A current value of the current Is1 is set smaller than a current value of the current Ih1. The current sources 43 and 44 bias the transistors 41 and 42. That is, operation reference potentials of the transistors 41 and 42 are set by the current sources 43 and 44. A discharging current flows in the direction for discharging the capacitor 45 by a resultant current generated by the current sources 43 and 44.

As the amplitude of the differential signal Vout increases, peak values of the positive-phase component Voutp and the negative-phase component Voutn increase. The transistor 41 is turned to an on state when the amplitude of the positive-phase component Voutp becomes larger than a predetermined value. The transistor 42 is turned to an on state when the amplitude of the negative-phase component Voutn becomes larger than the predetermined value. The predetermined value is determined by, for example, a voltage value between the base and the emitter at which the transistors 41 and 42 change from an off state to an on state. When either the amplitude of the positive-phase component Voutp or the amplitude of the negative-phase component Voutn becomes larger than the predetermined value, the capacitor 45 is charged. When the increase in the amplitude of the differential signal Vout comes to a stop, the charging current flowing through the capacitor 45 is reduced. Then, the discharging current, which is the difference between the current Ih1 and the current Is1, and the charging current through the transistors 41 and 42 are brought into equilibrium, which stabilizes the charging voltage of the capacitor 45. The charging voltage at this time corresponds to the peak value Vp1 (peak potential).

As the amplitude of the differential signal Vout decreases, the charging current flowing through the capacitor 45 further decreases, and discharging from the capacitor 45 is started. At this time, the impedances of the current sources 43 and 44 are extremely high, and the transistors 41 and 42 are in an off state. Thus, the time constant of the capacitor 45 during discharging is larger than the time constant during charging. Thus, the peak value Vp1 is maintained (held) substantially constant for a predetermined period. The differential signal Vout includes the positive-phase component Voutp and the negative-phase component Voutn which are complementary to each other, and the transistor 41 and the transistor 42 are complementarily (alternately) turned to an on state. Thus, the differential peak-hold circuit 36 performs an operation (detection) corresponding to full-wave rectification with respect to the differential signal Vout. That is, the capacitor 45 is substantially in a charged state and the peak value Vp1 is maintained except a transition segment of data included in the differential signal Vout.

The threshold generator circuit 37 is a circuit that generates the threshold Vth1 in accordance with the mean voltage of the differential signal Vout. The threshold generator circuit 37 detects the mean value Vave and outputs the threshold Vth1 for determining the presence or absence (start) of the burst optical signal to the comparator circuit 32a. The mean value Vave of the differential signal Vout corresponds to a peak value of the mean voltage of the differential signal Vout. As illustrated in FIG. 6B, the threshold generator circuit 37 is provided with resistor elements 46 and 47, a capacitor 48, transistors 49 and 50, current sources 51 and 52, a resistor element 53, and a capacitor 54. The current source 51 generates a current Ih2. The current source 52 generates a current Is2. The capacitor 54 has a capacitance Ch2.

In the threshold generator circuit 37, one end of the resistor element 46 is connected to the input terminal 19a, and one end of the resistor element 47 is connected to the input terminal 19b. The other ends of the resistor elements 46 and 47 are connected to each other. A connection point (node) between the resistor element 46 and the resistor element 47 is connected to the ground potential GND through the capacitor 48. The connection point between the resistor element 46 and the resistor element 47 is connected to bases of the transistors 49 and 50. Collectors of the transistors 49 and 50 are connected to the supply voltage VCC. Emitters of the transistors 49 and 50 are connected to the ground potential GND through a parallel circuit including the current source 51 and the capacitor 54 which are connected in parallel to each other. The emitters of the transistors 49 and 50 are connected to an output terminal 37*a* through the resistor element 53. The current source 52 is connected between the supply voltage VCC and the output terminal 37*a*.

A resistance value of the resistor element 46 and a resistance value of the resistor element 47 are equal to each other. Accordingly, the mean voltage (common potential) of the differential signal Vout is detected at the connection point between the resistor element 46 and the resistor element 47. The capacitor 48 bypasses high-frequency noise of a common mode. The threshold generator circuit 37 maintains the mean value Vave of the differential signal Vout as a result of peak detection of the mean voltage (common potential) of the differential signal Vout. Accordingly, the mean value Vave of the differential signal Vout is detected as the potential of the emitters of the transistors 49 and 50 (the voltage across the capacitor 54). The potential of the emitters of the transistors 49 and 50 is offset (shifted) by a voltage Vs2 across the resistor element 53 by the current Is2 flowing to the resistor element 53 from the current source 52. That is, the threshold Vth1 is generated by adding the voltage Vs2 generated across the resistor element 53 to the mean value Vave (the potential of the emitters of the transistors 49 and 50). In other words, the threshold Vth1 is generated by adding the voltage Vs2 to the mean voltage of the differential signal Vout.

In the present embodiment, the transistors 41 and 42 of the differential peak-hold circuit 36 and the transistors 49 and 50 of the threshold generator circuit 37 all have the same size. The current sources 43 and 51 are configured so that the current values of the current Ih1 and the current Ih2 become equal to each other. The current sources 44 and 52 are configured so that the current values of the current Is1 and the current Is2 become equal to each other. Collector current densities of the transistors 41, 42, 49 and 50 become equal to each other by the setting of the currents Ih1, Ih2, Is1, and Is2. In order to achieve an equal filtering effect against noise, the capacitors 45, and 54 may be configured so that the capacitance Ch1 and the capacitance Ch2 become equal to each other.

The single-phase peak-hold circuit 38 is a circuit that detects the peak value Vp2 of the negative-phase component Voutn. The peak value Vp2 corresponds to a bottom value of the burst optical signal. The single-phase peak-hold circuit 38 outputs the peak value Vp2 to the comparator circuit 32*b*. As illustrated in FIG. 7A, the single-phase peak-hold circuit 38 is provided with a transistor 55, current sources 56 and 57, and a capacitor 58. The current source 56 generates a current Ih3. The current source 57 generates a current Is3. The capacitor 58 has a capacitance Ch3. A base of the transistor 55 is connected to the input terminal 19*b*. The negative-phase component Voutn is input to the base of the transistor 55. A collector of the transistor 55 is connected to the supply voltage VCC. An emitter of the transistor 55 is connected to an output terminal 38*a*. The emitter of the transistor 55 is connected to the ground potential GND through a parallel circuit including the current source 56 and the capacitor 58 which are connected in parallel to each other. The current source 57 is connected between the supply voltage VCC and the output terminal 38*a*.

In the single-phase peak-hold circuit 38, the capacitor 58 is charged with the negative-phase component Voutn. In a manner similar to the differential peak-hold circuit 36, when the amplitude of the negative-phase component Voutn becomes larger than a predetermined value, the transistor 55 is turned to an on state, and electric charge is stored in the capacitor 58. The current source 56 releases (discharges) the electric charge stored in the capacitor 58. A current value of the current Is3 is set smaller than a current value of the current Ih3. The current sources 56 and 57 bias the transistor 55. That is, a reference operating voltage of the transistor 55 is set by the current sources 56 and 57. A discharging current flows in the direction for discharging the capacitor 58 by a resultant current generated by the current source 56 and 57.

As the amplitude of the negative-phase component Voutn increases, the peak value of the negative-phase component Voutn increases. The transistor 55 is turned to an on state when the amplitude of the negative-phase component Voutn becomes larger than the predetermined value. When the transistor 55 is turned to an on state, a charging current flows through the capacitor 58, and the capacitor 58 is charged. When the increase in the amplitude of the negative-phase component Voutn comes to a stop, the charging current flowing through the capacitor 58 is reduced. Then, the discharging current, which is obtained by subtracting the current Is3 from the current Ih3, and the charging current through the transistor 55 are brought into equilibrium, which stabilizes the voltage across the capacitor 58. The voltage across the capacitor 58 at this time corresponds to the peak value Vp2 of the negative-phase component Voutn. As the amplitude of the negative-phase component Voutn further decreases, the charging current flowing through the capacitor 58 further decreases, and discharging from the capacitor 58 is started. At this time, the impedances of the current sources 56 and 57 are extremely high, and the time constant of the capacitor 58 during discharging is larger than the time constant during charging. Thus, the peak value Vp2 is maintained substantially constant for a predetermined period. Differently from the differential peak-hold circuit 36, a signal input to the single-phase peak-hold circuit 38 is the negative-single phase component Voutn. Thus, the single-phase peak-hold circuit 38 performs an operation (detection) corresponding to half-wave rectification with respect to the differential signal Vout.

The threshold generator circuit 39 is a circuit that generates the threshold Vth2 in accordance with the peak value Vp3. The threshold generator circuit 39 detects the peak value Vp3 and outputs the threshold Vth2 to the comparator circuit 32*b*. As illustrated in FIG. 7B, the threshold generator circuit 39 is provided with a transistor 59, current sources 60 and 61, a resistor element 62, and a capacitor 63. The current source 60 generates a current Ih4. The current source 61 generates a current Is4. The capacitor 63 has a capacitance Ch4. The threshold generator circuit 39 has the configuration similar to that of the single-phase peak-hold circuit 38 except the resistor element 62. A base of the transistor 59 is connected to the input terminal 19*a*. The positive-phase component Voutp is input to the base of the transistor 59. A collector of the transistor 59 is connected to the supply voltage VCC. An emitter of the transistor 59 is connected to the ground potential GND through a parallel circuit including the current source 60 and the capacitor 63 which are connected in parallel to each other. The emitter of the transistor 59 is connected to an output terminal 39*a* through the resistor element 62. The current source 61 is connected between the supply voltage VCC and the output terminal 39*a*.

In a manner similar to the single-phase peak-hold circuit 38, the threshold generator circuit 39 performs an operation for maintaining a peak value on a single phase input signal. In the threshold generator circuit 39, the peak value Vp3 is detected as an emitter potential of the transistor 59. When the current Is4 flows through the resistor element 62, a potential offset (shifted) by a voltage Vs4 generated across the resistor element 62 from the emitter potential is generated as the threshold Vth2. Although the threshold generator circuit 39 detects the peak value in a manner similar to the single-phase peak-hold circuit 38, the input signal is the positive-phase component Voutp in the threshold generator circuit 39. Thus, at the instant when a burst optical signal having a large amplitude ends, a voltage value of the positive-phase component Voutp decreases, and the threshold Vth2 decreases from a high voltage value at a higher speed than the peak value Vp2.

In the present embodiment, the transistor 55 of the single-phase peak-hold circuit 38 and the transistor 59 of the threshold generator circuit 39 have the same size. The current sources 56 and 60 are configured so that the current values of the current Ih3 and the current Ih4 become equal to each other. The current sources 57 and 61 are configured so that the current values of the current Is3 and the current Is4 become equal to each other. Collector current densities of the transistors 55 and 59 become equal to each other by the setting of the current values of the currents Ih3, Ih4, Is3, and Is4. In order to achieve an equal filtering effect against noise, the capacitors 58 and 63 may be configured so that the capacitance Ch3 of the capacitor 58 and the capacitance Ch4 of the capacitor 63 become equal to each other.

Further, the capacitances Ch3 and Ch4 may be set so that a malfunction caused by discharging does not occur when a burst optical signal including consecutive identical digit signals is input. For example, in a communication system in which a signal transmission speed is 10 Gb/s (bps; bits per second), the capacitances Ch3 and Ch4 are set so that the consecutive identical digits tolerance is satisfied with 72 bits as the set number of bits. In the communication system in which the transmission speed is 10 Gb/s, 100 psec is assigned to each signal of one symbol. In this case, in the capacitors 58 and 63, the single-phase peak-hold circuit 38 and the threshold generator circuit 39 may be configured so that discharging is performed at a discharge time constant having a value at least approximately twice a period of a signal corresponding to the set number of bits described above. For example, the discharge time constant when the capacitors 58 and 63 are discharged may be set to 14.4 nsec or more.

On the other hand, when the discharge time constant is too large in detection of the end of a burst optical signal, the detection may be delayed. The discharge time constant in the single-phase peak-hold circuit 38 is determined by a value obtained by dividing a value obtained by subtracting the current Is3 from the current Ih3 by the capacitance Ch3 assuming that the impedances of the current sources 56 and 57 are infinite. The discharge time constant in each of the differential peak-hold circuit 36, the threshold generator circuit 37, and the threshold generator circuit 39 is also determined in a manner similar to the single-phase peak-hold circuit 38. For example, under the assumption that the value obtained by subtracting the current value of the Is3 from the current value of the Ih3 is 10 pA, the capacitance Ch3 is 10 pF, and the signal amplitude is 100 mV, a voltage change at 14.4 nsec is 14.4 mV which corresponds to an amplitude drop of 14.4%. A voltage changes at 100 nsec is 100 mV, and the amplitude drops to 0%. Thus, a delay time that affects the detection of the end of the burst optical signal is approximately 100 nsec at the maximum.

In detection of the start of the burst optical signal, an edge at the start of the burst optical signal is detected by comparing the peak value Vp1 with the threshold Vth1. The peak value Vp1 is a voltage obtained by full-wave rectifying the differential signal Vout and capable of responding to the start of the burst optical signal at a high speed. The response of the peak value Vp1 follows a change in a residual DC offset in feedback control in a low-speed state by the feedback circuit 16 with a delay by the discharge time constant. Thus, when the peak value Vp1 is used in detection of falling at the end of the burst optical signal, a response time of the peak value Vp1 is delayed. On the other hand, falling at the end of the burst optical signal is detected by comparing the peak value Vp2 with the threshold Vth2. The peak value Vp2 and the threshold Vth2 are voltages obtained by half-wave rectifying the differential signal Vout. Thus, when a discharge capacity (peak hold discharge capacity) for holding a peak value is reduced within a range in which erroneous detection (malfunction) does not occur when the identical digit is continued, the threshold Vth2 decreases at a higher speed than the peak value Vp2. Accordingly, falling at the end of the burst optical signal is detected.

In the transimpedance amplifier 11 of the present embodiment, when the burst optical signal is input to the receiver 9, the input current Iapd including both a high-level state and a low-level state is input, and a difference is generated between the reference voltage signal Vref and the voltage signal Vtia. Thus, the differential signal Vout having a predetermined amplitude is generated, and the peak value Vp1 of the differential signal Vout increases. Before the burst optical signal is input (during the interval period), the peak value Vp1 and the mean value Vave are substantially equal to each other. The threshold Vth1 is obtained by adding the voltage Vs2 to the mean value Vave. Thus, the peak value Vp1 is smaller than the threshold Vth1. On the other hand, when the burst optical signal is started (input), the mean voltage of the differential signal Vout is detected as the mean value Vave in the threshold generator circuit 37. Thus, the peak value Vp1 becomes larger than the mean value Vave. At this time, the peak value Vp1 is substantially equal to twice the mean value Vave. Thus, the start of the burst optical signal is detected by setting the threshold Vth1 so that the peak value Vp1 exceeds the threshold Vth1 immediately after the start of the burst optical signal. For example, the threshold Vth1 is set by previously measuring the peak value Vp1 and the mean value Vave at the start of the burst optical signal.

When the burst optical signal ends, the input current Iapd becomes a low-level state, and the residual bypass current Iaoc1 is input as the current signal Iin to the TIA core 14. Thus, after the end of the burst optical signal, a state in which the amplitude of the negative-phase component Voutn is higher than the amplitude of the positive-phase component Voutp is continued. At this time, the positive-phase component Voutp becomes a low-level state. While the burst optical signal is input, the amplitude of the negative-phase component Voutn and the amplitude of the positive-phase component Voutp are substantially equal to each other. Thus, the peak value Vp2 and the peak value Vp3 are substantially equal to each other. The threshold Vth2 is obtained by adding the voltage Vs4 to the peak value Vp3. Thus, the peak value Vp2 is smaller than the threshold Vth2. On the other hand, since the positive-phase component Voutp becomes a low-level state when the burst optical signal ends, the electric charge of the capacitor 63 is released in the threshold generator circuit 39, and the peak value Vp3 decreases. The peak value Vp2 is maintained substantially constant in the single-phase peak-hold circuit 38. Accordingly, the peak value Vp2 becomes larger than the peak value Vp3. Thus, the end of the burst optical signal is detected by setting the threshold Vth2 so that the peak value Vp2 exceeds the threshold Vth2 immediately after the end of the burst optical signal. For example, the threshold Vth2 is set by previously measuring the peak values Vp2 and Vp3 at the end of the burst optical signal.

Each of the comparator circuits 32a and 32b is, for example, a comparator circuit having a hysteresis characteristic. Specifically, the comparator circuit 32a compares the peak value Vp1 with the threshold Vth1, and outputs a signal SD in either a high-level state or a low-level state to the edge detector circuit 33a in accordance with a result of the comparison. When the peak value Vp1 is smaller than or equal to the threshold Vth1, the comparator circuit 32a outputs the low-level signal SD. On the other hand, when the peak value Vp1 is larger than the threshold Vth1, the comparator circuit 32a outputs the high-level signal SD.

The comparator circuit 32b compares the peak value Vp2 with the threshold Vth2, and outputs a signal LOS in either a high-level state or a low-level state to the edge detector circuit 33b in accordance with a result of the comparison. When the peak value Vp2 is smaller than or equal to the threshold Vth2, the comparator circuit 32b outputs the low-level signal LOS. On the other hand, when the peak value Vp2 is larger than the threshold Vth2, the comparator circuit 32b outputs the high-level signal LOS. For example, a hysteresis amount of each of the comparator circuits 32a and 32b is set to a value that makes it possible to prevent erroneous detection caused by noise that is generated due to a modulation state of an input signal in the level monitor circuit 31.

The edge detector circuits 33a and 33b are circuits that detect a change in a logical value in the signal SD and the signal LOS respectively. Specifically, the edge detector circuit 33a detects a switch from a low level to a high level (rising edge) in the signal SD. When the edge detector circuit 33a detects the switch, the edge detector circuit 33a outputs a high-level signal RE to the XOR circuit 34 for a predetermined period. The edge detector circuit 33b detects a switch from a low level to a high level in the signal LOS. When the edge detector circuit 33b detects the switch, the edge detector circuit 33b outputs a high-level signal FE to the XOR circuit 34 for a predetermined period. When no switch has been detected, the edge detector circuits 33a and 33b respectively output low-level signals RE and FE to the XOR circuit 34. The edge detector circuits 33a and 33b have configurations similar to each other.

As illustrated in FIG. 8A, each of the edge detector circuits 33a and 33b is provided with a resistor element 65, a capacitor 66, an inverter circuit 67, and an AND circuit 68. The signals SD and LOS are respectively input to an input terminals 64a of the edge detector circuit 33a and an input terminal 64a of the edge detector circuit 33b. The input terminal 64a is connected to one end of the resistor element 65 and one input terminal of the AND circuit 68. The other end of the resistor element 65 is connected to the ground potential through the capacitor 66 and connected to an input terminal of the inverter circuit 67. An output terminal of the inverter circuit 67 is connected to the other input terminal of the AND circuit 68. In each of the edge detector circuits 33a and 33b, the resistor element 65 and the capacitor 66 constitute a delay circuit.

FIG. 8B illustrates timing charts of the signal SD, a delay signal Va, an inverted signal Vb, and the signal RE. As illustrated in FIG. 8B, the delay signal Va which is delayed from the signal SD in accordance with a time constant $\tau d1$ is input to the input terminal of the inverter circuit 67. The time constant $\tau d1$ is obtained by multiplying the resistance value of the resistor element 65 by the capacitance of the capacitor 66. The inverted signal Vb which is obtained by inverting a logical value of the delay signal Va by the inverter circuit 67 is output from the output terminal of the inverter circuit 67. The AND circuit 68 calculates the logical AND of the signal SD and the inverted signal Vb, and outputs a result of the calculation as the signal RE from an output terminal 64b. The signal RE output from the output terminal 64b is at a high level only when the signal SD as an input signal is switched from a low level to a high level. A timing chart in a case where the signal LOS is input and the signal FE is output is similar to the timing chart in a case where the signal SD is input and the signal FE is output. In this manner, the edge detector circuits 33a and 33b respectively detect rising edges of the signals SD and LOS. The edge detector circuits 33a and 33b respectively output the high-level signals RE and FE having a pulse width substantially equal to the time constant $\tau d1$. The pulse widths of the high-level signals RE and FE are respectively shorter than the pulse widths of the high-level signals SD and LOS. The pulse width of each of the signals RE, FE, SD, and LOS corresponds to a period during which each signal is maintained in a high-level state.

The XOR circuit 34 calculates the exclusive logical OR of the signal RE and the signal FE and outputs a result of the calculation as a signal TRIG to the switch signal generator circuit 35. Specifically, when either the signal RE or the signal FE is in a high-level state, the XOR circuit 34 outputs the signal TRIG at a high level. The pulse width of the high-level signal TRIG is substantially equal to the pulse width of the high-level signals RE and FE. When both the signal RE and the signal FE are in a high-level state or a low-level state, the XOR circuit 34 outputs the signal TRIG at a low level. The detector circuit 19 may be provided with an OR circuit which calculates the logical OR of the signal RE and the signal FE instead of the XOR circuit 34.

FIG. 9A illustrates the switch signal generator circuit 35 which generates the switch signal SW. The switch signal generator circuit 35 is a circuit that generates the switch signal SW based on the signal TRIG. The switch signal generator circuit 35 outputs the switch signal SW to the feedback circuit 16. The switch signal generator circuit 35 is also referred to as a one-shot timer circuit. As illustrated in FIG. 9A, the switch signal generator circuit 35 is provided with an RS flip-flop circuit 69, a MOS transistor 70, a resistor element 71, and a capacitor 72. The RS flip-flop circuit 69 includes two NOR circuits 69a, 69b.

An input terminal 35a of the switch signal generator circuit 35 is connected to an S (set) terminal of the RS flip-flop circuit 69. That is, the signal TRIG is input to the S terminal of the RS flip-flop circuit 69. The S terminal is connected to one input terminal of the NOR circuit 69b. A Q terminal of the RS flip-flop circuit 69 which is an output terminal of the NOR circuit 69a is connected to the other input terminal of the NOR circuit 69b. A QB terminal of the RS flip-flop circuit 69 which is an output terminal of the NOR circuit 69b is connected to one input terminal of the NOR circuit 69a. The QB terminal is connected to a gate terminal of the MOS transistor 70. The MOS transistor 70 is an N-type (n channel) MOS transistor. A source terminal of the MOS transistor 70 is connected to the ground potential. A drain terminal of the MOS transistor 70 is connected to the supply voltage VDD through the resistor element 71 (pull-up resistor element) and connected to the ground potential through the capacitor 72.

A logical value of a signal output from the QB terminal is inverted at the drain terminal of the MOS transistor 70. The signal having the logical value inverted at the drain terminal of the MOS transistor 70 is delayed in accordance with a time constant τd2 to generate a delay signal Vd2. The time constant τd2 is determined by the product of the resistance value of the resistor element 71 and the capacitance of the capacitor 72. The drain terminal of the MOS transistor 70 is connected to an R (reset) terminal of the RS flip-flop circuit 69, and the delay signal Vd2 is input to the other input terminal of the NOR circuit 69a. The Q terminal of the RS flip-flop circuit 69 is connected to an output terminal 19c.

FIG. 9B illustrates timing charts of the signal TRIG, the signal at the QB terminal, the delay signal Vd2, and the switch signal SW. As illustrated in FIG. 9B, when the high-level signal TRIG is input to the input terminal 35a, the signal (switch signal SW) at the Q terminal of the RS flip-flop circuit 69 (output terminal 19c) changes from a low level to a high level. At this time, the MOS transistor 70 changes from an on state to an off state, and the delay signal Vd2 slowly rises from a low level to a high level at a speed defined by the time constant rd2. When the voltage value of the rising delay signal Vd2 exceeds a predetermined value, a reset indication is input to the other input terminal (R terminal) of the NOR circuit 69a. Accordingly, the signal at the Q terminal changes from a high level to a low level. When the reset indication is input to the R terminal, the signal at the QB terminal returns to a high level in an initial state. That is, the switch signal SW output from the output terminal 19c changes from a high level to a low level.

In this manner, a reset operation is performed in accordance with time corresponding to the rising speed of the voltage value of the delay signal Vd2 (reset signal). In order to reliably perform the reset operation after an elapse of a predetermined time from the rising edge of the signal TRIG; it is desired that the signal TRIG return to a low level before a logical value of the reset signal becomes effective (before the reset signal is asserted). Thus, the edge detector circuits 33a and 33b and the switch signal generator circuit 35 may be configured so that the time constant rd2 becomes larger than the time constant τd1. The time constant τd2 is set in accordance with the period Ts (settling time) of the preamble signal of the burst optical signal. In the present embodiment, the time constant τd2 is set so that a period during which the switch signal SW is at a high level becomes shorter than the period Ts.

In the detector circuit 19, when the peak value Vp1 exceeds the threshold Vth1, the comparator circuit 32a outputs the high-level signal SD to the edge detector circuit 33a. Similarly, when the peak value Vp2 exceeds the threshold Vth2, the comparator circuit 32b outputs the high-level signal LOS to the edge detector circuit 33b. When the edge detector circuits 33a and 33b detect that the signals SD and LOS have been switched from a low level to a high level, the edge detector circuits 33a and 33b respectively output the high-level signals RE and FE to the XOR circuit 34. The signal TRIG output from the XOR circuit 34 changes from a low level to a high level when either the signal RE or the signal FE is at a high level. The switch signal generator circuit 35 switches the switch signal SW from a low level to a high level when the signal TRIG is at a high level. The pulse width of a period during which the switch signal SW is at a high level is expanded longer than the pulse width of a period during which the signal TRIG is at a high level. In this manner, either when the peak value Vp1 exceeds the threshold Vth1 or when the peak value Vp2 exceeds the threshold Vth2, the switch signal SW maintained at a high level for a predetermined period is output to the feedback circuit 16 from the detector circuit 19.

Figure 10:
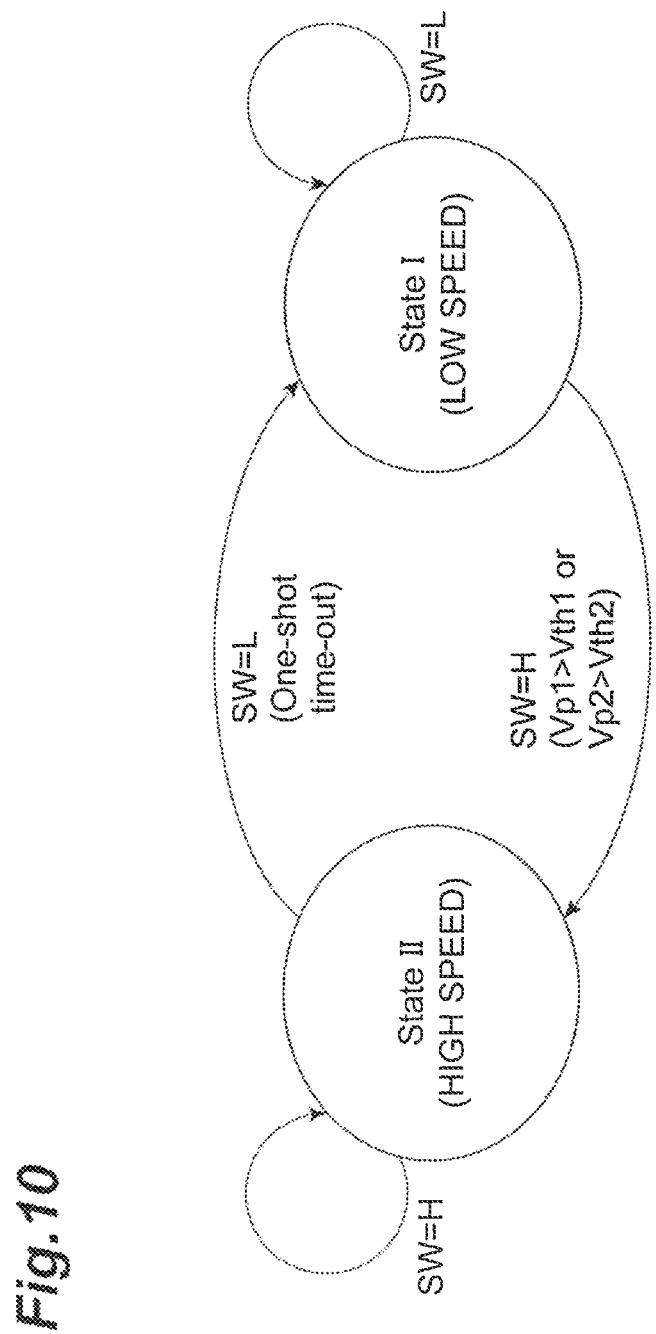
FIG. 10 is a state machine diagram illustrating a state transition of feedback control by the feedback circuit.

Next, a state transition of feedback control by the feedback circuit 16 will be described with reference to FIG. 10. FIG. 10 is a state machine diagram illustrating the state transition of feedback control by the feedback circuit. A state of feedback control by the feedback circuit 16 includes a state I in which the feedback control is performed at a low speed and a state II in which the feedback control is performed at a high speed. In the following description, for convenience of description, feedback control by the feedback circuit 16 is merely referred to as the "feedback control". In the state I, the time constant of the feedback circuit 16 is set to the time constant τ1. In the state II, the time constant of the feedback circuit 16 is set to the time constant τ2. In an initial state in which the transimpedance amplifier 11 starts operating, the feedback control is in the state I. When no burst optical signal is input, the switch signal SW is at a low level. Thus, the state of the feedback control is maintained in the state I. When a burst optical signal is input to the receiver 9, the transimpedance amplifier 11 generates the differential signal Vout by converting the current signal Iin. When the detector circuit 19 detects that the peak value Vp1 has become larger than the threshold Vth1, the signal TRIG changes from a low level to a high level, and the switch signal generator circuit 35 starts operating. As a result, the switch signal SW output from the detector circuit 19 (switch signal generator circuit 35) changes from a low level to a high level, and the state of the feedback control changes from the state I to the state II. That is, the time constant of the feedback circuit 16 is switched from the time constant τ1 to the time constant τ2.

While the switch signal SW is at a high level, the state of the feedback control is maintained in the state II. The time during which the state of the feedback control is maintained in the state II is determined by the time constant τd2 of the switch signal generator circuit 35. Immediately after the start of the burst optical signal, the current signal Iin includes a DC component. Thus, the feedback control is performed at a high speed so as to remove a DC offset (DC component) included in the voltage signal Vtia. When the switch signal SW changes from a high level to a low level, that is, when the switch signal generator circuit 35 times out, the state of the feedback control changes from the state II to the state I. That is, the time constant of the feedback circuit 16 is switched from the time constant τ2 to the time constant τ1. While the payload signal of the burst optical signal is input, the state of the feedback control is maintained in the state I. That is, during the period of the payload signal, the time constant of the feedback circuit 16 is maintained at the time constant 1.

When the burst optical signal ends, the current value of the input current Iapd output from the photodetector 10 rapidly becomes zero. At the instant when the burst optical signal ends, the state of the feedback control is maintained in the state I, and a residual DC offset which is the potential difference between DC components of the voltage signal Vtia and the reference voltage signal Vref increases. When the detector circuit 19 detects that the peak value Vp2 has become larger than the threshold Vth2, the signal TRIG changes from a low level to a high level, and the switch signal generator circuit 35 starts operating. As a result, the switch signal SW output from the detector circuit 19 (switch signal generator circuit 35) changes from a low level to a high level, and the state of the feedback control transitions from the state I to the state II. That is, the time constant of the feedback circuit 16 is switched from the time constant τ1 to the time constant τ2. While the switch signal SW is at a high level, the state of the feedback control is maintained in the state II, and the feedback circuit 16 performs the feedback control at a high speed so as to remove the residual DC offset. When the switch signal SW changes from a high level to a low level, that is, when the switch signal generator circuit 35 times out, the state of the feedback control transitions from the state II to the state I. That is, the state of the feedback control returns to the initial state, and the feedback circuit 16 is brought into a standby state for receiving the next burst optical signal. In the present embodiment, a period during which the state of the feedback control is maintained in the state II after the end of the burst optical signal is equal to a period during which the state of the feedback control is maintained in the state II after the start of the burst optical signal.

Figure 11:
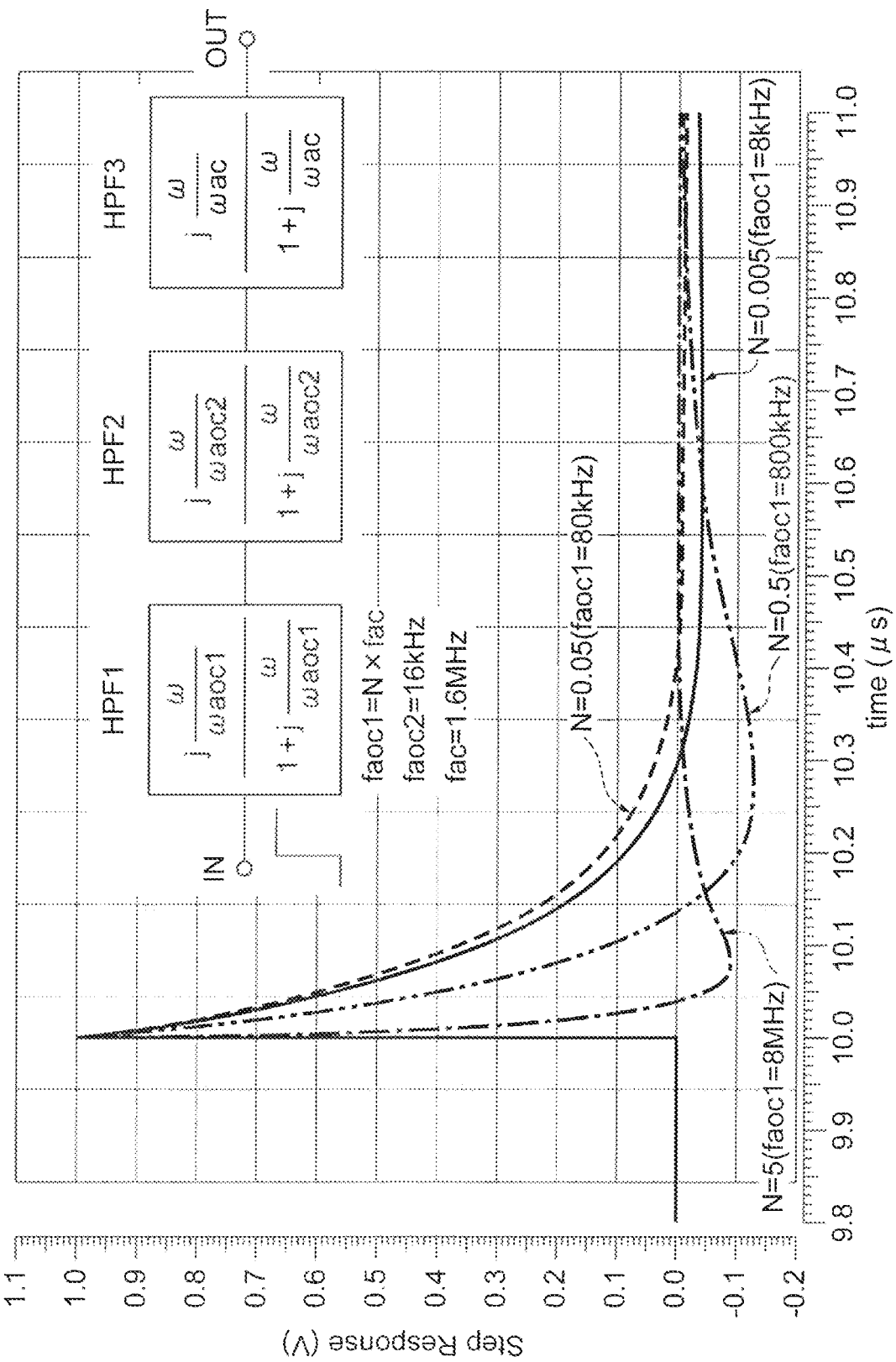
FIG. 11 is a diagram illustrating a calculation result of an ideal response when a plurality of high-pass filters are continuously connected.

Next, a method for setting the time constant of the feedback circuit 16, the time constant of the feedback circuit 18, and the time constant in AC coupling between the transimpedance amplifier 11 and the limiting amplifier 12 will be described. In the following description, the AC coupling between the transimpedance amplifier 11 and the limiting amplifier 12 is merely referred to as the "AC coupling". FIG. 11 is a diagram illustrating a calculation result of an ideal response when a plurality of high-pass filters are continuously connected. FIG. 11 illustrates a result of calculation of an ideal response when three high-pass filters (HPFs) intended for the feedback circuit 16, the feedback circuit 18, and the AC coupling are continuously connected. Each of the high-pass filters is a primary (first-order) high-pass filter. A transfer function of each of the high-pass filters is represented as a function of angular velocity. In FIG. 11, an angular velocity ωaoc1 is a cutoff angular velocity of the feedback circuit 16, an angular velocity ωaoc2 is a cutoff angular velocity of the feedback circuit 18, and an angular velocity ωac is a cutoff angular velocity of the AC coupling. For example, the time constant of the feedback circuit 16 is the reciprocal of the cutoff angular velocity ωaoc1. A cutoff frequency faoc1 is a value obtained by dividing the cutoff angular velocity ωaoc1 by twice the circle ratio π.

The calculation result illustrated in FIG. 11 is a calculation result of a step response at time 10 μsec. The calculation is performed with a cutoff frequency faoc2 set to 16 kHz and a cutoff frequency fac set to 1.6 MHz. The cutoff frequency fac is set to 1.6 MHz as a lower limit frequency at which a signal in which the identical digit is continued can be transmitted with no error. The cutoff frequency faoc2 is set to one hundredth of a set value of the cutoff frequency fac. FIG. 11 illustrates the calculation result of the step response when the cutoff frequency faoc1 is changed to N times the cutoff frequency fac. In the present embodiment, the calculation result when the cutoff frequency faoc1 is set to 0.005 time, 0.05 times, 0.5 times, and 5 times the cutoff frequency fac. For example, when the settling time is set to 400 nsec or less, in a step response indicated by a calculation result when N is 0.5, an error does not converge within 10% at the point of 10.4 μsec. In a step response indicated by a calculation result when N is 5, an error is substantially equal to zero at the point of 10.4 psec, and the step response has converged. Similarly, a step response indicated by a calculation result when N is 0.05 has converged at the point of 10.4 sec. These calculation results show that, when the cutoff frequency ωaoc2 is set to 16 kHz and the cutoff frequency fac is set to 1.6 MHz, a target value of the cutoff frequency should be set to 8 MHz in feedback control at a high speed by the feedback circuit 16. In feedback control at a low speed by the feedback circuit 16, the target value of the cutoff frequency should be set to 80 kHz.

The voltage Vs2 for generating the threshold Vth1 and the voltage Vs4 for generating the threshold Vth2 may be set to a value lower than the maximum value that enables a circuit inside the transimpedance amplifier 11 to linearly amplify a signal without saturating the signal. There may be a case where a burst optical signal having a low signal strength lower than a threshold is input, and the state of the feedback control by the feedback circuit 16 is maintained in a low-speed state. Even in this case, the DC offset is removed within the settling time in input to the limiting amplifier 12 by an AC coupling effect between the transimpedance amplifier 11 and the limiting amplifier 12.

Figure 12:
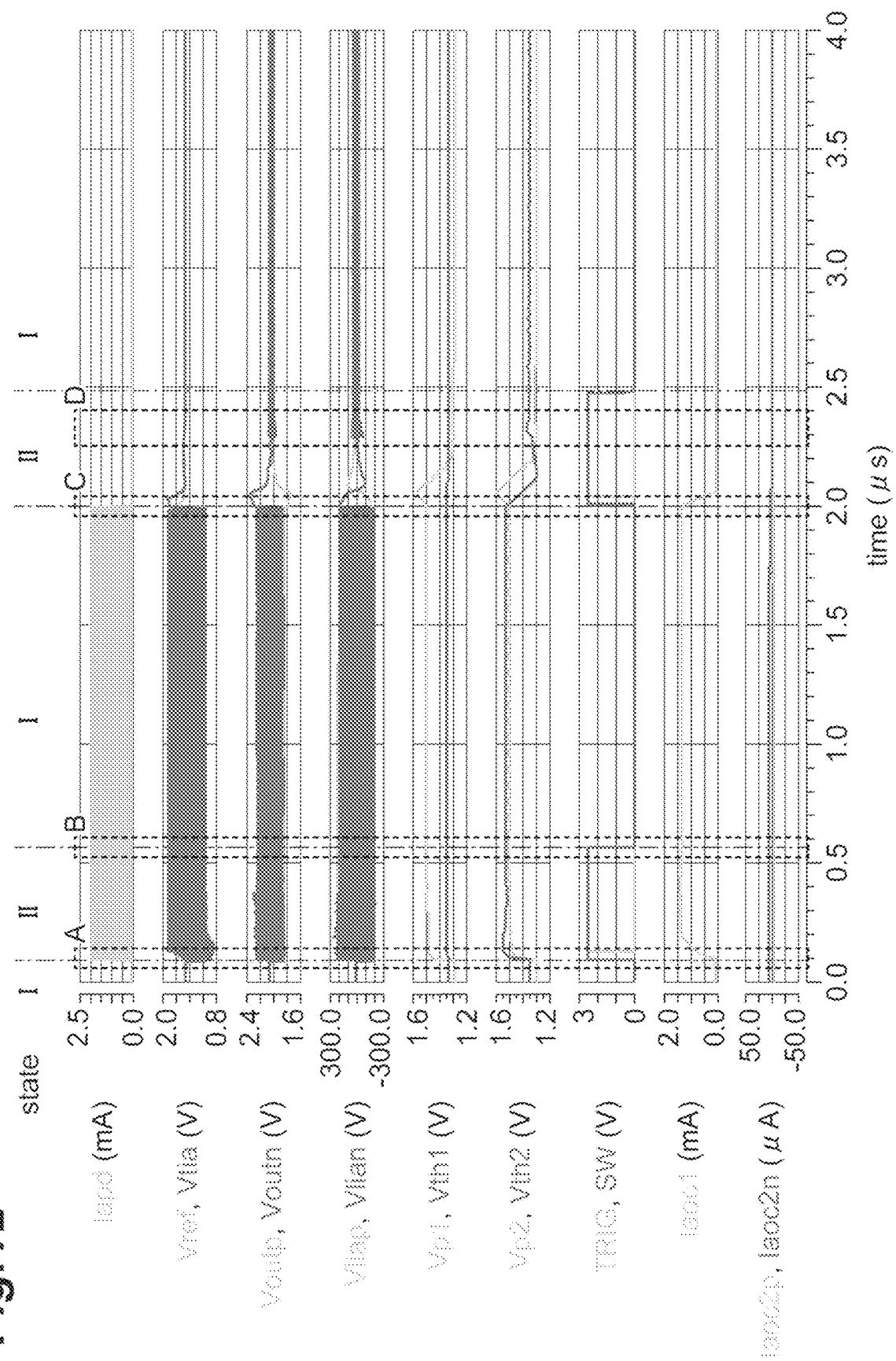
FIG. 12 shows timing charts illustrating a simulation result.
Figure 17:
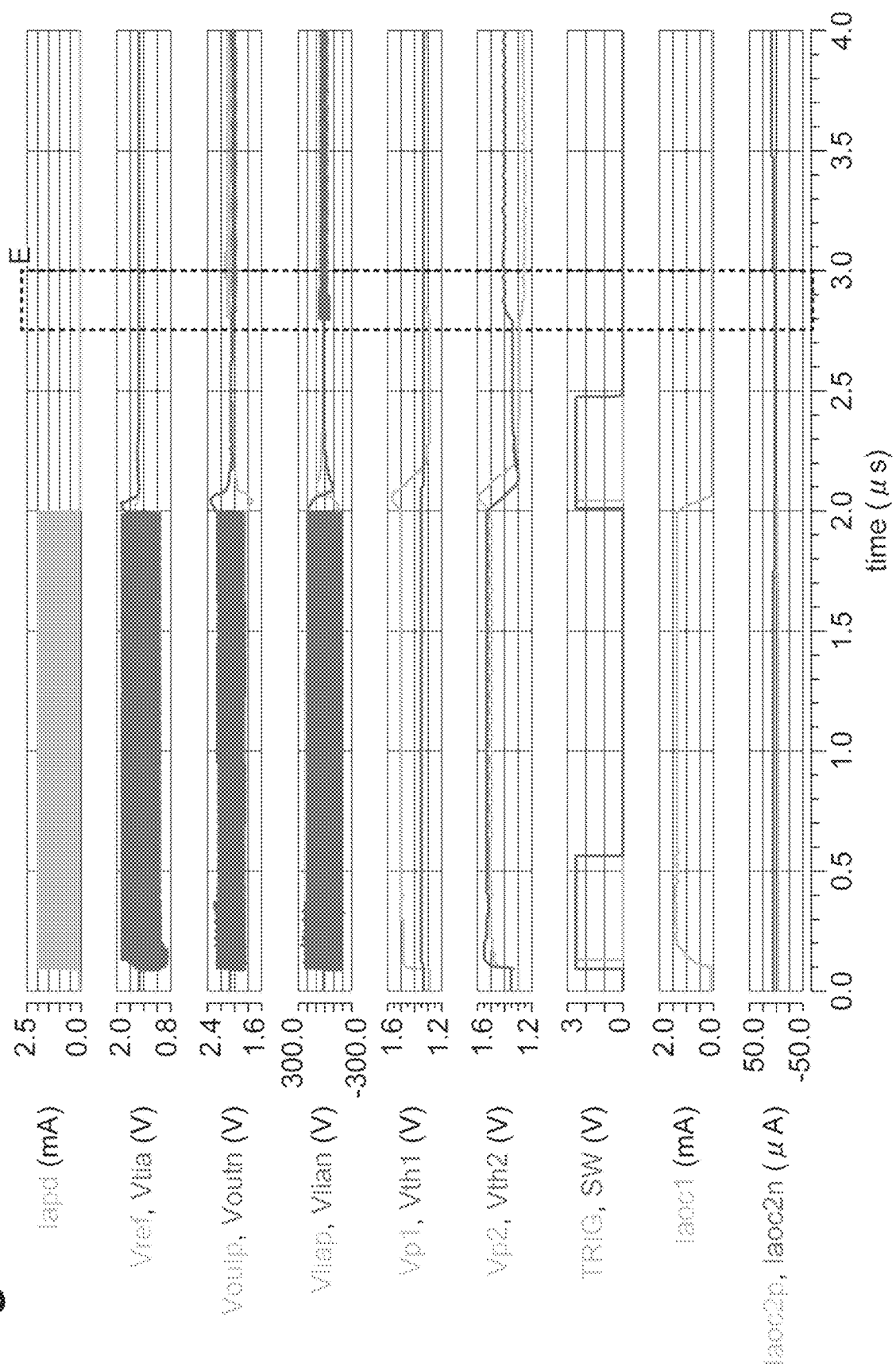
FIG. 17 shows timing charts illustrating another simulation result.
Figure 18:
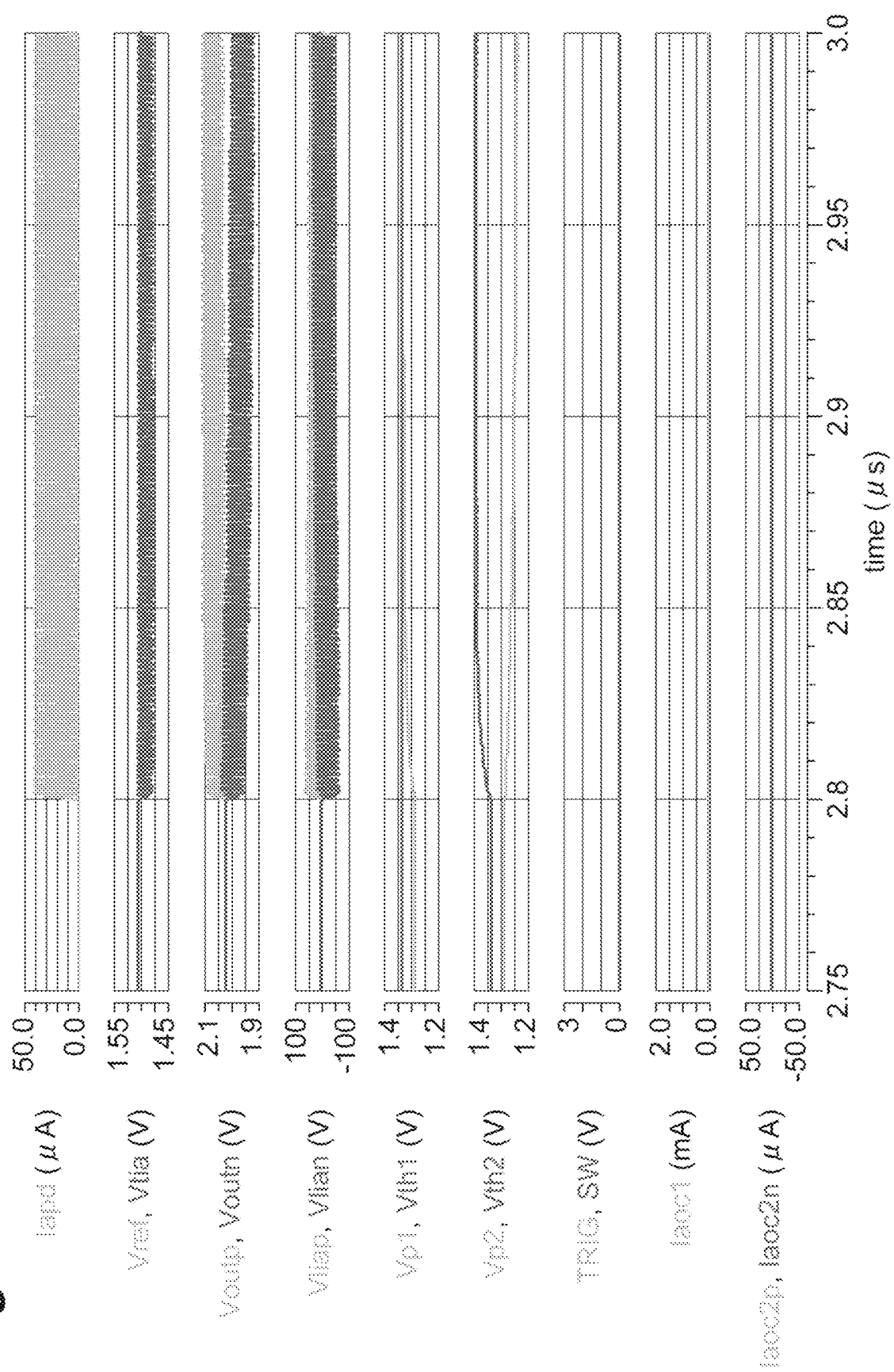
FIG. 18 is a partially enlarged view of the simulation result illustrated in FIG. 17.

Next, effects of the transimpedance amplifier 11 will be described with reference to FIGS. 12 to 18. FIG. 12 shows timing charts illustrating a simulation result. FIGS. 13 to 16 are partially enlarged views of the simulation result illustrated in FIG. 12. FIG. 17 shows timing charts illustrating another simulation result. FIG. 18 is a partially enlarged view of the simulation result illustrated in FIG. 17.

FIG. 12 illustrates timing charts of each current value and each voltage value and the state of feedback control by the feedback circuit 16. The simulation result is a calculation result when the cutoff frequency faoc2 is set to 16 kHz, the cutoff frequency fac is set to 1.6 MHz, a value obtained by subtracting the current value of the current Is1 from the current value of the current Ih1 is set to 20 μA, and a value obtained by subtracting the current value of the current Is2 from the current value of the current Ih2 is set to 20 μA. Further, in the calculation, the capacitances Ch1 and Ch2 are set to 10 pF, a value obtained by subtracting the current value of the current Is3 from the current value of the current Ih3 is set to 10 μA, a value obtained by subtracting the current value of the current Is4 from the current value of the current Ih4 is set to 10 μA, the capacitances Ch3 and Ch4 are set to 5 pF, the time constant τd1 is set to 50 nsec, the time constant τd2 is set to 500 nsec, and the voltages Vs2 and Vs4 are set to 50 mV.

FIGS. 12 to 18 illustrate state transitions of feedback control by the feedback circuit 16, and timing charts of the input current Iapd, the voltage signal Vtia and the reference voltage signal Vref, the positive-phase component Voutp and the negative-phase component Voutn, the positive-phase component Vliap and the negative-phase component Vlian, the peak value Vp1 and the threshold Vth1, the peak value Vp2 and the threshold Vth2, the signal TRIG and the switch signal SW, the bypass current Iaoc1, and the bypass currents Iaoc2p and Iaoc2n. In the simulation, first, a first burst optical signal having a strong signal strength is input when time t is 100 nsec, and the first burst optical signal ends when time t is 2 μsec. The mean value of the input current Iapd by the first burst optical signal is 1 mA. Then, when time t is 2.3 μsec, a second burst optical signal having a weak signal strength is input. The mean value of the input current Iapd by the second burst optical signal is 20 μA. An interval (interval period) between the first burst optical signal and the second burst optical signal is set to 300 nsec. The input current Iapd in accordance with the burst optical signal, which is a modulation signal, simulates a signal in which the identical digit is continued. In the present embodiment, the input current Iapd is a signal (repetitive signal) in which continuous positive (high-level) signals and continuous negative (low-level) signals are alternately repeated at a period of 10 nsec.

With the input of the first burst optical signal, the peak value Vp1 increases and exceeds the threshold Vth1. Accordingly, the start of the burst optical signal is detected, and the signal TRIG changes from a low level to a high level. The high-level signal TRIG is input to the switch signal generator circuit 35, and a high-level switch signal SW having a pulse width of approximately 500 nsec is thereby generated. At this time, the state of the feedback control by the feedback circuit 16 transitions from the state I to the state II, and the feedback circuit 16 performs the feedback control at a high speed. The bypass current Iaoc1 has sufficiently converged at approximately 200 nsec from the detection of the start of the burst optical signal. When time t is around 600 nsec, the state of the feedback control by the feedback circuit 16 continuously transitions from the state II to the state I. That is, before the first burst optical signal shifts from the preamble signal to the payload signal, the state of the feedback control by the feedback circuit 16 transitions from the state II to the state I.

When time t is 2 μsec, the first burst optical signal ends. Then, the amplitude (potential) of the positive-phase component Voutp of the differential signal Vout gradually decreases, and the amplitude (potential) of the negative-phase component Voutn gradually increases. With the end of the burst optical signal, a modulation signal component disappears. Thus, the decrease in the amplitude of the positive-phase component Voutp and the increase in the amplitude of the negative-phase component Voutn occur due to the difference between a high-frequency gain and a low-frequency gain in the differential amplifier 17b by AC coupling. The peak value Vp1 is a result of detection corresponding to full-wave rectification of the differential signal Vout and thus follows variations in potential in the negative-phase component Voutn. The peak value Vp2 also changes with time in a manner similar to the peak value Vp1, and the potential of the threshold Vth2 changes with time in the decreasing direction. The end of the burst optical signal is detected upon detecting that the peak value Vp2 is larger than the threshold Vth2. Accordingly, the signal TRIG changes from a low level to a high level. The high-level signal TRIG is input to the switch signal generator circuit 35, and a high-level switch signal SW having a pulse width of approximately 500 nsec is thereby generated. At this time, the feedback control by the feedback circuit 16 transitions from the state I to the state II, and the feedback circuit 16 performs the feedback control at a high speed. The bypass current Iaoc1 has sufficiently converged at approximately 200 nsec from the detection of the end of the burst optical signal. When time t is around 2.5 μsec, the state of the feedback control by the feedback circuit 16 continuously transitions from the state II to the state I.

When time t is 2.3 μsec, the second burst optical signal is started. At this time, the feedback control by the feedback circuit 16 is in the state II due to the influence of the state transition of the feedback control caused by the end of the first burst optical signal. The feedback control by the feedback circuit 16 is started in a high-speed control state. However, the residual DC offset of the voltage signal Vtia (differential signal Vout) is sufficiently removed before the feedback control is started.

Figure 13:
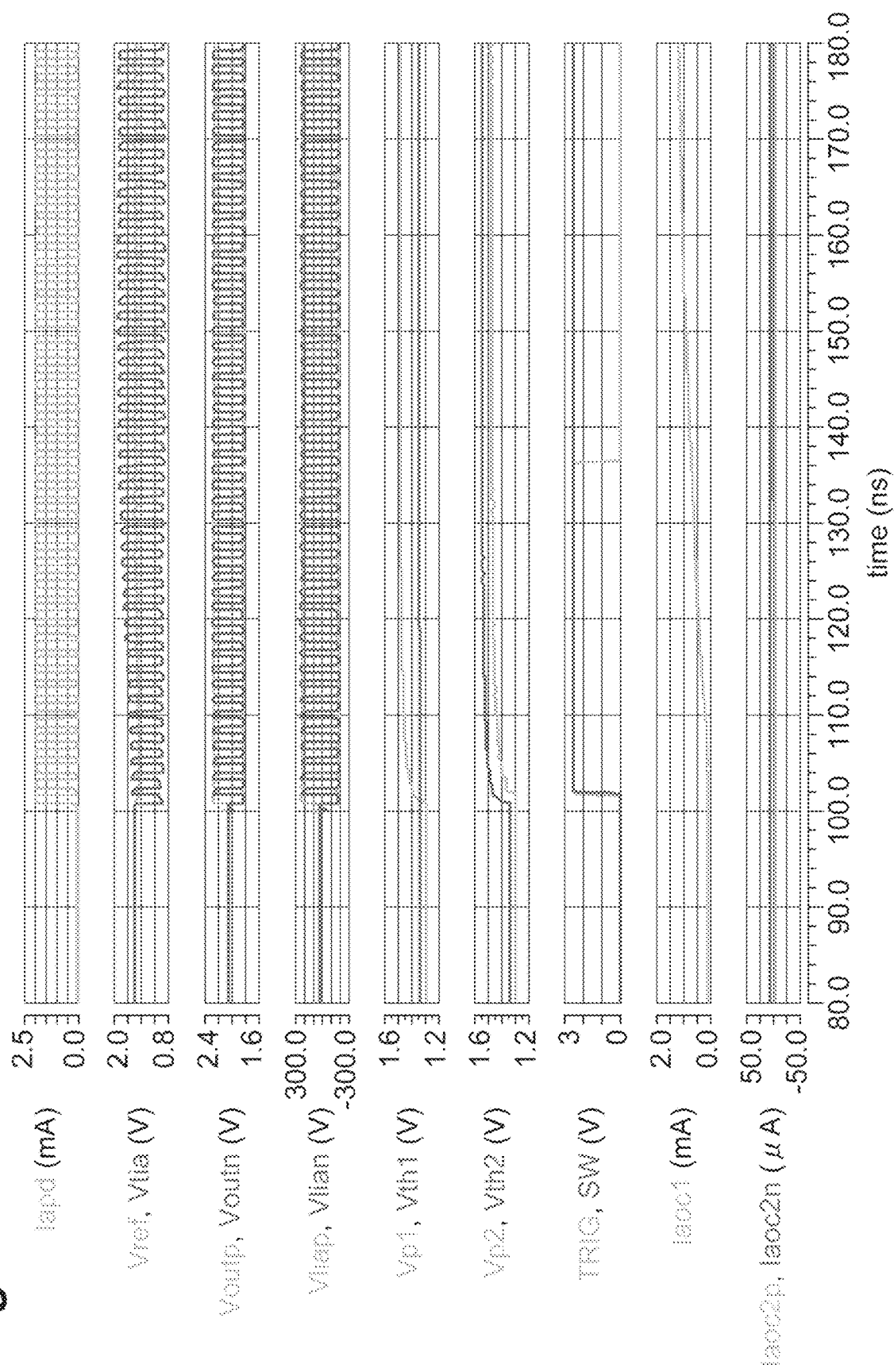
FIG. 13 is a partially enlarged view of the simulation result illustrated in FIG. 12.

FIG. 13 is an enlarged view (timing chart) of A part of FIG. 12. FIG. 13 illustrates timing charts of the current values and the like when time t is around 0.1 μsec. With the input of the first burst optical signal, the peak value Vp1 increases and exceeds the threshold Vth1. Accordingly, the switch signal SW (signal TRIG) changes from a low level to a high level. Immediately after the start of the first burst optical signal, the mean value of the voltage signal Vtia is lower than the reference voltage signal Vref. Then, when drawing of the DC component of the input current Iapd is started by the feedback control by the feedback circuit 16, the mean value of the voltage signal Vtia starts increasing. Then, the feedback control is performed so that the mean value of the voltage signal Vtia gradually becomes equal to the value of the reference voltage signal Vref. During this, the bypass currents Iaoc2p and Iaoc2n hardly change due to a long time constant.

Figure 14:
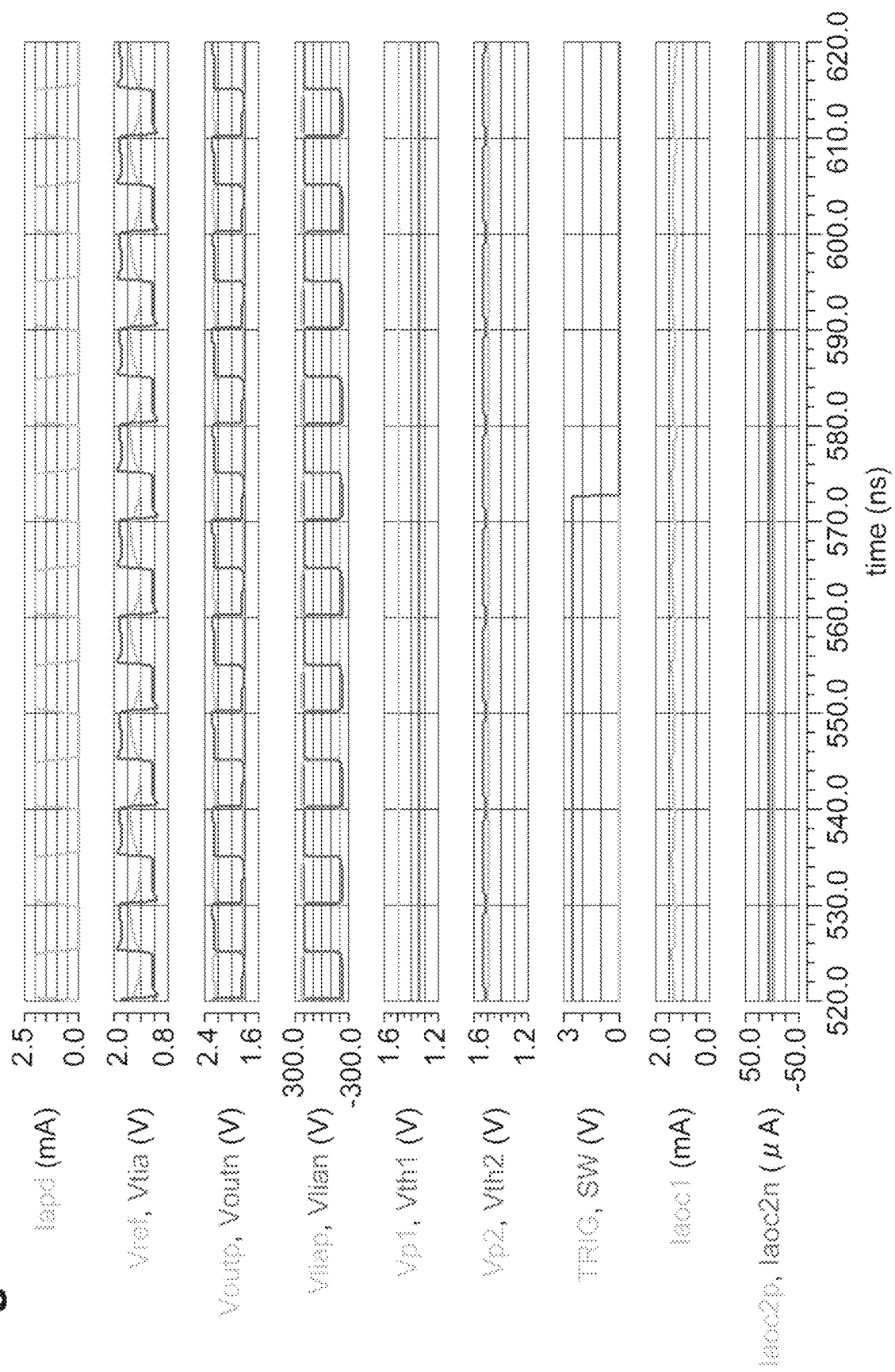
FIG. 14 is a partially enlarged view of the simulation result illustrated in FIG. 12.

FIG. 14 is an enlarged view (timing chart) of B part of FIG. 12. FIG. 14 illustrates timing charts of the current values and the like when time t is around 0.57 μsec. FIG. 14 shows the influence of the repetitive signal in which the identical digit is continued on the voltage across the capacitor in the differential peak-hold circuit 36 and the like. When time t is around 572 nsec, the switch signal SW transitions from a high level to a low level, and the feedback control by the feedback circuit 16 transitions from the state II to the state I. At this time, there is no particular disturbance in the bypass current Iaoc1 generated by the feedback circuit 16. The peak value Vp1 and the threshold Vth1 are voltages obtained by full-wave rectifying the differential signal Vout. Thus, there is no noise caused by the repetitive signal in the peak value Vp1 and the threshold Vth1. On the other hand, the peak value Vp2 and the threshold Vth2 are voltages obtained by half-wave rectifying the differential signal Vout, and a short discharge time constant is set in the single-phase peak-hold circuit 38 and the threshold generator circuit 39. Thus, the voltage value slightly varies by the repetitive signal. Erroneous detection (malfunction) caused by the slight variation is prevented by the hysteresis characteristic of the comparator circuits 32a and 32b of the detector circuit 19.

Figure 15:
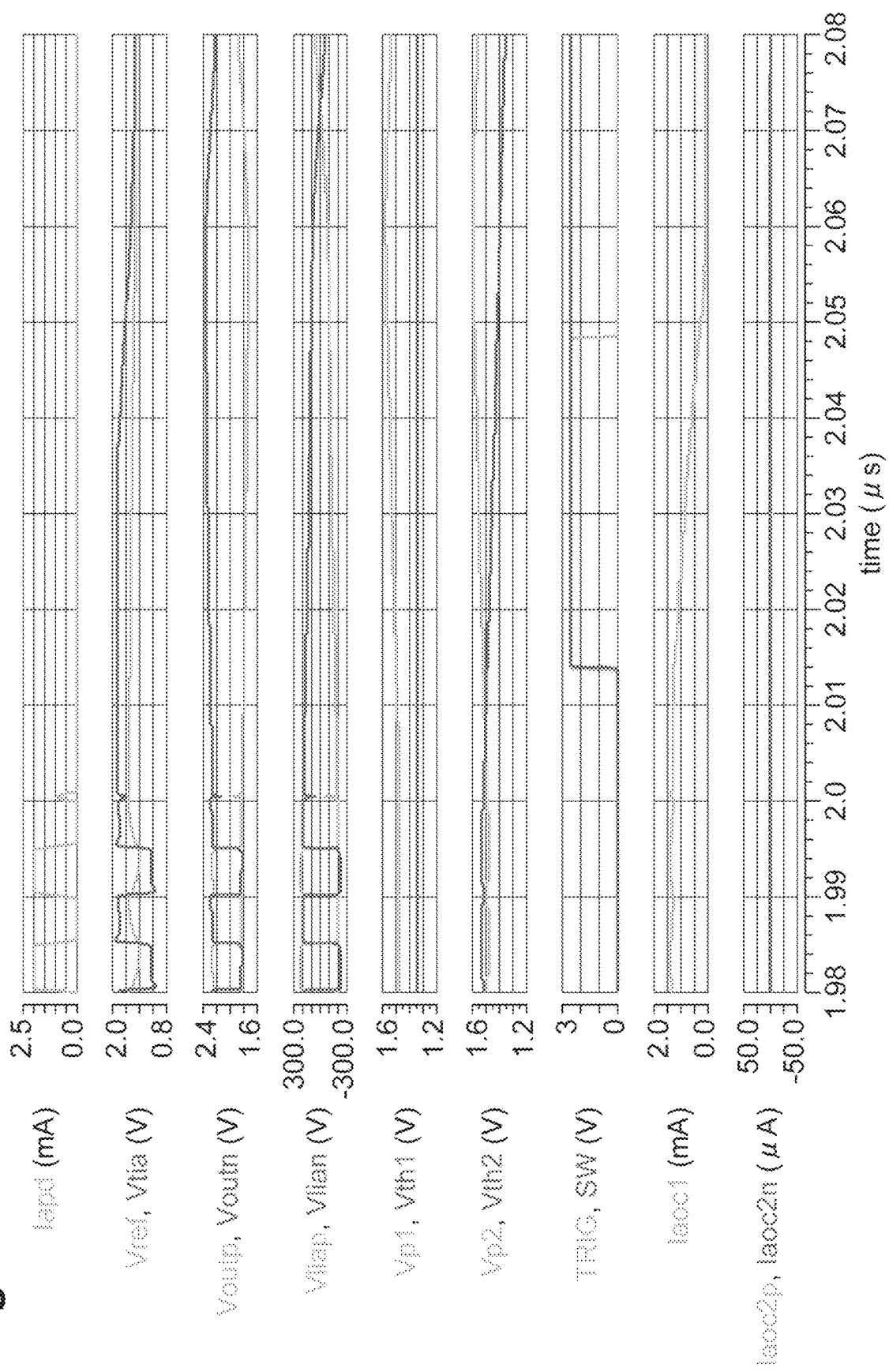
FIG. 15 is a partially enlarged view of the simulation result illustrated in FIG. 12.

FIG. 15 is an enlarged view (timing chart) of C part of FIG. 12. FIG. 15 illustrates timing charts of the current values and the like when time t is around 2.0 μsec. When time t is 2.0 μsec, the first burst optical signal ends. The current value of the input current Iapd becomes substantially equal to zero by the end of the first burst optical signal. Thus, the voltage signal Vtia decreases from a high amplitude. An amplitude limitation is applied to the voltage signal Vtia in the differential amplifier circuit 17. Thus, the positive-phase component Voutp changes from a low level, and the negative-phase component Voutn changes from a high level. The amplitude (potential) of the positive-phase component Voutp gradually decreases, and the amplitude (potential) of the negative-phase component Voutn gradually increases. The changes are caused by disappearance of the modulation signal component in the input current Iapd along with the end of the burst optical signal and occur due to the difference between the high-frequency gain and the low-frequency gain in the differential amplifier 17b. The changes in amplitude of the positive-phase component Voutp and the negative-phase component Voutn slow down by reducing the cutoff frequency fac by AC coupling. Even when the changes slow down, since a burst end condition occurs by the decrease in the amplitude of the positive-phase component Voutp along with the end of the burst optical signal, the threshold Vth2 is not largely affected by the cutoff frequency fac. Around the time after an elapse of 14 nsec from the end of the burst optical signal, the peak value Vp2 becomes larger than the threshold Vth2. Accordingly, the end of the burst optical signal is detected, and the switch signal SW (signal TRIG)

changes from a low level to a high level. Accordingly, the feedback control by the feedback circuit 16 is switched from the low-speed control (state I) to the high-speed control (state II). With the switch, time responses in the bypass current Iaoc1 and the voltage signal Vtia are fast, and the positive-phase component Voutp and the negative-phase component Voutn then converge.

Figure 16:
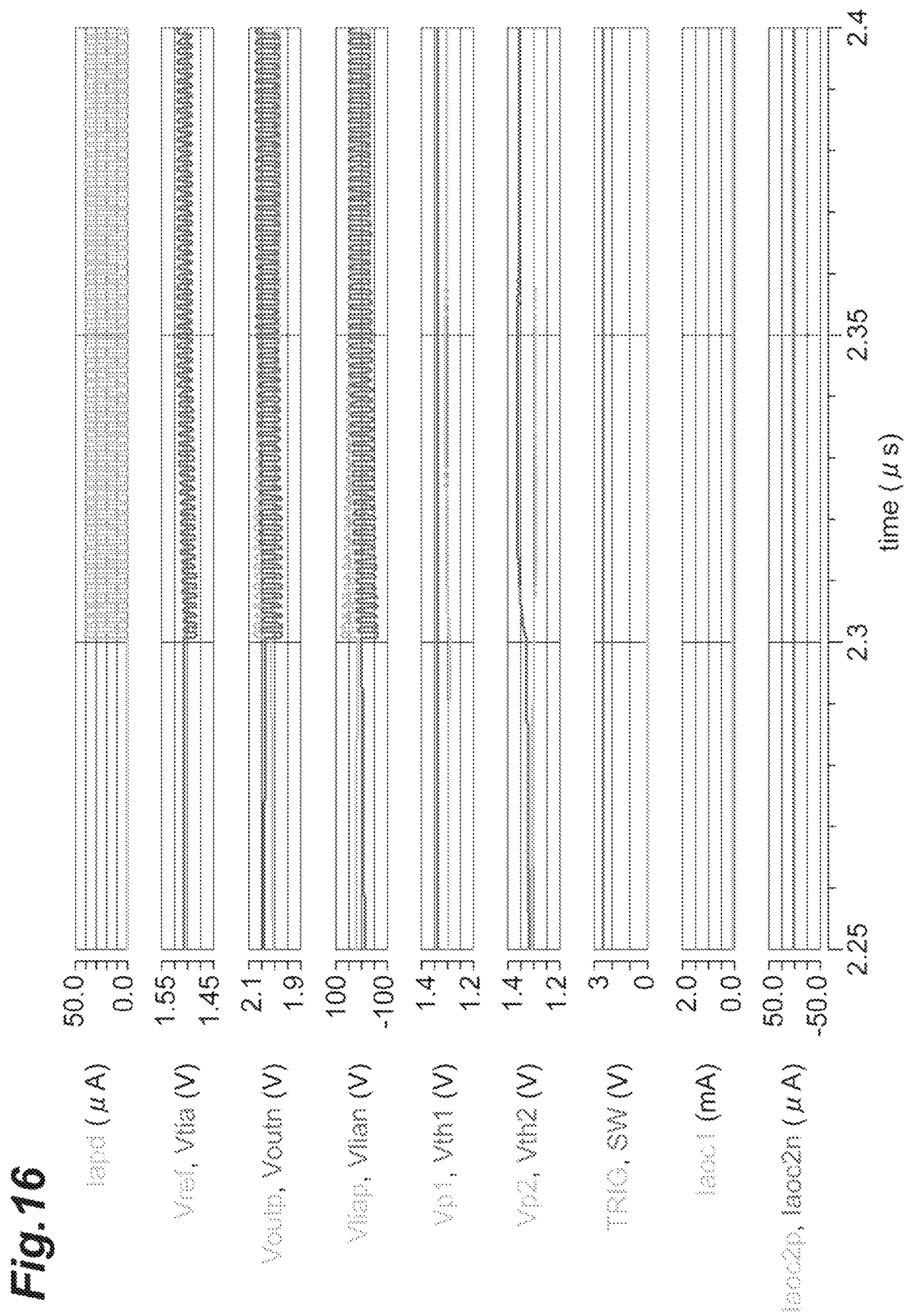
FIG. 16 is a partially enlarged view of the simulation result illustrated in FIG. 12.

FIG. 16 is an enlarged view (timing chart) of D part of FIG. 12. FIG. 16 illustrates timing charts of the current values and the like when time t is around 2.3 μsec. When time t is 2.3 μsec, the second burst optical signal is input. Before the input of the second burst optical signal, the residual DC offset between the positive-phase component Voutp and the negative-phase component Voutn has sufficiently converged (removed). Since the strength of the second burst optical signal is weak, the peak value Vp1 does not become larger than the threshold Vth1, and no state transition of the feedback control by the feedback circuit 16 occurs. Even when the strength of the signal is weak, a DC offset occurs in the transimpedance amplifier 11 by the second burst optical signal. However, since the feedback control by the feedback circuit 16 is maintained in the state II by the state transition caused by the end of the first burst optical signal, the feedback circuit 16 starts feedback control in a high-speed control state. Thus, the DC offset between the positive-phase component Voutp and the negative-phase component Voutn is immediately eliminated by the feedback control in a high-speed state by the feedback circuit 16. The positive-phase component Vliap and the negative-phase component Vlian substantially follow responses of the positive-phase component Voutp and the negative-phase component Voutn.

Setting of another simulation result illustrated in FIG. 17 differs from the setting of the simulation result illustrated in FIG. 12 mainly in the timing of inputting the second burst optical signal. In the simulation, when time t is 2.8 μsec, the second burst optical signal is input. Time responses in each voltage value and the like caused by the input of the first burst optical signal are similar to those in the simulation result illustrated in FIG. 12. Thus, description thereof will be omitted. FIG. 18 is an enlarged view (timing chart) of E part of FIG. 17. FIG. 18 illustrates timing charts of the current values and the like when time t is around 2.8 μsec. The second burst optical signal is input at the timing when there is no influence of a switch of the feedback control by the feedback circuit 16 caused by the end of the first burst optical signal. Since the strength of the second burst optical signal is weak, the peak value Vp1 does not become larger than the threshold Vth1, and no state transition of the feedback control by the feedback circuit 16 occurs. Even when the strength of the signal is weak, a DC offset occurs in the transimpedance amplifier 11 by the second burst optical signal. Differently from the simulation result illustrated in FIG. 12, the second burst optical signal is input when the feedback control by the feedback circuit 16 is in the state I (low-speed control state). Thus, the DC offset between the positive-phase component Voutp and the negative-phase component Voutn does not immediately converge. On the other hand, since the cutoff frequency fac is set to 1.6 MHz, a DC offset is removed within the settling time in the positive-phase component Vliap and the negative-phase component Vlian. Since the strength of the second burst optical signal is weak, no saturation of the signal occurs in the transimpedance amplifier 11. Thus, a duty distortion is reduced in the differential signal Vout.

As described above, in the transimpedance amplifier 11, in response to the end of the burst optical signal being detected based on the peak value Vp3 of the positive-phase component Voutp and the peak value Vp2 of the negative-phase component Voutn, the time constant of the feedback circuit 16 is switched from the time constant τ1 to the time constant τ2 which is smaller than the time constant τ1. While the burst optical signal is input, the current signal Iin which is obtained by subtracting the bypass current Iaoc1 from the input current Iapd in accordance with the burst optical signal is input to the TIA core 14. The differential amplifier circuit 17 generates the differential signal Vout including the positive-phase component Voutp and the negative-phase component Voutn in accordance with the difference between the voltage signal Vtia converted by the TIA core 14 and the reference voltage signal Vref. The burst optical signal includes both high-level and low-level signals. Thus, while the burst optical signal is input, each of the peak value Vp2 and the peak value Vp3 is maintained substantially constant, and the difference between the peak value Vp2 and the peak value Vp3 is substantially constant.

On the other hand, immediately after the end of the burst optical signal, the DC bypass current Iaoc1 generated by the feedback circuit 16 is left, and the residual bypass current Iaoc1 becomes the input signal of the TIA core 14. Thus, after the end of the burst optical signal, a state in which the voltage value of the negative-phase component Voutn is higher than the voltage value of the positive-phase component Voutp is continued. The detector circuit 19 detects the peak values Vp2 and Vp3 in accordance with charging voltages of the capacitors 58 and 63 respectively corresponding to the negative-phase component Voutn and the positive-phase component Voutp. When the state in which the voltage value of the negative-phase component Voutn is higher than the voltage value of the positive-phase component Voutp is continued, the difference between the peak value Vp2 and the peak value Vp3 becomes larger than the difference while the burst optical signal is input. Thus, since the difference between the peak value Vp2 and the peak value Vp3 changes with the end of the burst optical signal, it is possible to detect the end of the burst optical signal based on the peak value Vp2 and the peak value Vp3. Accordingly, the time constant of the feedback circuit 16 is switched to the time constant τ2 which is smaller than the time constant τ1 immediately after the end of the burst optical signal, which reduces the time required for the feedback circuit 16 to return to the initial state. As a result, it is possible to shorten the interval period from the end of one burst optical signal to the start of the next burst optical signal.

The peak value Vp2 increases immediately after the end of the burst optical signal. The end of the burst optical signal can be detected immediately after the end of the burst optical signal by setting the threshold Vth2 so that the peak value Vp2 becomes larger than the threshold Vth2 corresponding to the peak value Vp3 immediately after the end of the burst optical signal.

In response to the start of the burst optical signal being detected based on the peak value Vp1 and the mean value Vave of the differential signal Vout, the time constant of the feedback circuit 16 is switched from the time constant τ1 to the time constant τ2 which is smaller than the time constant τ1. As a result, it is possible to shorten the time required for the value of the bypass current Iaoc1 to converge from the start of the burst optical signal.

The peak value Vp1 increases immediately after input of the burst optical signal. The start of the burst optical signal can be detected immediately after the start of the burst optical signal by setting the threshold Vth1 so that the peak value Vp1 becomes larger than the threshold Vth1 corresponding to the mean value Vave immediately after the start of the burst optical signal.

A period during which the time constant of the feedback circuit 16 is maintained at the time constant τ2 is shorter than the period Ts of the preamble signal. As a result, the time constant of the feedback circuit 16 is returned to the time constant τ1 from the time constant τ2 before the input of the preamble signal is finished, and it is possible to maintain the consecutive identical digits tolerance while the payload signal is input.

The feedback circuit 18 removes the DC offset that occurs in the differential amplifier circuit 17 from the differential signal Vout. As a result, the peak values Vp1, Vp2, and Vp3 and the mean value Vave for detecting the start and the end of the burst optical signal are accurately detected. Thus, it is possible to accurately detect the end and the start of the burst optical signal.

The receiver 9 provided with the transimpedance amplifier 11 is capable of receiving the payload signal of the burst optical signal without a strong limitation by the strength of the burst optical signal and the mutual relationship between burst optical signals (the length of the interval period). Further, in the TIA core 14, the DC component included in the input current Iapd is reduced. Thus, the gain of the TIA core 14 is increased, which makes it possible to increase a receiving sensitivity of the transimpedance amplifier 11 (receiver 9). Due to the increase in the receiving sensitivity, even when the signal is saturated inside the transimpedance amplifier 11, a change in the duty ratio of the signal is reduced. Since the interval period is shortened, the communication efficiency can be improved.

Figure 19:
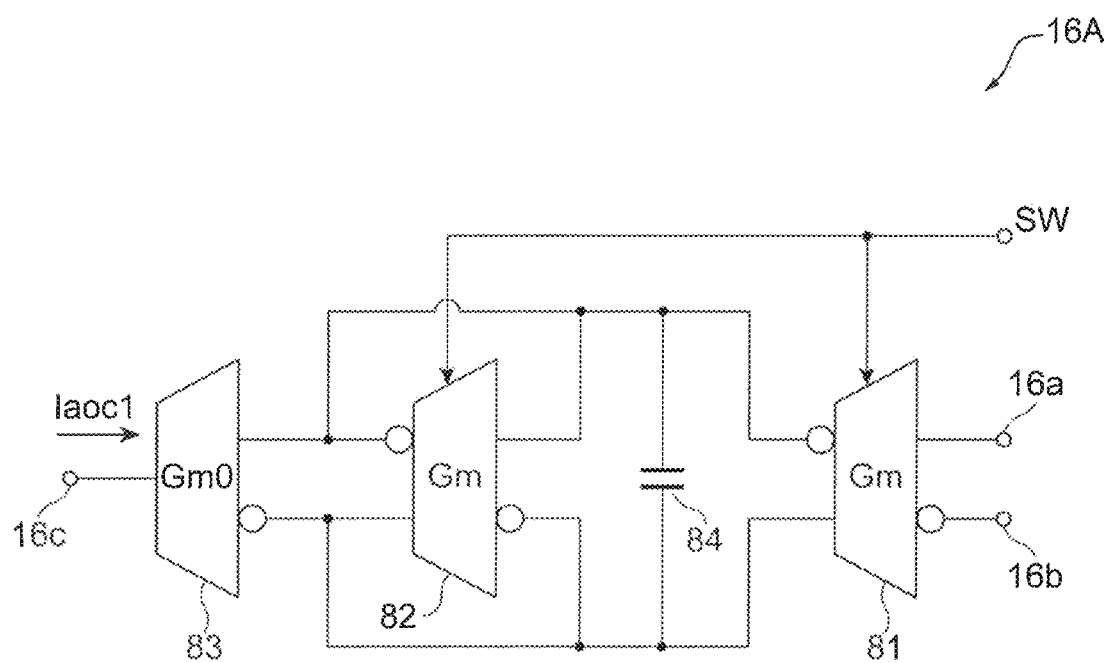
FIG. 19 is a circuit diagram illustrating a feedback circuit included in a transimpedance amplifier according to a modification.

FIG. 19 is a circuit diagram illustrating a feedback circuit included in a transimpedance amplifier according to a modification. The transimpedance amplifier according to the modification differs from the transimpedance amplifier 11 mainly in that a feedback circuit 16A is provided instead of the feedback circuit 16. As illustrated in FIG. 19, the feedback circuit 16A (first feedback circuit) included in the transimpedance amplifier according to the modification is provided with OTAs 81, 82, and 83 and a capacitor 84. The feedback circuit 16A generates a bypass current Iaoc1 in accordance with the difference between a voltage signal Vtia and a reference voltage signal Vref in a manner similar to the feedback circuit 16. The feedback circuit 16A generates a current signal Iin by subtracting the bypass current Iaoc1 from an input current Iapd. The reference voltage signal Vref is input to an input terminal 16a of the feedback circuit 16A. The voltage signal Vtia is input to an input terminal 16b of the feedback circuit 16A. A positive-phase input terminal of the OTA 81 is connected to the input terminal 16a, and a negative-phase input terminal of the OTA 81 is connected to the input terminal 16b. A negative-phase output terminal of the OTA 81, one end of the capacitor 84, a positive-phase input terminal of the OTA 82, and a positive-phase input terminal of the OTA 83 (a negative-phase output terminal of the OTA 82) are connected to each other. A positive-phase output terminal of the OTA 81, the other end of the capacitor 84, a negative-phase input terminal of the OTA 82, and a negative-phase input terminal of the OTA 83 (a positive-phase output terminal of the OTA 82) are connected to each other. The capacitor 84 has a capacitance C2.

The OTA 81 has a transconductance Gm. An ideal input/output impedance of the OTA 81 is infinite. As represented by Formulae (4) and (5), an output differential current obtained by multiplying an input differential voltage by half the transconductance Gm flows through a differential output terminal of the OTA 81. In Formulae (4) and (5), a voltage Vinp corresponds to the reference voltage signal Vref, and a voltage Vinn corresponds to the voltage signal Vtia. The input differential voltage is obtained by subtracting the voltage signal Vtia from the reference voltage signal Vref. When the input differential voltage is a positive value, a current Ioutp flows from the positive-phase output terminal of the OTA 81 to the outside, and a current Ioutn flows from the outside to the negative-phase output terminal of the OTA 81. On the other hand, when the input differential voltage is a negative value, the current Ioutp flows from the outside to the positive-phase output terminal of the OTA 81, and the current Ioutn flows from the negative-phase output terminal of the OTA 81 to the outside.

[Formula 4]

$$Ioutp = Gm/2 \times (Vinp - Vinm) \quad (4)$$

[Formula 5]

$$Ioutn = -Gm/2 \times (Vinp - Vinm) \quad (5)$$

The OTA 82 has a transconductance Gm as with the OTA 81. The positive-phase input terminal of the OTA 82 is connected to the negative-phase output terminal of the OTA 82, and the negative-phase input terminal of the OTA 82 is connected to the positive-phase output terminal of the OTA 82. That is, the input and output terminals of the OTA 82 are negative-feedback connected. Accordingly, the OTA 82 functions as a resistor equivalently having a resistance value (1/Gm). The OTA 83 is a single-ended operational transconductance amplifier as with the OTA 26 of the feedback circuit 16. A differential voltage (voltage across the capacitor 84) is input to the OTA 83, and the OTA 83 outputs an output current to the single output terminal 16c. The OTA 83 has a transconductance Gmo. A transfer function of the feedback circuit 16A is determined by the transconductances Gm, Gmo and the capacitance C2 of the capacitor 84 as represented by Formula (6). A current Iout corresponds to the bypass current Iaoc1, and a voltage Vin corresponds to the difference between the voltage signal Vtia and the reference voltage signal Vref.

[Formula 6]

$$\frac{Iout(s)}{Vin(s)} = \frac{Gmo}{1 + s\frac{2 \times C2}{Gm}} \quad (6)$$

A switch signal SW is input to the OTAs 81 and 82. The switch signal SW is output from the detector circuit 19. A value of the transconductance Gm of the OTAs 81 and 82 varies in accordance with a logical value of the switch signal SW. A change amount in the transconductance Gm of the OTA 81 in accordance with the logical value of the switch signal SW is set equal to that of the OTA 82. For example, when the switch signal SW is at a low level, the value of the transconductance Gm is set to a transconductance gm1. When the switch signal SW is at a high level, the value of the transconductance Gm is set to a transconductance (A×gm1). The constant A is larger than 1. In this manner, when the change amount in accordance with the logical value of the switch signal SW is equal between the OTAs 81 and 82, the DC gain of the feedback circuit 16A represented by Formula (6) does not change.

Time constants τ1 and τ2 which are values of the time constant of the feedback circuit 16A are determined as represented by Formulae (7), (8). When the switch signal SW is at a low level, the time constant of the feedback circuit 16A is the time constant τ1. When the switch signal SW is at a high level, the time constant of the feedback circuit 16A is the time constant τ2. In this manner, when the switch signal SW is at a high level, the time constant of the feedback circuit 16A is (1/A) times the time constant when the switch signal SW is at a low level, and the feedback circuit 16A performs feedback control at a high speed. The feedback circuit 16A may be provided with a single-ended OTA instead of the OTA 81. In this case, a switch of the time constant of the feedback circuit 16A may be performed in a manner similar to the above switch.

[Formula 7]
$$\tau1 = 2 \times \frac{C2}{gm1} \quad (7)$$

[Formula 8]
$$\tau2 = 2 \times \frac{C2}{A \times gm1} \quad (8)$$

The transimpedance amplifier provided with the feedback circuit 16A also achieves effects similar to the effects of the transimpedance amplifier 11.

Figure 20:
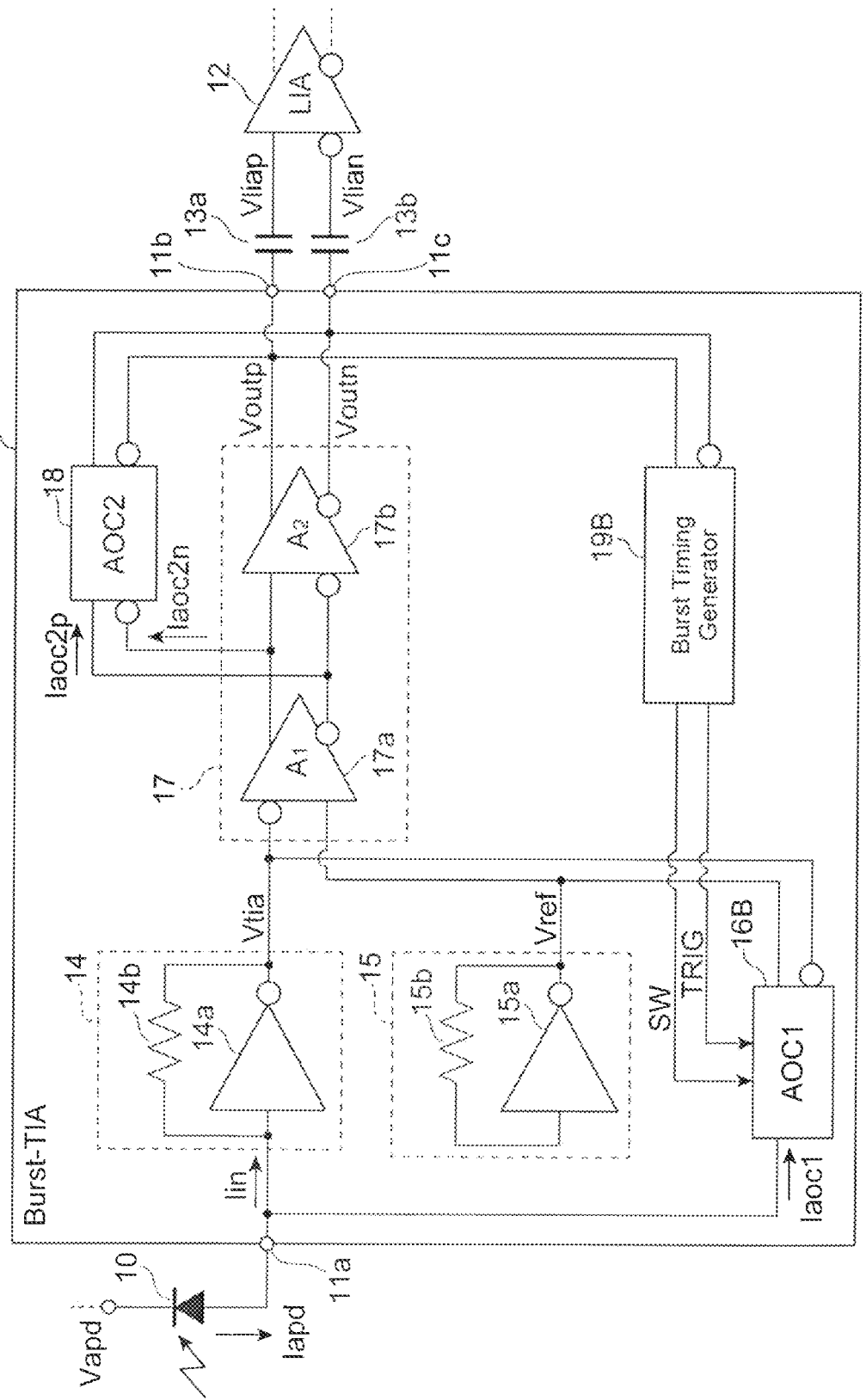
FIG. 20 is a circuit diagram illustrating a transimpedance amplifier according to another embodiment.
Figure 21:
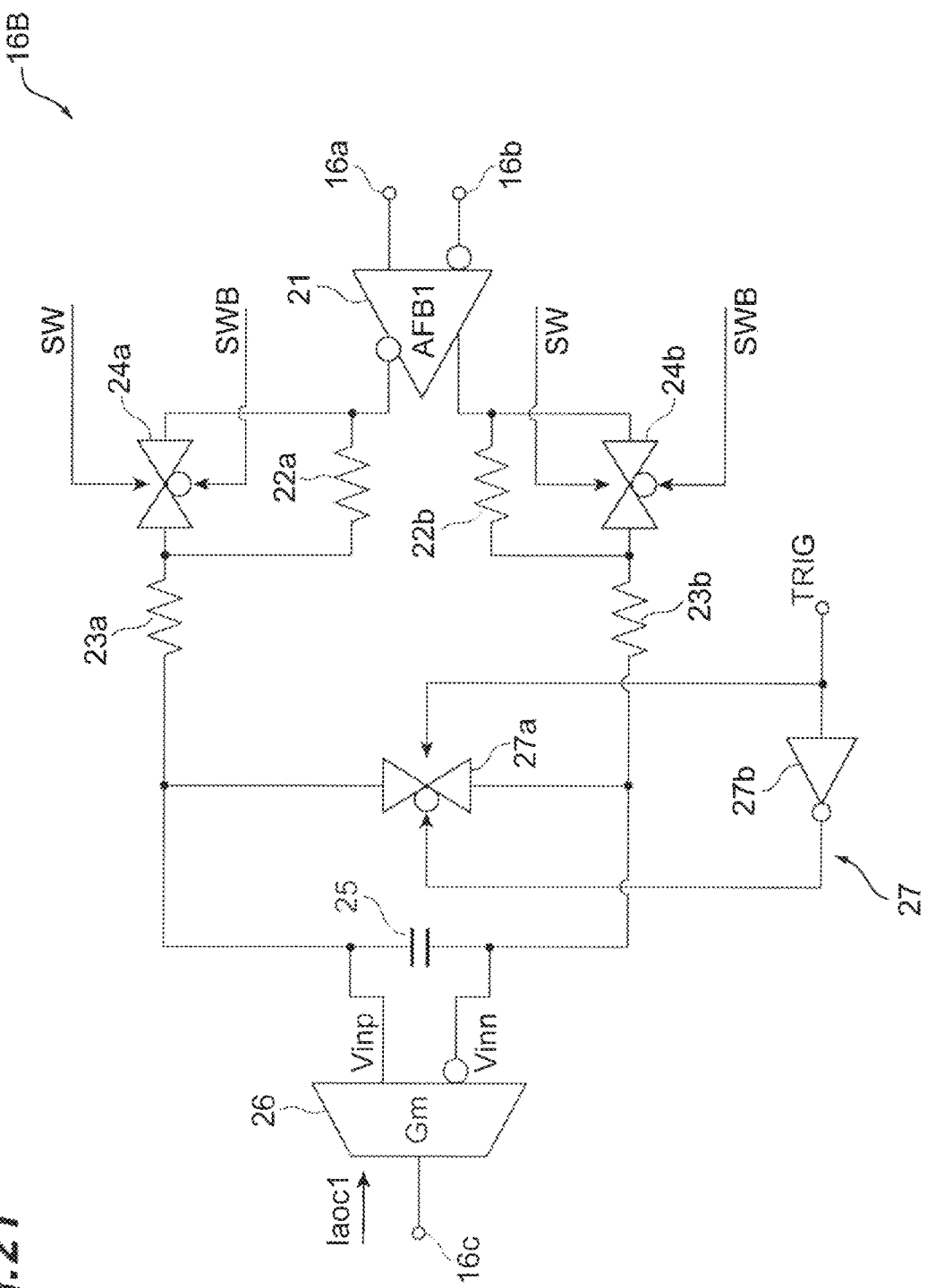
FIG. 21 is a diagram illustrating an example of a feedback circuit illustrated in FIG. 20.
Figure 22:
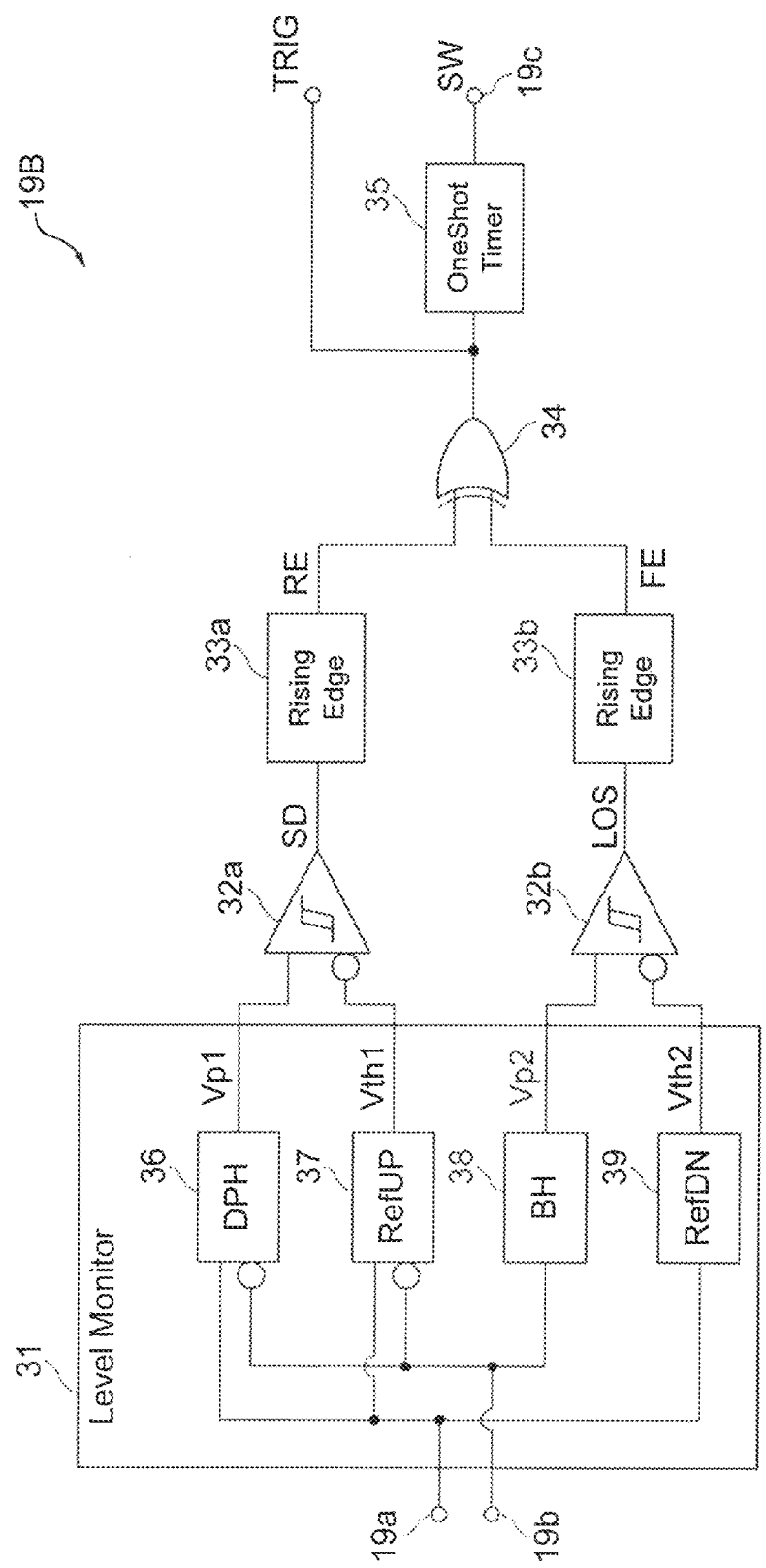
FIG. 22 is a circuit diagram illustrating a detector circuit illustrated in FIG. 20.

Next, a transimpedance amplifier 11B according to another embodiment will be described with reference to FIGS. 20 to 22. FIG. 20 is a circuit diagram illustrating the transimpedance amplifier according to another embodiment. FIG. 21 is a diagram illustrating an example of a feedback circuit illustrated in FIG. 20. FIG. 22 is a circuit diagram illustrating a detector circuit illustrated in FIG. 20. The transimpedance amplifier 11B illustrated in FIG. 20 differs from the transimpedance amplifier 11 mainly in that the transimpedance amplifier 11B is provided with a feedback circuit 16B (first feedback circuit) instead of the feedback circuit 16 and a detector circuit 19B instead of the detector circuit 19.

The feedback circuit 16B illustrated in FIG. 21 differs from the feedback circuit 16 illustrated in FIG. 4 mainly in that a signal TRIG is input in addition to the signal SW, and the feedback circuit 16B further includes a resetter 27. In the feedback circuit 16B, the resetter 27 is connected to both ends of a capacitor 25. The difference between a voltage Vinp and a voltage Vinn varies in accordance with a charging voltage of the capacitor 25 based on the difference between a voltage signal Vtia and a reference voltage signal Vref. Thus, a bypass current Iaoc1 is generated in accordance with the charging voltage of the capacitor 25.

The resetter 27 is a circuit that releases electric charge of the capacitor 25. The resetter 27 is provided with a switch 27a and an inverter circuit 27b. The signal TRIG is input to the resetter 27 from the detector circuit 19B. The switch 27a is connected in parallel to the capacitor 25. The switch 27a is, for example, a transfer gate switch. The inverter circuit 27b generates an inverted signal obtained by inverting a logical value of the signal TRIG and outputs the generated inverted signal to the switch 27a. The signal TRIG and the inverted signal obtained by inverting the logical value of the signal TRIG are input to the switch 27a. The switch 27a is controlled by the signal TRIG The switch 27a is switched to an open state or a closed state in accordance with the signal TRIG and the inverted signal. In the present embodiment, when the signal TRIG is at a high level, the switch 27a is maintained in a closed state. When the signal TRIG is at a low level, the switch 27a is maintained in an open state. When the switch 27a is in a closed state, the capacitor 25 and the switch 27a form a closed circuit and thereby the electric charge of the capacitor 25 is released. That is, in this case, the charging voltage of the capacitor 25 is reset. When the switch 27a is in an open state, the capacitor 25 is in a chargeable state.

The detector circuit 19B illustrated in FIG. 22 differs from the detector circuit 19 illustrated in FIG. 5 mainly in that the signal TRIG for resetting the charging voltage of the capacitor 25 is output to the feedback circuit 16B in addition to the switch signal SW for switching the time constant. That is, an XOR circuit 34 of the detector circuit 19B outputs the signal TRIG to a switch signal generator circuit 35 and the feedback circuit 16B. The signal TRIG is set to a low level in an initial state. That is, in the initial state, the capacitor 25 is set in a chargeable state in the feedback circuit 16B.

In response to detecting the start or the end of a burst optical signal, the detector circuit 19B switches the signal TRIG from a low level to a high level. Specifically, when a peak value Vp1 exceeds a threshold Vth1 or when a peak value Vp2 exceeds a threshold Vth2, the switch signal SW and the signal TRIG which are output from the detector circuit 19B are maintained in a high-level state. In the present embodiment, the detector circuit 19B continuously outputs the high-level signal TRIG to the feedback circuit 16B for a period shorter than a period during which the high-level switch signal SW is output. When the signal TRIG maintained at a high level is input to the feedback circuit 16B, the charging voltage of the capacitor 25 is reset in the feedback circuit 16B. Then, the detector circuit 19B switches the signal TRIG from a high level to a low level. Accordingly, the capacitor 25 is brought into a chargeable state in the feedback circuit 16B. A switch of the time constant of the feedback circuit 16B is performed in a manner similar to the feedback circuit 16. When the capacitor 25 returns to a chargeable state, the time constant of the feedback circuit 16B is set to a time constant τ2. Every time the detector circuit 19B detects the start or the end of the burst optical signal, the detector circuit 19B performs the operation of switching the signal TRIG. In this manner, in response to detecting the start or the end of the burst optical signal, the detector circuit 19B resets the charging voltage of the capacitor 25 by the operation of switching the signal TRIG.

Figure 23:
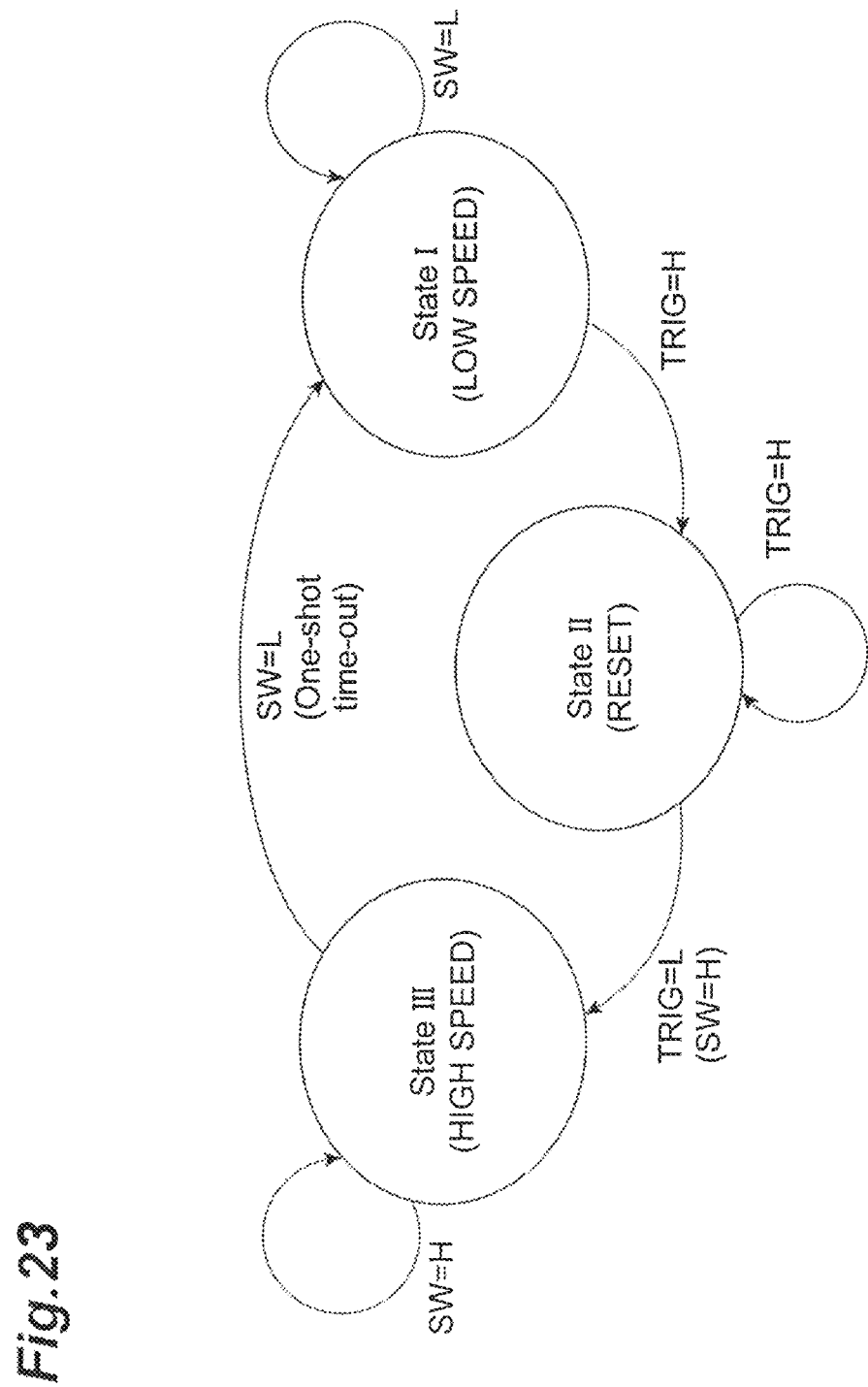
FIG. 23 is a state machine diagram illustrating a state transition of feedback control by the feedback circuit.

Next, a state transition of feedback control by the feedback circuit 16B will be described with reference to FIG. 23. FIG. 23 is a state machine diagram illustrating the state transition of the feedback control by the feedback circuit. The feedback control by the feedback circuit 16B includes a state I in which the feedback control is performed at a low speed, a state II in which the charging voltage of the capacitor 25 is reset, and a state III in which the feedback control is performed at a high speed. In the following description, for convenience of description, the feedback control by the feedback circuit 16B is merely referred to as the "feedback control". In the state I, the time constant of the feedback circuit 16B is set to the time constant τ1. In the state II, the charging voltage of the capacitor 25 is reset. In the state III, the time constant of the feedback circuit 16B is set to the time constant τ2. In an initial state in which the transimpedance amplifier 11B starts operating, the feedback control is in the state I. When no burst optical signal is input, the switch signal SW is at a low level. Thus, the state of the feedback control is maintained in the state I. When a burst optical signal is input to the receiver 9, the transimpedance amplifier 11B generates a differential signal Vout by converting a current signal Iin. When the detector circuit 19B detects that the peak value Vp1 has become larger than the threshold Vth1, the signal TRIG changes from a low level to a high level, and the state of the feedback control transitions from the state I to the state II. At this time, the switch signal generator circuit 35 starts operating by the change of the signal TRIG to a high level. As a result, the switch signal SW output from the detector circuit 19B (switch signal generator circuit 35) changes from a low level to a high level. When the feedback control transitions from the state I to the state II, electric charge stored in the capacitor 25 is released, and the feedback circuit 16B is reset to the initial state. While the signal TRIG is at a high level, the feedback control is maintained in the state II.

Then, when the signal TRIG changes from a high level to a low level, the state of the feedback control transitions from the state II to the state III. At this time, the time constant of the feedback circuit 16B is switched from the time constant τ1 to the time constant τ2. When the feedback control is in the state II, the switches 24a and 24b for switching the time constant of the feedback circuit 16B are in a closed state. While the switch signal SW is at a high level, the state of the feedback control is maintained in the state III. The time during which the feedback control is maintained in the state III is determined by a time constant τd2 of the switch signal generator circuit 35.

Immediately after the start of the burst optical signal, the current signal Iin includes a DC component. Thus, the feedback control is performed at a high speed so as to remove a DC offset (DC component) included in the voltage signal Vtia. When the switch signal SW changes from a high level to a low level, that is, when the switch signal generator circuit 35 times out, the state of the feedback control transitions from the state III to the state I. That is, the time constant of the feedback circuit 16B is switched from the time constant τ2 to the time constant τ1. While a payload signal of the burst optical signal is input, the state of the feedback control is maintained in the state I. That is, during the period of the payload signal, the time constant of the feedback circuit 16B is maintained at the time constant τ1.

When the burst optical signal ends, the current value of the input current Iapd output from the photodetector 10 rapidly becomes zero. At the instant when the burst optical signal ends, the state of the feedback control is maintained in the state I, and a residual DC offset which is the potential difference between DC components of the voltage signal Vtia and the reference voltage signal Vref increases. When the detector circuit 19B detects that the peak value Vp2 has become larger than the threshold Vth2, the signal TRIG changes from a low level to a high level, and the feedback control transitions from the state I to the state II. At this time, the switch signal generator circuit 35 starts operating by the change of the signal TRIG to a high level. As a result, the switch signal SW output from the detector circuit 19B (switch signal generator circuit 35) changes from a low level to a high level. When the feedback control transitions from the state I to the state II, electric charge stored in the capacitor 25 is released, and the feedback circuit 16B is reset to the initial state. Then, when the signal TRIG changes from a high level to a low level, the state of the feedback control transitions from the state II to the state III. That is, the time constant of the feedback circuit 16B is switched from the time constant τ1 to the time constant τ2. While the switch signal SW is at a high level, the state of the feedback control is maintained in the state III, and the feedback circuit 16B performs the feedback control at a high speed so as to remove the residual DC offset. When the switch signal SW changes from a high level to a low level, that is, when the switch signal generator circuit 35 times out, the state of the feedback control transitions from the state III to the state I. That is, the state of the feedback control returns to the initial state, and the feedback circuit 16B is brought into a standby state for receiving the next burst optical signal. In the present embodiment, a period during which the state of the feedback control is maintained in the state III after the end of the burst optical signal is equal to a period during which the state of the feedback control is maintained in the state III after the start of the burst optical signal.

Figure 24:
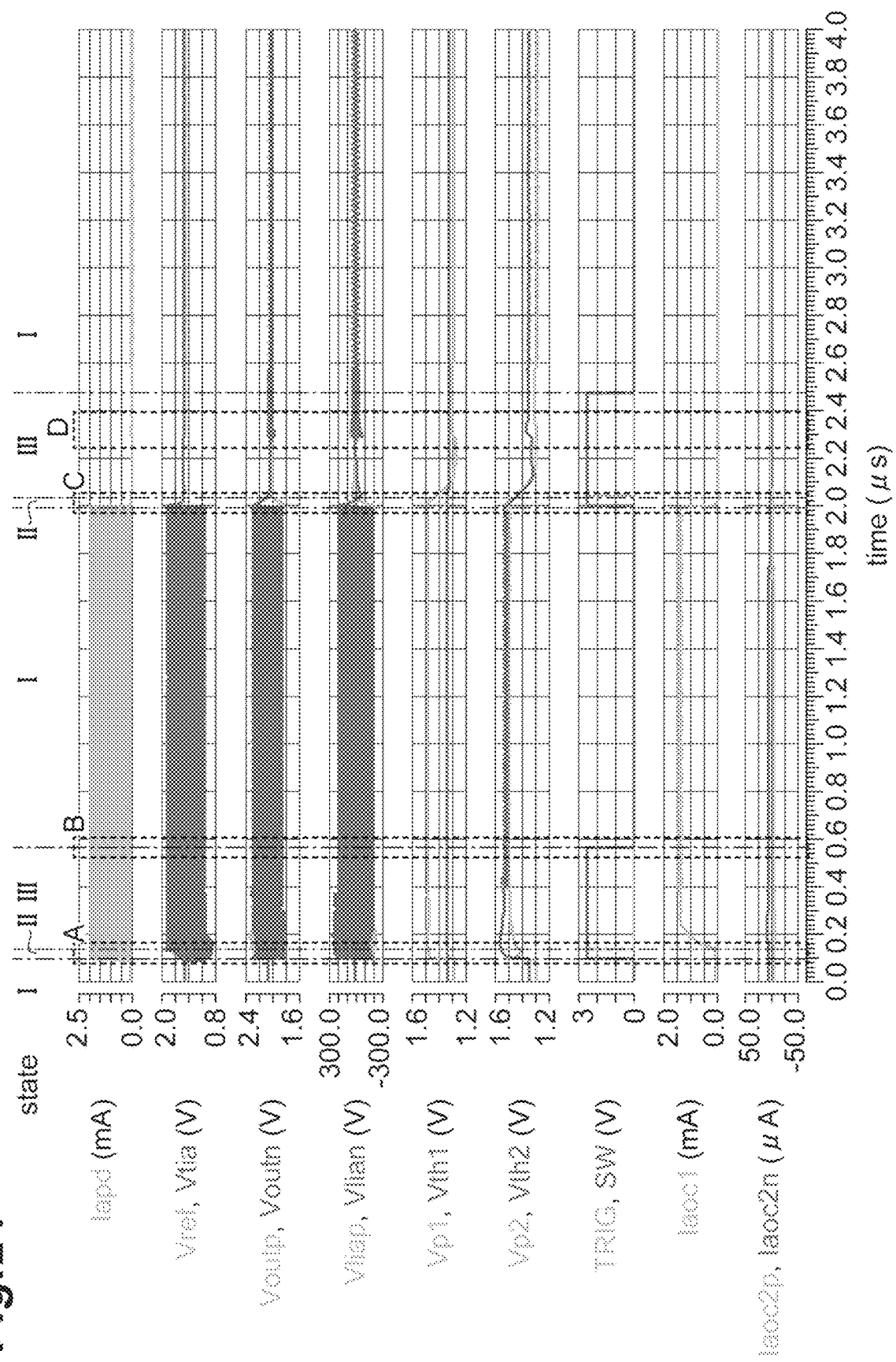
FIG. 24 shows timing charts illustrating a simulation result.
Figure 29:
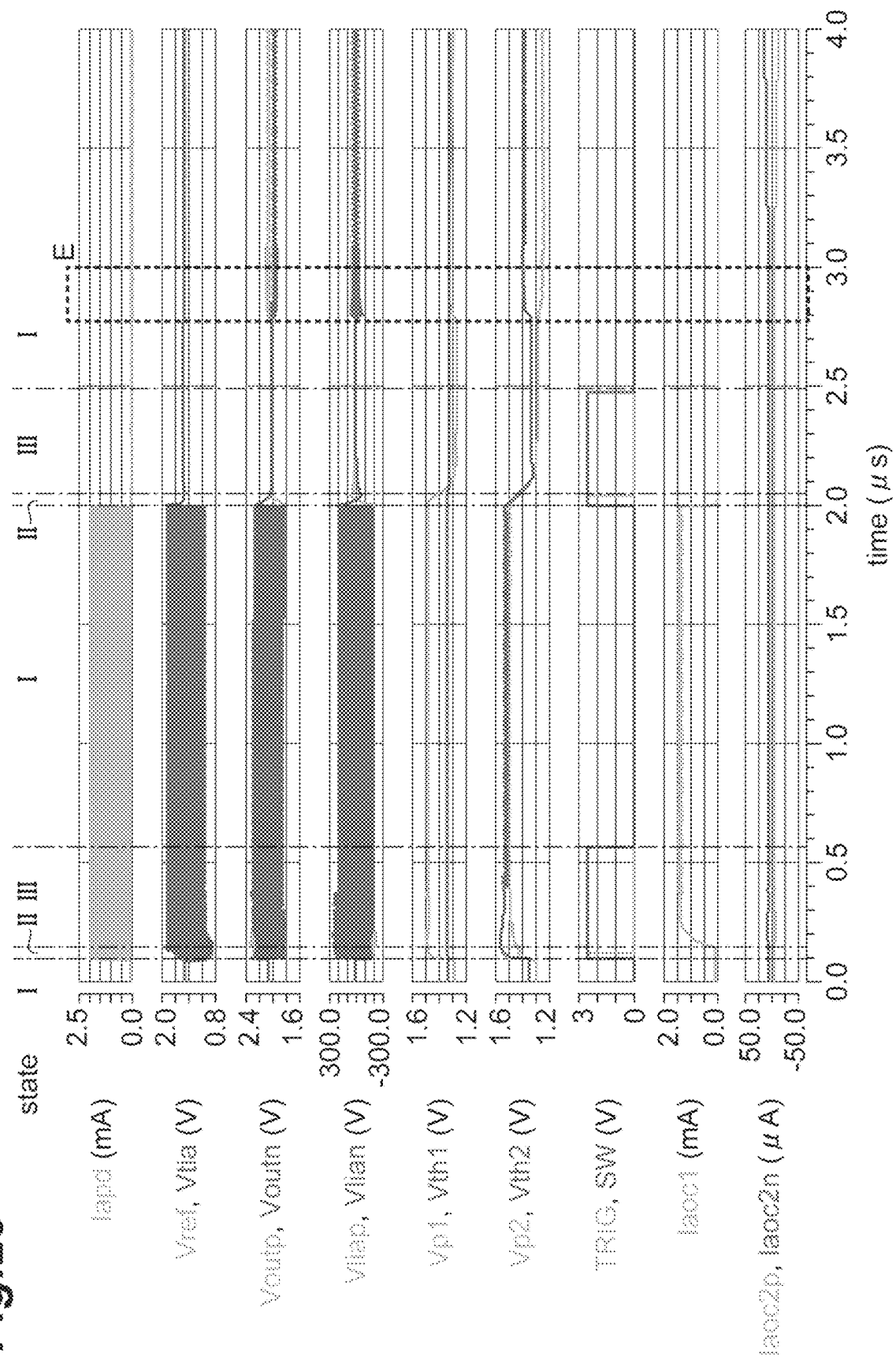
FIG. 29 shows timing charts illustrating another simulation result.
Figure 30:
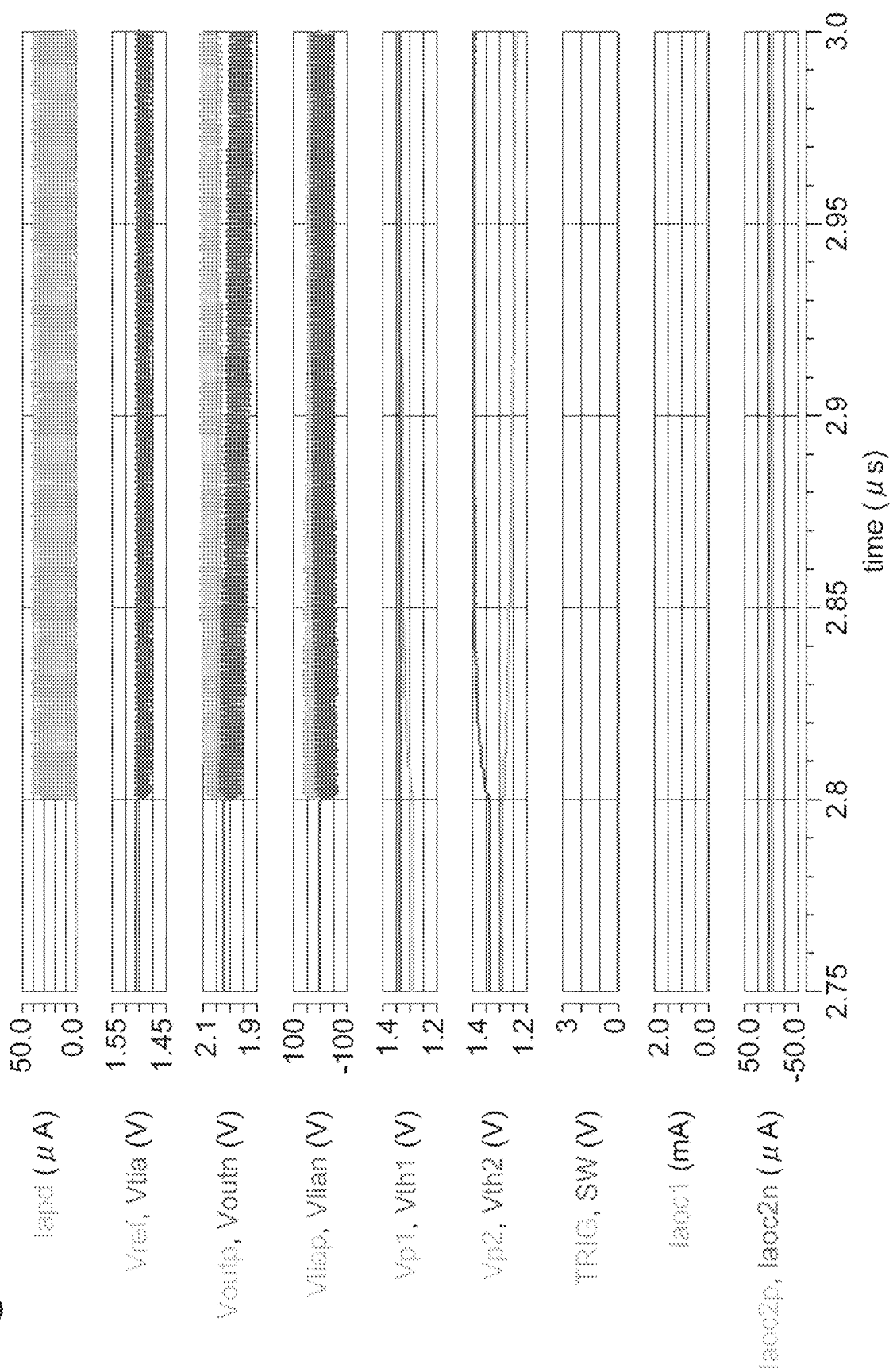
FIG. 30 is a partially enlarged view of the simulation result illustrated in FIG. 29.

Next, effects of the transimpedance amplifier 11B will be described with reference to FIGS. 24 to 30. FIG. 24 shows timing charts illustrating a simulation result. FIGS. 25 to 28 are partially enlarged views of the simulation result illustrated in FIG. 24. FIG. 29 shows timing charts illustrating another simulation result. FIG. 30 is a partially enlarged view of the simulation result illustrated in FIG. 29. FIG. 24 illustrates timing charts of each current value and each voltage value and the state of feedback control by the feedback circuit 16B in a manner similar to FIG. 12. The simulation result is a calculation result when the cutoff frequency faoc2 is set to 16 kHz, the cutoff frequency fac is set to 1.6 MHz, a value obtained by subtracting the current value of the current Is1 from the current value of the current Ih1 is set to 20 μA, and a value obtained by subtracting the current value of the current Is2 from the current value of the current Ih2 is set to 20 μA. Further, in the calculation, the capacitances Ch1 and Ch2 are set to 10 pF, a value obtained by subtracting the current value of the current Is3 from the current value of the current Ih3 is set to 10 μA, a value obtained by subtracting the current value of the current Is4 from the current value of the current Ih4 is set to 10 μA, the capacitances Ch3 and Ch4 are set to 5 pF, the time constant τd1 is set to 50 nsec, the time constant τd2 is set to 500 nsec, and the voltages Vs2 and Vs4 are set to 50 mV.

FIGS. 24 to 30 illustrate state transitions of feedback control by the feedback circuit 16B, and timing charts of each current value, each voltage value, and each signal in a manner similar to FIGS. 12 to 18. In the simulation, first, a first burst optical signal having a strong strength is input when time t is 100 nsec, and the first burst optical signal ends when time t is 2 μsec. The mean value of the input current Iapd by the first burst optical signal is 1 mA. Then, when time t is 2.3 μsec, a second burst optical signal having a weak signal strength is input. The mean value of the input current Iapd by the second burst optical signal is 20 μA. An interval (interval period) between the first burst optical signal and the second burst optical signal is set to 300 nsec. The input current Iapd in accordance with the burst optical signal, which is a modulation signal, simulates a signal in which the identical digit is continued as with the input current Iapd illustrated in FIG. 12.

With the input of the first burst optical signal, the peak value Vp1 increases and exceeds the threshold Vth1. Accordingly, the start of the burst optical signal is detected, and the signal TRIG changes from a low level to a high level. The feedback control by the feedback circuit 16B transitions from the state I to the state II. As a result, the charging voltage of the capacitor 25 is reset, and the feedback circuit 16B is thereby brought into the initial state. While electric charge of the capacitor 25 is released, a feedback control operation of the feedback circuit 16B is stopped. Further, the high-level signal TRIG is input to the switch signal generator circuit 35, and a high-level switch signal SW having a pulse width of approximately 500 nsec is thereby generated. When the signal TRIG changes from a high level to a low level, the feedback control transitions from the state II to the state III, and the feedback circuit 16B starts the feedback control (automatic offset control) operation. The feedback circuit 16B performs feedback control at a high speed while the switch signal SW is at a high level after the change of the signal TRIG to a low level.

When time t is 2 µsec, the first burst optical signal ends. Then, the amplitude (potential) of the positive-phase component Voutp of the differential signal Vout gradually decreases, and the amplitude (potential) of the negative-phase component Voutn gradually increases for a very short period. The peak value Vp1 is a result of detection corresponding to full-wave rectification of the differential signal Vout and thus follows variations in potential in the negative-phase component Voutn. The peak value Vp2 also changes with time in a manner similar to the peak value Vp1, and the potential of the threshold Vth2 changes with time in the decreasing direction. The end of the burst optical signal is detected upon detecting that the peak value Vp2 is larger than the threshold Vth2. Accordingly, the signal TRIG changes from a low level to a high level. The state of the feedback control by the feedback circuit 16B transitions from the state I to the state II. As a result, the charging voltage of the capacitor 25 is reset, and the feedback circuit 16B is thereby brought into the initial state. Further, the high-level signal TRIG is input to the switch signal generator circuit 35, and a high-level switch signal SW having a pulse width of approximately 500 nsec is thereby generated.

When the signal TRIG changes from a high level to a low level, the state of the feedback control transitions from the state II to the state III, and the feedback circuit 16B starts the feedback control (automatic offset control) operation and performs the feedback control at a high speed while the switch signal SW is at a high level. Since the bypass current Iaoc1 has been reset, the bypass current Iaoc1 starts a response from a current value close to a state having no burst optical signal input and immediately converges. In the simulation result, the electric charge of the capacitor 25 is sufficiently released while the signal TRIG is at a high level. Thus, when the state of the feedback control transitions from the state II to the state III, the mean value of the voltage signal Vtia and the reference voltage signal Vref are equal to each other. When time t is around 2.5 µsec, the state of the feedback control by the feedback circuit 16B continuously transitions from the state III to the state I.

When time t is 2.3 µsec, the second burst optical signal is started. At this time, the feedback control by the feedback circuit 16B is in the state III due to the influence of the state transition of the feedback control caused by the end of the first burst optical signal. Thus, the feedback control by the feedback circuit 16B is started in a high-speed control state. The residual DC offset of the voltage signal Vtia (differential signal Vout) is sufficiently removed before the feedback control is started.

Figure 25:
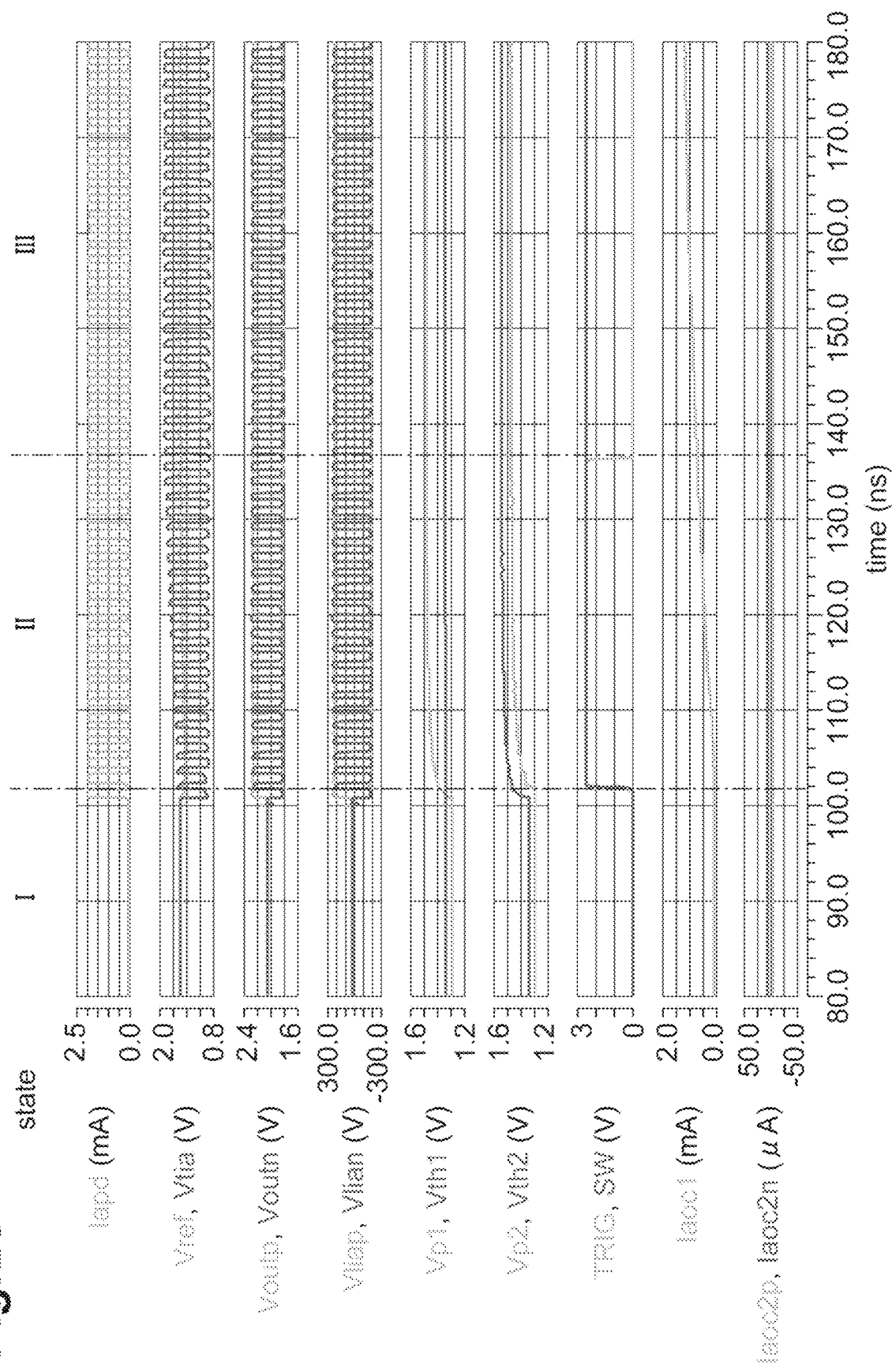
FIG. 25 is a partially enlarged view of the simulation result illustrated in FIG. 24.

FIG. 25 is an enlarged view (timing chart) of A part of FIG. 24. FIG. 25 illustrates timing charts of the current values and the like when time t is around 0.1 µsec. With the input of the first burst optical signal, the peak value Vp1 increases and exceeds the threshold Vth1. Accordingly, the signal TRIG changes from a low level to a high level. An initialization operation of the feedback circuit 16B is performed by the change of the signal TRIG to a high level. Further, the switch signal generator circuit 35 starts operating to generate a high-level switch signal SW for switching the time constant of the feedback circuit 16B. Immediately after the start of the first burst optical signal, the mean value of the voltage signal Vtia is lower than the reference voltage signal Vref. Then, when time t is around 136 nsec, flowing of the DC component of the input current Iapd is started by the feedback control by the feedback circuit 16B. Thus, the mean value of the voltage signal Vtia starts increasing, and the feedback control is performed so that the mean value of the voltage signal Vtia gradually becomes equal to the value of the reference voltage signal Vref.

Figure 26:
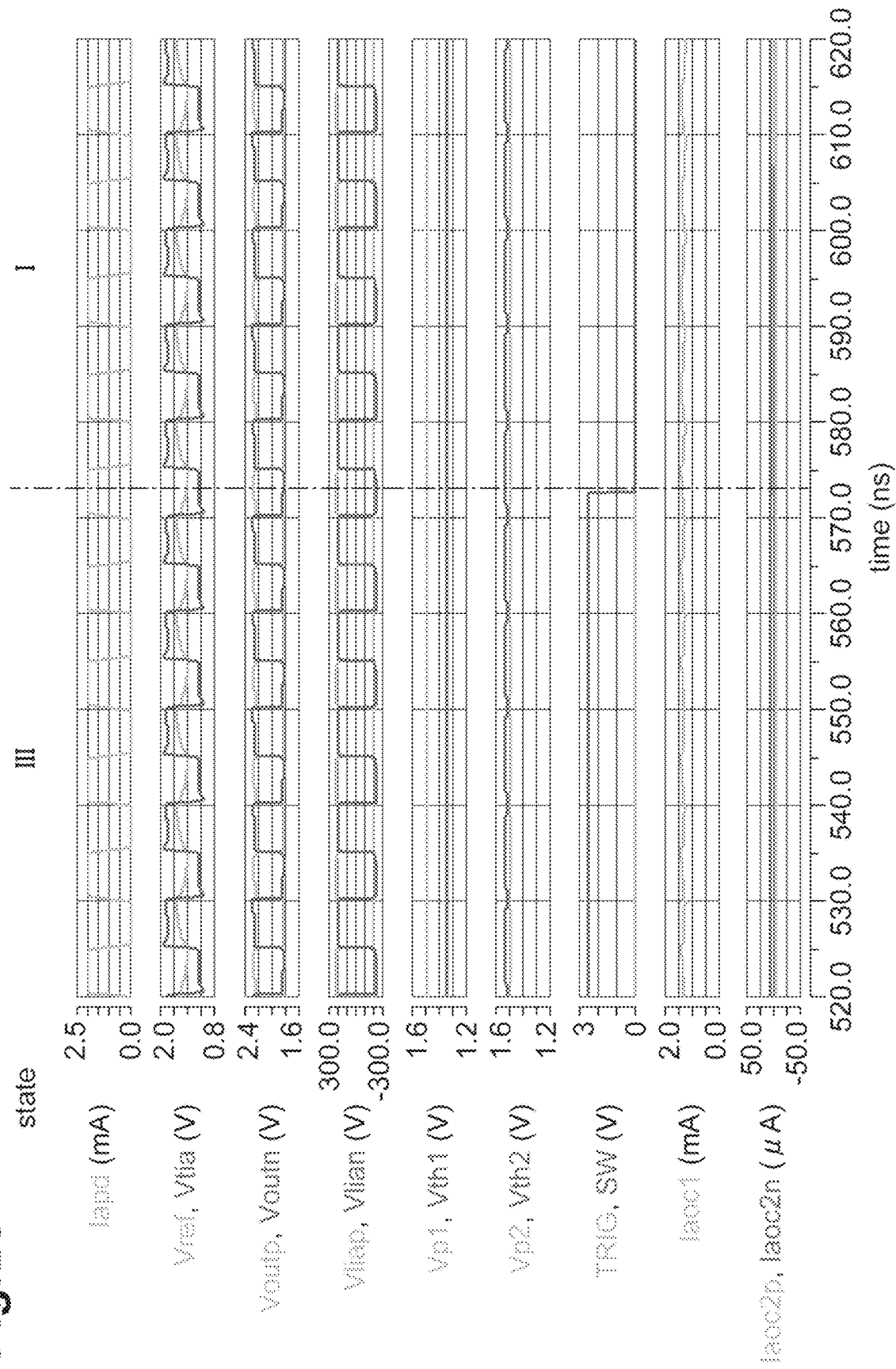
FIG. 26 is a partially enlarged view of the simulation result illustrated in FIG. 24.

FIG. 26 is an enlarged view (timing chart) of B part of FIG. 24. FIG. 26 illustrates timing charts of the current values and the like when time t is around 0.57 µsec. FIG. 26 shows the influence of the repetitive signal in which the identical digit is continued on the voltage across the capacitor in a manner similar to FIG. 14. When time t is around 572 nsec, the switch signal SW transitions from a high level to a low level, and the feedback control by the feedback circuit 16B transitions from the state III to the state I.

Figure 27:
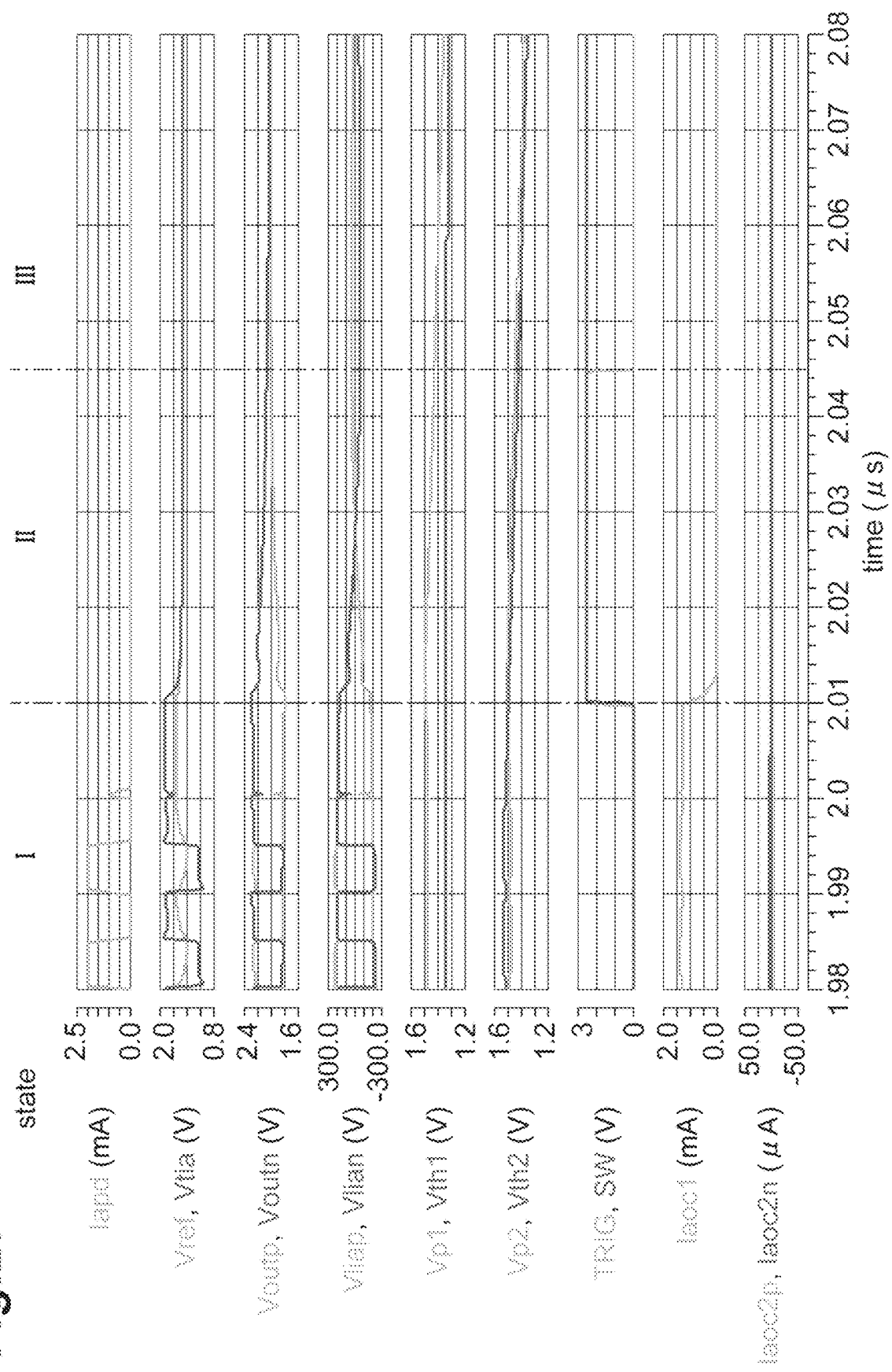
FIG. 27 is a partially enlarged view of the simulation result illustrated in FIG. 24.

FIG. 27 is an enlarged view (timing chart) of C part of FIG. 24. FIG. 27 illustrates timing charts of the current values and the like when time t is around 2.0 µsec. When time t is 2.0 µsec, the first burst optical signal ends. The current value of the input current Iapd becomes substantially equal to zero at the end of the first burst optical signal. Thus, the voltage signal Vtia decreases from a high amplitude. An amplitude limitation is applied to the voltage signal Vtia in the differential amplifier circuit 17. Thus, the positive-phase component Voutp changes from a low level, and the negative-phase component Voutn changes from a high level. The amplitude (potential) of the positive-phase component Voutp gradually decreases, and the amplitude (potential) of the negative-phase component Voutn gradually increases. When time t is around 2.01 µsec after the end of the burst optical signal, the peak value Vp2 becomes larger than the threshold Vth2. Accordingly, the end of the burst optical signal is detected, and the switch signal SW (signal TRIG) changes from a low level to a high level. Accordingly, the feedback circuit 16B is initialized, and the difference between the reference voltage signal Vref and the voltage signal Vtia immediately becomes substantially equal to zero. Then, the positive-phase component Voutp and the negative-phase component Voutn start converging so as to be equal to each other. With the reset of the charging voltage of the capacitor 25, the bypass current Iaoc1 is initialized. Thus, the state of the bypass current Iaoc1 immediately reset from a converging state to the initial state. On the other hand, the operation of the switch signal generator circuit 35 is started by the high-level signal TRIG, and a high-level switch signal SW for switching the time constant of the feedback circuit 16B is generated. When the signal TRIG changes from a high level to a low level when time t is around 2.045 µsec, the feedback circuit 16B starts feedback control in a high-speed state (state III). In the simulation result, when time t is around 2.02 µsec, the residual offset between the voltage signal Vtia and the reference voltage signal Vref converges to substantially zero. The positive-phase component Voutp and the negative-phase component Voutn converge when time t is around 2.06 µsec after the end of the burst optical signal by the influence of AC coupling. After the large-small relationship between the positive-phase component Vliap and the negative-phase component Vlian is reversed once, the positive-phase component Vliap and the negative-phase component Vlian converge with a slight delay from the positive-phase component Voutp and the negative-phase component Voutn.

Figure 28:
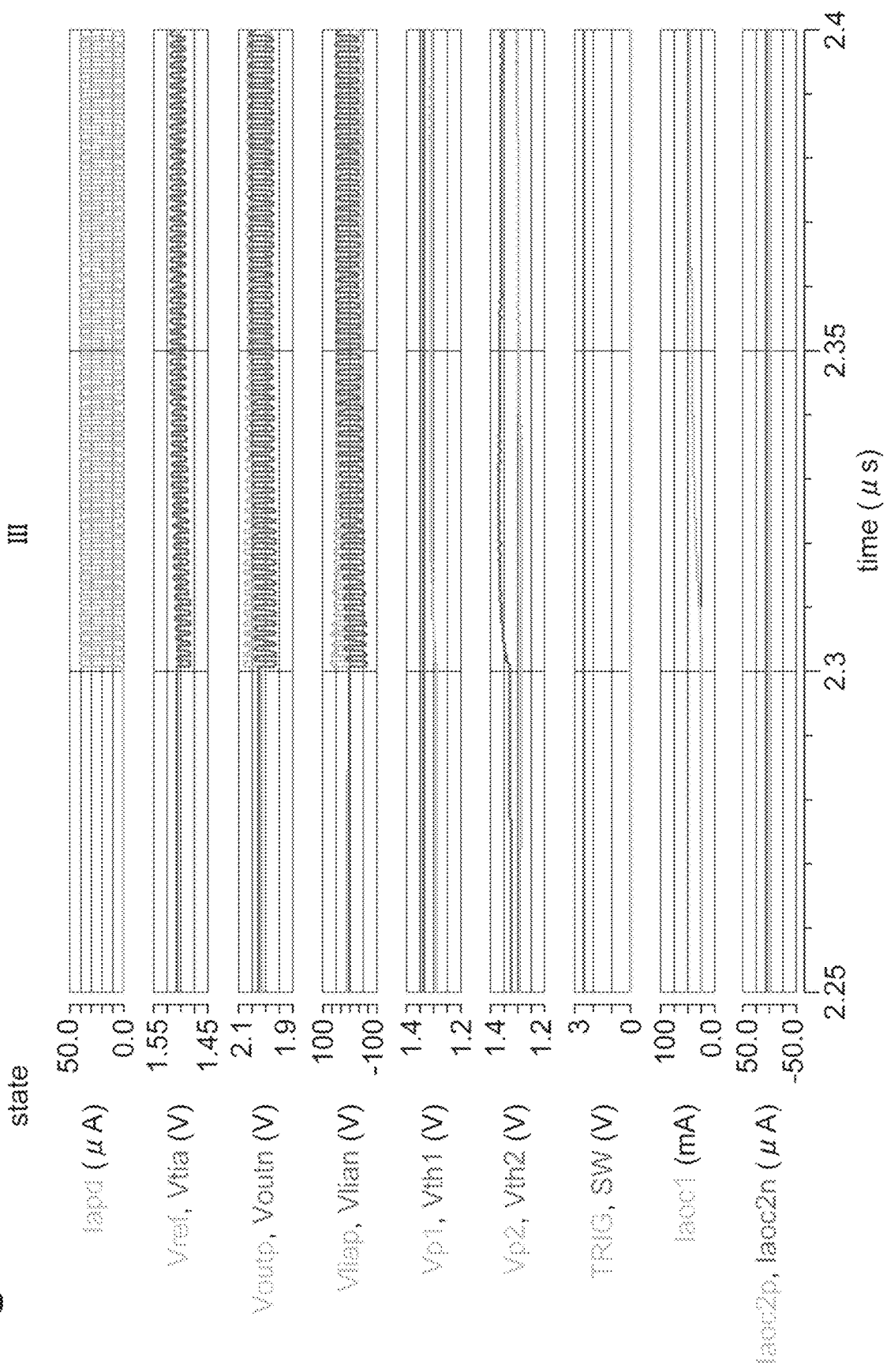
FIG. 28 is a partially enlarged view of the simulation result illustrated in FIG. 24.

FIG. 28 is an enlarged view (timing chart) of D part of FIG. 24. FIG. 28 illustrates timing charts of the current values and the like when time t is around 2.3 µsec. When time t is 2.3 µsec, the second burst optical signal is input. Before the input of the second burst optical signal, the residual DC offset between the positive-phase component Voutp and the negative-phase component Voutn has sufficiently converged (removed). That is, the amplitude (potential) of the positive-phase component Voutp and the amplitude (potential) of the negative-phase component Voutn are equal to each other. Since the strength of the second burst optical signal is weak, the peak value Vp1 does not become larger than the threshold Vth1, and no state transition of the feedback control by the feedback circuit 16B occurs. Even when the strength of the signal is weak, a DC offset occurs in the transimpedance amplifier 11B by the second burst optical signal. However, since the feedback control by the feedback circuit 16B is maintained in the state III by the state transition caused by the end of the first burst optical signal, the feedback circuit 16B starts feedback control in a high-speed control state. Thus, the DC offset between the positive-phase component Voutp and the negative-phase component Voutn is immediately eliminated by the feedback control in a high-speed state by the feedback circuit 16B. The positive-phase component Vliap and the negative-phase component Vlian substantially follow responses of the positive-phase component Voutp and the negative-phase component Voutn.

Setting of another simulation result illustrated in FIG. 29 differs from the setting of the simulation result illustrated in FIG. 24 mainly in the timing of inputting the second burst optical signal. In the simulation, when time t is 2.8 µsec, the second burst optical signal is input. Changes in each voltage value and the like caused by the input of the first burst optical signal are similar to those in the simulation result illustrated in FIG. 24. Thus, description thereof will be omitted. FIG. 30 is an enlarged view (timing chart) of E part of FIG. 29. FIG. 30 illustrates timing charts of the current values and the like when time t is around 2.8 µsec. The second burst optical signal is input at the timing when there is no influence of a switch of the feedback control by the feedback circuit 16B caused by the end of the first burst optical signal. Since the strength of the second burst optical signal is weak, the peak value Vp1 does not become larger than the threshold Vth1, and no state transition of the feedback control by the feedback circuit 16B occurs. Even when the strength of the signal is weak, a DC offset occurs in the transimpedance amplifier 11B by the second burst optical signal. Differently from the simulation result illustrated in FIG. 24, the second burst optical signal is input when the feedback control by the feedback circuit 16B is in the state I (low-speed control state). Thus, the DC offset between the positive-phase component Voutp and the negative-phase component Voutn does not immediately converge. On the other hand, since the cutoff frequency fac is set to 1.6 MHz, a DC offset is removed within the settling time in the positive-phase component Vliap and the negative-phase component Vlian. Since the strength of the second burst optical signal is weak, no saturation of the signal occurs in the transimpedance amplifier 11B. Thus, a duty distortion is reduced in the differential signal Vout.

As described above, in the transimpedance amplifier 11B, in response to the end of the burst optical signal being detected based on the peak value Vp3 of the positive-phase component Voutp and the peak value Vp2 of the negative-phase component Voutn, the electric charge stored in the capacitor 25 of the feedback circuit 16B is released. While the burst optical signal is input, the current signal Iin which is obtained by subtracting the bypass current Iaoc1 from the input current Iapd in accordance with the burst optical signal is input to the TIA core 14. The differential amplifier circuit 17 generates the differential signal Vout including the positive-phase component Voutp and the negative-phase component Voutn in accordance with the difference between the voltage signal Vtia converted by the TIA core 14 and the reference voltage signal Vref. The burst optical signal includes both high-level and low-level signals. Thus, while the burst optical signal is input, each of the peak value Vp2 and the peak value Vp3 is maintained substantially constant, and the difference between the peak value Vp2 and the peak value Vp3 is substantially constant.

On the other hand, immediately after the end of the burst optical signal, the DC bypass current Iaoc1 generated by the feedback circuit 16B is left, and the residual bypass current Iaoc1 becomes the input signal of the TIA core 14. Thus, after the end of the burst optical signal, a state in which the voltage value of the negative-phase component Voutn is higher than the voltage value of the positive-phase component Voutp is continued. The detector circuit 19B detects the peak values Vp2 and Vp3 in accordance with charging voltages of the capacitors 58 and 63 respectively corresponding to the negative-phase component Voutn and the positive-phase component Voutp. When the state in which the voltage value of the negative-phase component Voutn is higher than the voltage value of the positive-phase component Voutp is continued, the difference between the peak value Vp2 and the peak value Vp3 becomes larger than the difference while the burst optical signal is input. Thus, since the difference between the peak value Vp2 and the peak value Vp3 changes with the end of the burst optical signal, it is possible to detect the end of the burst optical signal based on the peak value Vp2 and the peak value Vp3. Accordingly, immediately after the end of the burst optical signal, the electric charge of the capacitor 25 of the feedback circuit 16B is released, and the charging voltage of the capacitor 25 is brought into the initial state. Thus, the value of the bypass current Iaoc1 becomes a current value in the initial state within a short period from the end point of the burst optical signal. As a result, since the time required for the feedback circuit 16B to return to the initial state is shortened, it is possible to shorten the interval period from the end of one burst optical signal to the start of the next burst optical signal.

The peak value Vp2 increases immediately after the end of the burst optical signal. The end of the burst optical signal can be detected immediately after the end of the burst optical signal by setting the threshold Vth2 so that the peak value Vp2 becomes larger than the threshold Vth2 corresponding to the peak value Vp3 immediately after the end of the burst optical signal.

In response to the start of the burst optical signal being detected based on the peak value Vp1 and the mean value Vave of the differential signal Vout, the time constant of the feedback circuit 16B is switched from the time constant τ1 to the time constant τ2 which is smaller than the time constant τ1. As a result, it is possible to shorten the time required for the value of the bypass current Iaoc1 to converge from the start of the burst optical signal.

The peak value Vp1 increases immediately after input of the burst optical signal. The start of the burst optical signal can be detected immediately after the start of the burst optical signal by setting the threshold Vth1 so that the peak value Vp1 becomes larger than the threshold Vth1 corresponding to the mean value Vave immediately after the start of the burst optical signal.

A period during which the time constant of the feedback circuit 16B is maintained at the time constant τ2 is shorter than the period Ts of the preamble signal. As a result, the time constant of the feedback circuit 16B is returned to the time constant τ1 from the time constant τ2 before the input of the preamble signal is finished, and it is possible to maintain the consecutive identical digits tolerance while the payload signal is input.

The feedback circuit 18 removes the DC offset that occurs in the differential amplifier circuit 17 from the differential signal Vout. As a result, the peak values Vp1, Vp2 and Vp3 and the mean value Vave for detecting the start and the end of the burst optical signal are accurately detected. Thus, it is possible to accurately detect the end and the start of the burst optical signal.

Figure 31:
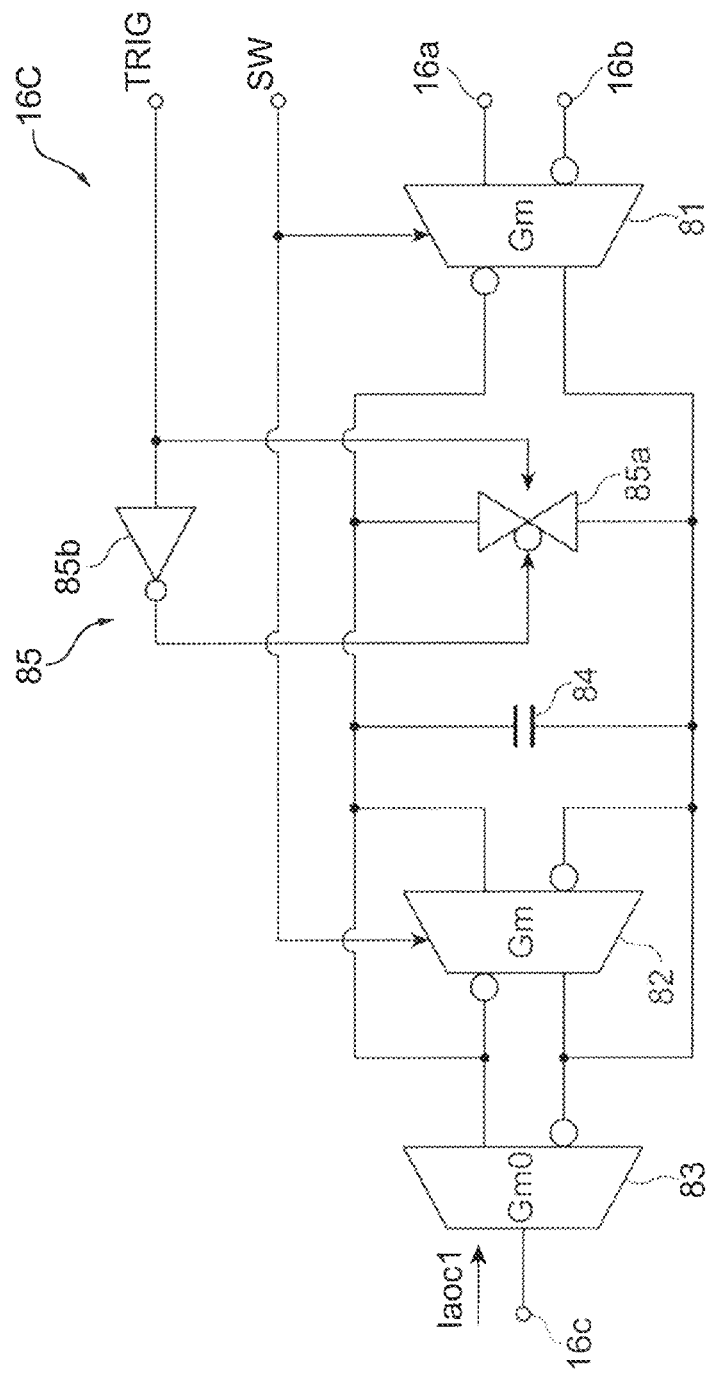
FIG. 31 is a circuit diagram illustrating a feedback circuit included in a transimpedance amplifier according to a modification.

FIG. 31 is a circuit diagram illustrating a feedback circuit included in a transimpedance amplifier according to a modification. A feedback circuit 16C (first feedback circuit) illustrated in FIG. 31 differs from the feedback circuit 16A illustrated in FIG. 19 mainly in that a signal TRIG is input to the feedback circuit 16C in addition to the signal SW and the feedback circuit 16C further includes a resetter 85. In the feedback circuit 16C, the resetter 85 is connected to both ends of the capacitor 84. The feedback circuit 16C generates a bypass current Iaoc1 in accordance with a charging voltage of the capacitor 84 based on the difference between a voltage signal Vtia and a reference voltage signal Vref in a manner similar to the feedback circuit 16A.

The resetter 85 has a configuration and a function similar to the configuration and the function of the resetter 27 of the feedback circuit 16B. The resetter 85 is provided with a switch 85a and an inverter circuit 85b. The switch 85a is connected in parallel to the capacitor 84. The signal TRIG is input to the resetter 85. When the signal TRIG is at a high level, the switch 85a is in a closed state. When both ends of the capacitor 84 are short-circuited due to the switch 85a being in the closed state, electric charge of the capacitor 84 is released (reset). In other words, the switch 85a (resetter 85) performs a reset operation for returning the state of the feedback circuit 16C to an initial state when the signal TRIG is at a high level. On the other hand, when the signal TRIG is at a low level, the switch 85a is in an open state, a DC resistance between the terminals of the capacitor 84 becomes infinite. Charging and discharging of the capacitor 84 are performed by an output signal (output current) from the OTA 81.

The transimpedance amplifier provided with the feedback circuit 16C also achieves effects similar to the effects of the transimpedance amplifier 11B.

The transimpedance amplifier according to the present disclosure is not limited to the above embodiments and modifications.

The transimpedance amplifier may be provided with a feedback circuit having a configuration different from the feedback circuits 16, 16A, 16B, and 16C instead of the feedback circuits 16, 16A, 16B, and 16C. It is only required that a feedback circuit included in a transimpedance amplifier according to one embodiment be provided with a configuration capable of generating the bypass current Iaoc1 in accordance with the difference between the reference voltage signal Vref and the voltage signal Vtia and switching the time constant of the feedback circuit. It is only required that a feedback circuit included in a transimpedance amplifier according to another embodiment be provided with a configuration having a capacitor, capable of generating the bypass current Iaoc1 in accordance with the difference between the reference voltage signal Vref and the voltage signal Vtia and resetting the charging voltage of the capacitor.

The transimpedance amplifier may have a configuration in which a state in which the voltage value of the positive-phase component Voutp is higher than the voltage value of the negative-phase component Voutn is continued by the residual bypass current Iaoc1 after the end of the burst optical signal. In this case, the detector circuits 19 and 19B may include a configuration that detects the end of the burst optical signal upon detecting that the peak value Vp3 of the positive-phase component Voutp is larger than the threshold corresponding to the peak value Vp2 of the negative-phase component Voutn.

The detector circuits 19 and 19B may include a configuration that switches the switch signal SW from a low level to a high level only when the end of the burst optical signal is detected. That is, the time constant of the feedback circuits 16, 16A, 16B, and 16C may not be switched at the start of the burst optical signal and the detector circuits 19, and 19B may switch the time constant of the feedback circuits 16, 16A, 16B, and 16C from the time constant τ1 to the time constant τ2 in response to detecting the end of the burst optical signal being detected.

The detector circuit 19B may switch the time constant of the feedback circuits 16B and 16C without resetting the charging voltage of the capacitor in response to detecting the start of the burst optical signal. For example, the detector circuit 19B may output a signal for switching the time constant of the feedback circuits 16B and 16C without outputting a signal for resetting the charging voltage of the capacitor in response to detecting the start of the burst optical signal. In this case, in response to detecting the end of the burst optical signal, the detector circuit 19B may output both a signal for resetting the charging voltage of the capacitors 25 and 84 and a signal for switching the time constant of the feedback circuit. The detector circuit 19B may output the high-level switch signal SW to the feedback circuits 16B and 16C after the signal TRIG changes from a high level to a low level.

A circuit for detecting the peak values Vp1, Vp2, and Vp3 and the mean value Vave is not limited to the differential peak-hold circuit 36 and the like. It is only required that the detector circuits 19 and 19B be provided with a circuit capable of detecting the peak values Vp1, Vp2, and Vp3 and the mean value Vave and generating the thresholds Vth1 and Vth2.

The differential amplifier circuit 17 may include one differential amplifier or may include two or more differential amplifiers. The output terminal of the feedback circuit 18 may be connected to the input terminal of the differential amplifier 17a. The transimpedance amplifier may not include the feedback circuit 18.

What is claimed is:

1. A transimpedance amplifier configured to convert an input current generated by a photodetector in accordance with a burst optical signal to a differential signal including a positive-phase component and a negative-phase component and output the differential signal, the transimpedance amplifier comprising:
   a single-ended amplifier configured to convert a current signal to a voltage signal;
   an amplifier circuit configured to generate a reference voltage signal;

a first feedback circuit having a time constant, the first feedback circuit being configured to generate a bypass current at a response speed adjusted by the time constant;

a differential amplifier circuit configured to generate the differential signal in accordance with a difference between the voltage signal and the reference voltage signal; and a detector circuit configured to detect a start and an end of the burst optical signal based on the differential signal, wherein the first feedback circuit generates the bypass current in accordance with the difference between the voltage signal and the reference voltage signal and generates the current signal by subtracting the bypass current from the input current, and the detector circuit detects the end of the burst optical signal based on a first peak value of the positive-phase component and a second peak value of the negative-phase component and switches the time constant of the first feedback circuit from a first time constant to a second time constant smaller than the first time constant for a predetermined period in response to detecting the end of the burst optical signal.

2. The transimpedance amplifier according to claim 1, wherein the detector circuit includes a single-phase peak-hold circuit configured to detect the second peak value and a first threshold generator circuit configured to generate a first threshold in accordance with the first peak value, and the detector circuit detects the end of the burst optical signal upon detecting that the second peak value is larger than the first threshold.

3. The transimpedance amplifier according to claim 1, wherein the detector circuit detects the start of the burst optical signal based on a third peak value of the differential signal and a mean value of the differential signal and switches the time constant of the first feedback circuit from the first time constant to the second time constant for the predetermined period in response to detecting the start of the burst optical signal.

4. The transimpedance amplifier according to claim 3, wherein the detector circuit includes a differential peak-hold circuit configured to detect the third peak value and a second threshold generator circuit configured to generate a second threshold in accordance with the mean value, and the detector circuit detects the start of the burst optical signal upon detecting that the third peak value is larger than the second threshold.

5. The transimpedance amplifier according to claim 1, wherein the burst optical signal includes a preamble signal and a payload signal following the preamble signal, and the predetermined period is shorter than a period of the preamble signal.

6. The transimpedance amplifier according to claim 1, further comprising a second feedback circuit configured to control the differential amplifier circuit in accordance with feedback of both the positive-phase component and the negative-phase component to remove a DC offset in the differential signal.

7. A transimpedance amplifier configured to convert an input current generated by a photodetector in accordance with a burst optical signal to a differential signal including a positive-phase component and a negative-phase component and output the differential signal, the transimpedance amplifier comprising:

a single-ended amplifier configured to convert a current signal to a voltage signal;

an amplifier circuit configured to generate a reference voltage signal;

a first feedback circuit including a capacitor, the first feedback circuit being configured to generate a bypass current in accordance with a charging voltage of the capacitor based on a difference between the voltage signal and the reference voltage signal;

a differential amplifier circuit configured to generate the differential signal in accordance with the difference between the voltage signal and the reference voltage signal; and a detector circuit configured to detect a start and an end of the burst optical signal based on the differential signal, wherein the first feedback circuit generates the current signal by subtracting the bypass current from the input current, and the detector circuit detects the end of the burst optical signal based on a first peak value of the positive-phase component and a second peak value of the negative-phase component and releases electric charge stored in the capacitor to reset the charging voltage in response to detecting the end of the burst optical signal.

8. The transimpedance amplifier according to claim 7, wherein the detector circuit includes a single-phase peak-hold circuit configured to detect the second peak value and a first threshold generator circuit configured to generate a first threshold in accordance with the first peak value, and the detector circuit detects the end of the burst optical signal upon detecting that the second peak value is larger than the first threshold.

9. The transimpedance amplifier according to claim 7, wherein the detector circuit detects the start of the burst optical signal based on a third peak value of the differential signal and a mean value of the differential signal and switches a time constant of the first feedback circuit from a first time constant to a second time constant smaller than the first time constant for a predetermined period in response to detecting the start of the burst optical signal.

10. The transimpedance amplifier according to claim 9, wherein the detector circuit includes a differential peak-hold circuit configured to detect the third peak value and a second threshold generator circuit configured to generate a second threshold in accordance with the mean value, and the detector circuit detects the start of the burst optical signal upon detecting that the third peak value is larger than the second threshold.

11. The transimpedance amplifier according to claim 9, wherein the burst optical signal includes a preamble signal and a payload signal following the preamble signal, and the predetermined period is shorter than a period of the preamble signal.

12. The transimpedance amplifier according to claim 7, further comprising a second feedback circuit configured to control the differential amplifier circuit in accordance with feedback of both the positive-phase component and the negative-phase component to remove a DC offset in the differential signal.

13. The transimpedance amplifier according to claim 1, wherein
   the amplifier circuit configured to generate a reference voltage signal is a dummy amplifier, and
   the reference voltage signal has the value of the voltage signal output from the single-ended amplifier when the input current is zero.

14. The transimpedance amplifier according to claim 7, wherein
   the amplifier circuit configured to generate a reference voltage signal is a dummy amplifier, and
   the reference voltage signal has the value of the voltage signal output from the single-ended amplifier when the input current is zero.

\* \* \* \* \*